United States Patent
Tan et al.

(10) Patent No.: US 12,441,787 B2
(45) Date of Patent: Oct. 14, 2025

(54) NEUTRALIZATION OF HUMAN CYTOKINES WITH MEMBRANE-BOUND ANTI-CYTOKINE NON-SIGNALING BINDERS EXPRESSED IN IMMUNE CELLS

(71) Applicant: National University of Singapore, Singapore (SG)

(72) Inventors: Hong Ji Adrian Tan, Singapore (SG); Dario Campana, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 1237 days.

(21) Appl. No.: 17/040,387

(22) PCT Filed: Mar. 29, 2019

(86) PCT No.: PCT/IB2019/052636
§ 371 (c)(1),
(2) Date: Sep. 22, 2020

(87) PCT Pub. No.: WO2019/193476
PCT Pub. Date: Oct. 10, 2019

(65) Prior Publication Data
US 2021/0017271 A1 Jan. 21, 2021

Related U.S. Application Data

(60) Provisional application No. 62/651,311, filed on Apr. 2, 2018.

(51) Int. Cl.
| | | |
|---|---|---|
| C07K 16/24 | (2006.01) | |
| A61K 40/11 | (2025.01) | |
| A61K 40/31 | (2025.01) | |
| A61K 40/42 | (2025.01) | |
| A61P 37/06 | (2006.01) | |
| C07K 14/705 | (2006.01) | |
| C07K 14/725 | (2006.01) | |
| C07K 16/28 | (2006.01) | |
| C12N 5/0783 | (2010.01) | |

(52) U.S. Cl.
CPC ............ *C07K 16/248* (2013.01); *A61K 40/11* (2025.01); *A61K 40/31* (2025.01); *A61K 40/4211* (2025.01); *A61K 40/4234* (2025.01); *A61P 37/06* (2018.01); *C07K 14/7051* (2013.01); *C07K 14/70517* (2013.01); *C07K 14/70578* (2013.01); *C07K 16/2803* (2013.01); *C12N 5/0636* (2013.01); *A61K 2239/29* (2023.05); *A61K 2239/31* (2023.05); *A61K 2239/38* (2023.05); *A61K 2239/48* (2023.05); *C07K 2317/21* (2013.01); *C07K 2317/622* (2013.01); *C07K 2319/02* (2013.01); *C07K 2319/03* (2013.01)

(58) Field of Classification Search
None
See application file for complete search history.

(56) References Cited

U.S. PATENT DOCUMENTS

| | | |
|---|---|---|
| 4,650,764 A | 3/1987 | Temin et al. |
| 4,690,915 A | 9/1987 | Rosenberg |
| 4,844,893 A | 7/1989 | Honsik et al. |
| 4,980,289 A | 12/1990 | Temin et al. |
| 5,124,263 A | 6/1992 | Temin et al. |
| 5,359,046 A | 10/1994 | Capon |
| 5,399,346 A | 3/1995 | Anderson et al. |
| 5,595,756 A | 1/1997 | Bally et al. |
| 5,653,977 A | 8/1997 | Saleh |
| 5,674,704 A | 10/1997 | Goodwin et al. |
| 5,686,281 A | 11/1997 | Roberts |
| 5,712,149 A | 1/1998 | Roberts |
| 6,103,521 A | 8/2000 | Capon et al. |
| 6,303,121 B1 | 10/2001 | Kwon |
| 6,319,494 B1 | 11/2001 | Capon et al. |

(Continued)

FOREIGN PATENT DOCUMENTS

| | | |
|---|---|---|
| CN | 101684456 A | 3/2010 |
| CN | 103113470 A | 5/2013 |

(Continued)

OTHER PUBLICATIONS

Vajdos et al. (J Mol Biol. Jul. 5, 2002;320(2):415-28). (Year: 2002).*
Bedouelle et al. (FEBS J. Jan. 2006;273(1):34-46). (Year: 2006).*
Brown et al. (J Immunol. May 1, 1996;156(9):3285-91). (Year: 1996).*
Colman (Research in Immunology, 145:33-36, 1994). (Year: 1994).*
Rudikoff et al. (Proc. Natl. Acad. Sci. USA, 79: 1979-1983, Mar. 1982). (Year: 1982).*
Pelechas et al. (Expert Opinion On Biological Therapy, 2017 vol. 17, No. 6, 755-763). (Year: 2017).*
Lee et al. (Blood. 2014; 124(2):188-195). (Year: 2014).*
Barrett et al. (Blood (2016) 128 (22):654). (Year: 2016).*

(Continued)

*Primary Examiner* — Zachary S Skelding
(74) *Attorney, Agent, or Firm* — Hamilton, Brook, Smith & Reynolds, P.C.

(57) ABSTRACT

Transgenic T cells and vectors for making transgenic T cells are described. The vectors can include a nucleic acid encoding a membrane-bound anti-IL6 (mb-alL6) single chain variable fragment (scFv), and the transgenic T cells can express mb-alL6. The transgenic T cells are useful for suppressing proliferation of IL-6-dependent cells, reducing IL-6 concentration, or both. In one embodiment, the vector is a bicistronic construct encoding the mb-alL6 and an anti-CD19-41 BB-003ζ chimeric antigen receptor (CAR). In another embodiment, an anti-IL-6 scFv can be linked to a 41 BB and 003ζ domains to form an anti-IL-6 CAR. The transgenic T cells expressing said constructs can reduce the linker risk of cytokine release syndrome (CRS) in cancer patients being treated with CAR T cell or for the treatment of autoimmune diseases and inflammatory diseases in which cytokines are involved in pathogenesis.

4 Claims, 22 Drawing Sheets

Specification includes a Sequence Listing.

(56) References Cited

U.S. PATENT DOCUMENTS

| | | |
|---|---|---|
| 6,355,476 B1 | 3/2002 | Kwon et al. |
| 6,361,998 B1 | 3/2002 | Bell et al. |
| 6,410,319 B1 | 6/2002 | Raubitschek et al. |
| 6,797,514 B2 | 9/2004 | Berenson |
| 7,052,906 B1 | 5/2006 | Lawson et al. |
| 7,070,995 B2 | 7/2006 | Jensen |
| 7,435,596 B2 | 10/2008 | Campana et al. |
| 7,446,179 B2 | 11/2008 | Jensen et al. |
| 7,446,190 B2 | 11/2008 | Sadelain et al. |
| 7,763,243 B2 | 7/2010 | Lum et al. |
| 7,932,055 B2 | 4/2011 | Spee et al. |
| 7,994,298 B2 | 8/2011 | Zhang et al. |
| 8,026,097 B2 | 9/2011 | Campana et al. |
| 8,399,645 B2 | 3/2013 | Campana et al. |
| 9,487,800 B2 | 11/2016 | Schonfeld et al. |
| 9,511,092 B2 | 12/2016 | Campana et al. |
| 9,605,049 B2 | 3/2017 | Campana et al. |
| 9,834,590 B2 | 12/2017 | Campana et al. |
| 9,856,322 B2 | 1/2018 | Campana et al. |
| 10,391,126 B2 | 8/2019 | Cooper et al. |
| 10,428,305 B2 | 10/2019 | Campana et al. |
| 10,538,739 B2 | 1/2020 | Campana et al. |
| 10,736,920 B2 | 8/2020 | Yu et al. |
| 10,774,309 B2 | 9/2020 | Campana et al. |
| 10,774,311 B2 | 9/2020 | Campana et al. |
| 10,801,012 B2 | 10/2020 | Campana et al. |
| 10,829,737 B2 | 11/2020 | Campana et al. |
| 10,836,999 B2 | 11/2020 | Campana et al. |
| 11,141,436 B2 | 10/2021 | Trager et al. |
| 11,154,575 B2 | 10/2021 | Trager et al. |
| 11,253,547 B2 | 2/2022 | Trager et al. |
| 11,365,236 B2 | 6/2022 | Eong et al. |
| 11,560,548 B2 | 1/2023 | Campana et al. |
| 11,673,937 B2 | 6/2023 | Campana et al. |
| 11,873,512 B2 | 1/2024 | Campana et al. |
| 11,896,616 B2 | 2/2024 | Kamiya et al. |
| 2002/0018783 A1 | 2/2002 | Sadelain et al. |
| 2003/0129649 A1 | 7/2003 | Kobilka et al. |
| 2003/0147869 A1 | 8/2003 | Riley |
| 2003/0215427 A1 | 11/2003 | Jensen |
| 2004/0038886 A1 | 2/2004 | Finney et al. |
| 2004/0043401 A1 | 3/2004 | Sadelain et al. |
| 2004/0126363 A1 | 7/2004 | Jensen et al. |
| 2005/0042208 A1 | 2/2005 | Sagawa et al. |
| 2005/0048549 A1 | 3/2005 | Cao |
| 2005/0113564 A1 | 5/2005 | Campana et al. |
| 2006/0093605 A1 | 5/2006 | Campana et al. |
| 2006/0247191 A1 | 11/2006 | Finney et al. |
| 2007/0160578 A1 | 7/2007 | Waldmann et al. |
| 2007/0166327 A1 | 7/2007 | Cooper et al. |
| 2008/0177047 A1 | 7/2008 | Fujita-Yamaguchi |
| 2008/0247990 A1 | 10/2008 | Campbell |
| 2008/0299137 A1 | 12/2008 | Svendsen |
| 2009/0281035 A1 | 11/2009 | Spee et al. |
| 2010/0029749 A1 | 2/2010 | Zhang et al. |
| 2012/0015434 A1 | 1/2012 | Campana et al. |
| 2012/0148552 A1 | 6/2012 | Jensen |
| 2012/0282256 A1 | 11/2012 | Campana et al. |
| 2012/0321666 A1 | 12/2012 | Copper et al. |
| 2013/0072401 A1 | 3/2013 | Ye et al. |
| 2013/0266551 A1 | 10/2013 | Campana et al. |
| 2013/0280221 A1 | 10/2013 | Schonfeld et al. |
| 2013/0288368 A1 | 10/2013 | June et al. |
| 2014/0023626 A1 | 1/2014 | Peled et al. |
| 2014/0271635 A1 | 9/2014 | Brogdon et al. |
| 2014/0286973 A1 | 9/2014 | Powell, Jr. |
| 2014/0302608 A1 | 10/2014 | Dominici et al. |
| 2014/0349402 A1 | 11/2014 | Cooper |
| 2015/0139943 A1 | 5/2015 | Campana et al. |
| 2015/0190471 A1 | 7/2015 | Copik et al. |
| 2015/0218649 A1 | 8/2015 | Saenger et al. |
| 2016/0000828 A1 | 1/2016 | Campana |
| 2016/0152723 A1 | 6/2016 | Chen et al. |
| 2016/0158285 A1 | 6/2016 | Cooper et al. |
| 2016/0362472 A1 | 12/2016 | Bitter et al. |
| 2017/0044227 A1 | 2/2017 | Schonfeld |
| 2017/0073423 A1 | 3/2017 | Juillerat et al. |
| 2017/0073638 A1 | 3/2017 | Campana et al. |
| 2017/0129967 A1 | 5/2017 | Wels et al. |
| 2017/0283482 A1 | 10/2017 | Campana et al. |
| 2017/0355957 A1 | 12/2017 | Biondi et al. |
| 2017/0368098 A1 | 12/2017 | Chen et al. |
| 2018/0002397 A1 | 1/2018 | Shah et al. |
| 2018/0044391 A1 | 2/2018 | Gundram et al. |
| 2018/0044417 A1 | 2/2018 | Pule et al. |
| 2018/0046571 A1 | 2/2018 | Magill et al. |
| 2018/0086831 A1 | 3/2018 | Pule et al. |
| 2018/0104278 A1 | 4/2018 | Zhang et al. |
| 2018/0117146 A1 | 5/2018 | Yu et al. |
| 2018/0134765 A1 | 5/2018 | Landgraf et al. |
| 2018/0371052 A1 | 12/2018 | Ma et al. |
| 2019/0038733 A1 | 2/2019 | Campana et al. |
| 2019/0046571 A1 | 2/2019 | Campana et al. |
| 2019/0062430 A1 | 2/2019 | Wu et al. |
| 2019/0290693 A1 | 9/2019 | Qi et al. |
| 2019/0292533 A1 | 9/2019 | Nager et al. |
| 2019/0336533 A1 | 11/2019 | Hwang et al. |
| 2019/0376037 A1 | 12/2019 | Campana et al. |
| 2020/0016208 A1 | 1/2020 | Kamiya et al. |
| 2020/0116208 A1 | 4/2020 | Riedisser et al. |
| 2020/0131244 A1 | 4/2020 | Leong et al. |
| 2020/0255803 A1 | 8/2020 | Zhang et al. |
| 2020/0340995 A1 | 10/2020 | Campana et al. |
| 2020/0407686 A1 | 12/2020 | Campana et al. |
| 2021/0009951 A1* | 1/2021 | Hu .................... C07K 16/248 |
| 2021/0017271 A1 | 1/2021 | Tan et al. |
| 2021/0046115 A1 | 2/2021 | Seow et al. |
| 2021/0054409 A1 | 2/2021 | Zhu et al. |
| 2021/0324388 A1 | 10/2021 | Vinanica et al. |
| 2021/0338727 A1 | 11/2021 | Trager et al. |
| 2021/0363218 A1 | 11/2021 | Fan et al. |
| 2022/0002424 A1 | 1/2022 | Trager et al. |
| 2022/0047635 A1 | 2/2022 | Liu et al. |
| 2022/0233590 A1 | 7/2022 | Trager et al. |
| 2022/0233593 A1 | 7/2022 | Trager et al. |
| 2022/0281971 A1 | 9/2022 | Shimasaki et al. |
| 2022/0411754 A1 | 12/2022 | Trager et al. |
| 2023/0002471 A1 | 1/2023 | Leong et al. |
| 2023/0028399 A1 | 1/2023 | Rajangam et al. |
| 2023/0220343 A1 | 7/2023 | Campana et al. |
| 2023/0265390 A1 | 8/2023 | Trager et al. |
| 2023/0390392 A1 | 12/2023 | Trager et al. |
| 2024/0335536 A1 | 10/2024 | Trager et al. |

FOREIGN PATENT DOCUMENTS

| | | |
|---|---|---|
| CN | 105838677 A | 8/2016 |
| CN | 105985931 A | 10/2016 |
| CN | 107109363 A | 8/2017 |
| CN | 107636015 A | 1/2018 |
| CN | 107827990 A | 3/2018 |
| CN | 108840930 A | 11/2018 |
| CN | 112055717 B1 | 4/2024 |
| EP | 0 952 213 A2 | 3/1999 |
| EP | 0 830 599 B1 | 4/2000 |
| EP | 1 231 262 A1 | 8/2002 |
| EP | 1 306 427 A1 | 5/2003 |
| EP | 1 053 301 B1 | 4/2004 |
| EP | 1 820 017 | 6/2006 |
| EP | 1 233 058 B1 | 12/2006 |
| EP | 1 036 327 B1 | 7/2009 |
| EP | 2 411 507 | 9/2010 |
| EP | 2 493 485 | 5/2011 |
| EP | 2 493 486 | 5/2011 |
| EP | 2 593 542 | 1/2012 |
| EP | 2 141 997 B1 | 10/2012 |
| EP | 2 614 151 | 10/2012 |
| EP | 2 756 521 | 3/2013 |
| EP | 2 866 834 | 1/2014 |
| EP | 2 903 637 | 4/2014 |
| EP | 2 904 106 | 4/2014 |
| EP | 2 948 544 | 7/2014 |
| EP | 2 956 175 | 8/2014 |
| EP | 2 961 831 | 9/2014 |

(56) References Cited

FOREIGN PATENT DOCUMENTS

| | | |
|---|---|---|
| EP | 2 964 753 | 9/2014 |
| EP | 2 970 426 | 9/2014 |
| EP | 2 968 601 | 10/2014 |
| EP | 2 986 636 | 10/2014 |
| EP | 2 537 416 B1 | 11/2014 |
| EP | 3 008 173 | 12/2014 |
| EP | 2 856 876 A1 | 4/2015 |
| EP | 3 057 986 | 4/2015 |
| EP | 3 063 175 | 5/2015 |
| EP | 3 071 221 | 5/2015 |
| EP | 3 071 222 | 5/2015 |
| EP | 3 071 223 | 5/2015 |
| EP | 3 083 671 | 6/2015 |
| EP | 3 083 691 | 6/2015 |
| EP | 3 094 653 | 7/2015 |
| EP | 3 105 318 | 8/2015 |
| EP | 3 105 335 | 8/2015 |
| EP | 2 968 492 | 9/2015 |
| EP | 3 119 425 | 9/2015 |
| EP | 3 126 380 | 10/2015 |
| EP | 3 134 432 | 10/2015 |
| EP | 3 180 359 | 2/2016 |
| EP | 3 189 132 | 3/2016 |
| EP | 3 012 268 A1 | 4/2016 |
| EP | 2 614 077 B1 | 8/2016 |
| EP | 3 115 373 A1 | 1/2017 |
| EP | 3 567 049 A2 | 11/2019 |
| EP | 3690033 A1 | 8/2020 |
| JP | 2017-112982 A | 6/2017 |
| KR | 10-2660336 B1 | 4/2024 |
| WO | WO 92/17198 A1 | 10/1992 |
| WO | WO 95/007358 A1 | 3/1995 |
| WO | WO 96/023814 A1 | 8/1996 |
| WO | WO 96/024671 A1 | 8/1996 |
| WO | WO 96/41163 A1 | 12/1996 |
| WO | WO 97/023613 A2 | 7/1997 |
| WO | WO 98/026061 A2 | 6/1998 |
| WO | WO 99/000494 A2 | 1/1999 |
| WO | WO 99/06557 A2 | 2/1999 |
| WO | WO 99/38954 A1 | 8/1999 |
| WO | WO 99/057268 A1 | 11/1999 |
| WO | WO 2000/014257 A1 | 3/2000 |
| WO | WO 00/23573 A2 | 4/2000 |
| WO | WO 2001/29191 A1 | 4/2001 |
| WO | WO 2001/38494 A1 | 5/2001 |
| WO | WO 2002/10350 A1 | 2/2002 |
| WO | WO 2002/033101 A1 | 4/2002 |
| WO | WO 02/077029 A2 | 10/2002 |
| WO | WO 2003/089616 A2 | 10/2003 |
| WO | WO 2004/027036 A2 | 4/2004 |
| WO | WO 2004/039840 A1 | 5/2004 |
| WO | 2005/000890 A1 | 1/2005 |
| WO | WO 2005/044996 A2 | 5/2005 |
| WO | WO 2005/118788 A2 | 12/2005 |
| WO | WO 2006/036445 A2 | 4/2006 |
| WO | WO 2006/052534 A2 | 5/2006 |
| WO | WO 2006/061626 A2 | 6/2006 |
| WO | 2006119115 A2 | 11/2006 |
| WO | WO 2007/046006 A2 | 4/2007 |
| WO | WO 2008/121420 A1 | 10/2008 |
| WO | WO 2009/117566 A1 | 9/2009 |
| WO | WO 2010/071836 A1 | 6/2010 |
| WO | WO 2010/110734 A1 | 9/2010 |
| WO | WO 2011/020047 A1 | 2/2011 |
| WO | WO 2011/053321 A1 | 5/2011 |
| WO | WO 2011/053322 A1 | 5/2011 |
| WO | WO 2011/069019 A2 | 6/2011 |
| WO | WO 2011/080740 A1 | 7/2011 |
| WO | WO 2011/150976 A1 | 12/2011 |
| WO | WO 2012/009422 A1 | 1/2012 |
| WO | WO 2012/031744 A1 | 3/2012 |
| WO | WO 2012/040323 A2 | 3/2012 |
| WO | WO 2012/071411 A2 | 5/2012 |
| WO | WO 2012/079000 A1 | 6/2012 |
| WO | WO 2012/136231 A1 | 10/2012 |
| WO | 2013/043196 A1 | 3/2013 |
| WO | WO 2013/040371 A2 | 3/2013 |
| WO | WO 2013/040557 A2 | 3/2013 |
| WO | WO 2013/123720 A2 | 8/2013 |
| WO | WO 2013/123726 A1 | 8/2013 |
| WO | WO 2014/005072 A1 | 1/2014 |
| WO | WO 2014/011993 A1 | 1/2014 |
| WO | 2017/029512 A1 | 2/2014 |
| WO | WO 2014/055413 A2 | 4/2014 |
| WO | WO 2014/055442 A2 | 4/2014 |
| WO | WO 2014/055657 A1 | 4/2014 |
| WO | WO 2014/055668 A1 | 4/2014 |
| WO | WO 2014/099671 A1 | 6/2014 |
| WO | WO 2014/117121 A1 | 7/2014 |
| WO | WO 2014/127261 A1 | 8/2014 |
| WO | WO 2014/134165 A1 | 9/2014 |
| WO | WO 2014/138704 A1 | 9/2014 |
| WO | WO 2014/145252 A2 | 9/2014 |
| WO | WO 2014/164554 A1 | 10/2014 |
| WO | WO 2014/172584 A1 | 10/2014 |
| WO | WO 2014/186469 A2 | 11/2014 |
| WO | WO 2014/201021 A2 | 12/2014 |
| WO | WO 2015/058018 A1 | 4/2015 |
| WO | WO 2015/066551 A2 | 5/2015 |
| WO | WO 2015/075468 A1 | 5/2015 |
| WO | WO 2015/075469 A1 | 5/2015 |
| WO | WO 2015/075470 A1 | 5/2015 |
| WO | WO 2015/092024 A2 | 6/2015 |
| WO | WO 2015/095895 A1 | 6/2015 |
| WO | WO 2015/105522 A1 | 7/2015 |
| WO | WO 2015/120421 A1 | 8/2015 |
| WO | WO 2015/123642 A1 | 8/2015 |
| WO | WO 2015/142314 A1 | 9/2015 |
| WO | WO 2015/142661 A1 | 9/2015 |
| WO | 2015/157391 A1 | 10/2015 |
| WO | WO 2015/150771 A1 | 10/2015 |
| WO | WO 2015/154012 A1 | 10/2015 |
| WO | WO 2015/154012 A8 | 10/2015 |
| WO | WO 2015/164759 A2 | 10/2015 |
| WO | WO 2015/174928 A1 | 11/2015 |
| WO | 2015/188119 A1 | 12/2015 |
| WO | WO 2015/193411 A1 | 12/2015 |
| WO | 2016/014576 A1 | 1/2016 |
| WO | WO 2016/011210 A2 | 1/2016 |
| WO | WO 2016/030691 A1 | 3/2016 |
| WO | WO 2016/033331 A1 | 3/2016 |
| WO | WO 2016/040441 A1 | 3/2016 |
| WO | WO 2016/042041 A1 | 3/2016 |
| WO | WO 2016/042461 A1 | 3/2016 |
| WO | WO 2016/061574 A1 | 4/2016 |
| WO | 2016/073755 A9 | 5/2016 |
| WO | WO 2016/069607 A1 | 5/2016 |
| WO | WO 2016/073602 A1 | 5/2016 |
| WO | WO 2016/073629 A1 | 5/2016 |
| WO | WO 2016/073755 A2 | 5/2016 |
| WO | WO 2016/075612 A1 | 5/2016 |
| WO | 2016/100985 A2 | 6/2016 |
| WO | 2016/118857 A1 | 7/2016 |
| WO | WO 2016/109661 A1 | 7/2016 |
| WO | WO 2016/109668 A1 | 7/2016 |
| WO | WO 2016/115482 A1 | 7/2016 |
| WO | 2017/040324 A1 | 8/2016 |
| WO | WO 2016/123122 A1 | 8/2016 |
| WO | WO 2016/123333 A1 | 8/2016 |
| WO | WO 2016/124765 A1 | 8/2016 |
| WO | WO 2016/124930 A1 | 8/2016 |
| WO | WO 2016/126213 A1 | 8/2016 |
| WO | WO 2016/126608 A1 | 8/2016 |
| WO | 2016/139487 A1 | 9/2016 |
| WO | WO 2016/141357 A1 | 9/2016 |
| WO | WO 2016/142314 A1 | 9/2016 |
| WO | WO 2016/149254 A1 | 9/2016 |
| WO | WO 2016/151315 A1 | 9/2016 |
| WO | WO 2016/154055 A1 | 9/2016 |
| WO | WO 2016/154585 A1 | 9/2016 |
| WO | 2016/168773 A2 | 10/2016 |
| WO | WO 2016/172537 A1 | 10/2016 |
| WO | WO 2016/172583 A1 | 10/2016 |
| WO | WO 2016/174405 A1 | 11/2016 |

(56) References Cited

FOREIGN PATENT DOCUMENTS

| | | |
|---|---|---|
| WO | WO 2016/174406 A1 | 11/2016 |
| WO | WO 2016/174407 A1 | 11/2016 |
| WO | WO 2016/174408 A1 | 11/2016 |
| WO | WO 2016/174409 A1 | 11/2016 |
| WO | WO 2016/174461 A1 | 11/2016 |
| WO | WO 2016/174652 A1 | 11/2016 |
| WO | WO 2016/179684 A1 | 11/2016 |
| WO | WO 2016/191587 A1 | 12/2016 |
| WO | WO 2016/191755 A1 | 12/2016 |
| WO | WO 2016/196388 A1 | 12/2016 |
| WO | WO 2016/197108 A1 | 12/2016 |
| WO | WO 2016/201304 A1 | 12/2016 |
| WO | WO 2016/210293 A1 | 12/2016 |
| WO | WO 2017/004150 A1 | 1/2017 |
| WO | WO 2017/011804 A1 | 1/2017 |
| WO | WO 2017/021701 A1 | 2/2017 |
| WO | WO 2017/023859 A1 | 2/2017 |
| WO | WO 2017/024131 A1 | 2/2017 |
| WO | WO 2017/027325 A1 | 2/2017 |
| WO | WO 2017/029511 A1 | 2/2017 |
| WO | WO 2017/032777 A1 | 3/2017 |
| WO | WO 2017/034615 A1 | 3/2017 |
| WO | WO 2017/037083 A1 | 3/2017 |
| WO | WO 2017/058752 A1 | 4/2017 |
| WO | WO 2017/058753 A1 | 4/2017 |
| WO | WO 2017/079694 A2 | 5/2017 |
| WO | WO 2017/079705 A1 | 5/2017 |
| WO | WO 2017/079881 A1 | 5/2017 |
| WO | WO 2017/096329 A1 | 6/2017 |
| WO | WO 2017/127729 A1 | 7/2017 |
| WO | WO 2017/172981 A2 | 10/2017 |
| WO | WO-2017186928 A1 * | 11/2017 ......... A61K 48/0066 |
| WO | 2017/222593 A1 | 12/2017 |
| WO | WO 2018/022646 A1 | 2/2018 |
| WO | 2018/057915 A1 | 3/2018 |
| WO | 2018106732 A1 | 6/2018 |
| WO | WO 2018/103503 A1 | 6/2018 |
| WO | 2018124766 A2 | 7/2018 |
| WO | 2018/146317 A1 | 8/2018 |
| WO | WO 2018/182511 A1 | 10/2018 |
| WO | WO 2018/183385 A1 | 10/2018 |
| WO | 2019/028051 A1 | 2/2019 |
| WO | WO 2019/062817 A1 | 4/2019 |
| WO | WO 2019/077037 A1 | 4/2019 |
| WO | 2019/091478 A1 | 5/2019 |
| WO | 2019/112899 A2 | 6/2019 |
| WO | 2019129220 A1 | 7/2019 |
| WO | WO 2019/129002 A1 | 7/2019 |
| WO | WO 2019/155286 A2 | 8/2019 |
| WO | WO 2019/155288 A1 | 8/2019 |
| WO | 2019/169290 A1 | 9/2019 |
| WO | 2019/199689 A1 | 10/2019 |
| WO | WO 2019/193476 A1 | 10/2019 |
| WO | WO 2020/044239 A1 | 3/2020 |
| WO | WO 2020/083282 A1 | 4/2020 |
| WO | WO 2021/009694 A1 | 1/2021 |

OTHER PUBLICATIONS

Berger et al. (Blood. 2003;101:476-484). (Year: 2003).*
Yanez et al., Immunity 47, 890-902, Nov. 21, 2017. (Year: 2017).*
Ren, P.-P. et al., Anti-EGFRvill Chimeric Antigen Receptor-Modified T Cells for Adoptive Cell Therapy of Glioblastoma, Current Pharmaceutical Design, 23(14), 2113-2116 (2017).
Morgan, R.A. et. al., Recognition of Glioma Stem Cells by Genetically Modified T Cells Targeting EGFRvIII and Development of Adoptive Cell Therapy for Glioma, Human Gene Therapy, 23(10), 1043-1053 (2012).
Dalal, A.-R. et al., Third-Generation Human Epidermal Growth Factor Receptor 2 Chimeric Antigen Receptor Expression on Human T Cells Improves with Two-Signal Activation, Human Gene Therapy, 845-852 (2018) (Abstract).

Choi, B. D. et al., Chimeric antigen receptor T-cell immunotherapy for glioblastoma: practical insights for neurosurgeons, Neurosurg Focus, 44(6): E13, 1-6 (2018).
Zuther, "Generation of the Plasmid pMT/BiP SCA431scFv-Fc-IL 15 (#1118), " Chapter 4.1.8 of An Anti-CD30 Immunocytokine with Combined IL-2 and IL-12 Domains Enhances Anti-Tumor Immunity, p. 70 (Oct. 1, 2009).
Mirzaei, H.R., et al., "Construction and functional characterization of a fully human anti-CD19 chimeric antigen receptor (huCAR)-expressing primary human T cells," J Cell Physiol. Jun. 2019; 234(6):9207-9215. doi: 10.1002/jcp.27599. Epub Oct. 26, 2018. PMID: 30362586 (Abstract).
Chen, F., "Construction of Anti-CD20 Single-Chain Antibody-CD28-CD137-TCR Recombinant Genetic Modified T Cells and its Treatment Effect on B Cell Lymphoma," Med Sci Monit 2015; 21:2110-2115 (Jul. 21, 2015).
Kohrt, H.E., "Immunomodulation of NK Cells through 4-1BB (CD137) to Improve the Anti-Lymphoma Activity of Rituximab: Antibody-Based Anti-Lymphoma Snergy," Blood, 2010, 116(21), 422 (Abstract).
Robak, T., New Anti-CD20 Monoclonal Antibodies for the Treatment of B-Cell Lymphoid Malignancies, BioDrugs 25, 13-25 (2011) (Abstract).
Kochenderfer, J.N., "Eradication of B-lineage and regression of lymphoma in a patient treated with autologous T cells genetically engineered to recognize CD19," Blood, 2010, 116(20), 4099-4102.
Schmohl J.U., et al., Tetraspecific scFv construct provides NK cell mediated ADCC and self-sustaining stimuli via Insertion of IL-15 as a cross-linker. Oncotarget. 2016; 7: 73830-73844.
Wang, W., "NK cell-mediated antibody-dependent cellular cytotoxicity in cancer immunotherapy," Frontiers in Immunology, 2015, 6, 368.
Vinanica, N., et al., "Specific stimulation of T lymphocytes with erythropoietin for adoptive immunotherapy", Blood, 135 (9): 668-679 (Feb. 27, 2020).
Imamura, M. et al., "Autonomous growth and increased cytotoxicity of natural killer cells expressing membrane-bound interleukin-15," Blood, 124(7): 1081-1088 (2014).
Suarez, et al., "Chimeric Antigen Receptor T Cells Secreting Anti-PD-L1 Antibodies More Effectively Regress Renal Cell Carcinoma in a Humanized Mouse Model," Oncotarget, vol. 7, No. 23, Apr. 29, 2016.
Li, et al., "Therapeutically Targeting Glypican-2 via Single-Domain Antibody-Based Chimeric Antigen Receptors and Immunotoxins in Neuroblasoma," PNAS, pp. E6623-E6631 (Jul. 24, 2017).
Eyquem et al., "Targeting a CAR to the TRAC locus with CRISPR/Cas9 enchances tumour rejction" Nature, 2017, 543(7643): 113-117.
Seif et al., "The role of JAK-STAT signaling pathway and its regulators in the fate of T helper cells" Cell Communication and Signaling (2017) 15:23.
Themeli et al., "Generation of tumor-targeted human T lympocytes from Induced pluripotent stem cells for cancer therapy", Nat Biotechnol., 2013; 31(10): 028-933.
Watowich et al., "The Erythropoietin Receptor: Molecular Structure and Hematopoietic Signaling Pathways," J. Investig Med. 2011, 59(7): 1067-1072.
Caratelli et al., "FCy Chimeric Receptor-Engineered T Cells: Methodology, Advantages, Limitations, and Clinical Relevance," Front Immunol., vol. 8, Article 457 , 8 pages (Apr. 27, 2017).
Hombach, A.A., et al., "Costimulation by chimeric antigen receptors revisited: the T cell antitumor response benefits from combined CD28-OX40 signalling", Int. J. Cancer, 129, 2935-2944 (2011).
Hurton, L.V. et al., "Tethered IL-15 augments antitumor activity and promotes a stem-cell memory subset in tumor-specific T cells," PCNAS, USA, 113(48): E7788-E7797 (Nov. 2016).
Kober, J., et al. "The capacity of the TNF family members 4-1BBL, OX40L, CD70, GITRL, CD30L and LIGHT to costimulate human T cells," Eur J Immuno, vol. 38, No. 10, pp. 2678-2688 (Oct. 28, 2008).
NCIthesaurus, Bicistronic chimeric antigen reeptor vector, retrieved online from: https://ncit.nci.nih.gov/ncitbrowser/pages/home.jsf.jsessionid=12B0F7AF71E9A4035C38B5E4F6C055B0, retrieved on: Jan. 21, 2021.

(56) References Cited

OTHER PUBLICATIONS

Abken, H. et al., "Antigen-specific T-cell activation independently of the MHC: chimeric antigen receptor-redirected T cells," Frontiers in Immunology, V. 4, Article 371, c. 4 (2013).
Calabrese, et al., "IL-6 biology: implications for clinical targeting in rheumatic disease, " S. Nat. Rev. Rheumatol, 10, 720-727 (2014); published online Aug. 19, 2014 (corrected online Sep. 19, 2014).
Cordoba, S.P. et al., "The large ectodomains of CD45 and CD148 regulate their segregation from and inhibition of ligated T-cell receptor," Blood, The Journal of the American Society of Hematology, V. 121, N. 21, p. 4295-4302, c. 4301 (2013).
Culpepper, D.J. et al., "Systematic mutation and thermodynamic analysis of central tyrosine pairs in polyspecific NKG2D receptor interactions," Molecular Immunology, V. 48, N. 4, p. 516-523, c. 521-522 (2011).
De Felipe, P., "Polycistronic Viral Vectors," Current Gene Therapy, V. 2, N. 3, p. 355-378, c. 360 (2002).
Lanier, Lewis L., "Nk Cell Recognition," Annual Review of Immunology, vol. 23, No. 1, pp. 225-274 (2005).
Lima, et al., "Interleukin-6 Neutralization by Antibodies Immobilized at the Surface of Polymeric Nanoparticles as a Therapeutic Strategy for Arthritic Diseases," ACS Appl. Mater. Interfaces 2018, 10, 13839-13850.
Zhao, Y. et al., "A Herceptin-Based Chimeric Antigen Receptor with Modified Signaling Domains Leads to Enhanced Survival of Transduced T Lymphocytes and Antitumor Activity," The Journal of Immunology, V. 183, N. 9, p. 5563-5574, c. 5568, 5571 (2009).
Gillet et al., Selectable Markers for Gene Therapy, Chapter 26 of Gene and Cell Therapy:Therapeutic Mechanisms and Strategies, 3rd Ed. N .S. Templeton Ed, (CRC Press:Bpca Ratpm. FL), pp. 555 and 558, 2009.
Suerth et al., "Efficient Generation of Gene-Modified Human Natural Killer Cells via Alpharetroviral Vectors," J. Mol. Med. 94:83-93, 2016, published online Aug. 25, 2015.
Sokolic et al., "A Selectable Bicistronic Retroviral Vector Corrects the Molecular Defect in a Cell Line Derived from a Patient with Leukocyte Adhesion Deficiency," Biol. Blood Marrow Transpl. 12(2) Suppl 1: 20-21, Feb. 2006.
International Preliminary Report on Patentability for Int'l Application No. PCT/IB2019/052636, titled: Neutralization of Human Cytokines with Membrane-Bound Anti-Cytokine Non-Signaling Binders Expressed in Immune Cells, Date Mailed: Oct. 6, 2020.
Gacerez, A, et al., "How Chimeric Antigen Receptor Design Affects Adoptive T Cell Therapy," Journal of Cellular Physiology, vol. 231, No. 12, pp. 2590-2598; Jun. 2, 2016.
Sadelain, M. et al., "The Basic Principles of Chimeric Antigen Receptor Design," Cancer Discovery, vol. 3, No. 4, pp. 388-398 (Apr. 1, 2013).
Abakushina, E.V., "Immunotherapy With Natural Killer Cells In The Treatment Of Cancer," Russian Journal of Immunology, vol. 10, No. 2, pp. 131-142 (2016) (Abstract only).
Pakula, A.A. et al., "Genetic analysis of protein stability and function," Annual Review of Genetics, V. 23, N. 1, p. 289-310, c. 305-306 (1989).
Denman et al., "Membrane-Bound IL-21 Promotes Sustained Ex Vivo Proliferation of Human Natural Killer Cells," PLoS One, vol. 7, Issue 1, Jan. 2012.
Dowell, A. C. , "Studies of Human T cell Costimulation:Potential for the Immunotherapy of Cancer," A thesis submitted to The University of Birmingham for the degree of Doctor of Philosophy, Cruk Institute for Cancer Studies, 2010.
GenBank Accession No. NM_172175.2, *Homo sapiens* interleukin 15 (IL15), transcript variant 2, mRNA, dated Feb. 12, 2011, 4 pages.
Hasan, A.N., "Soluble and membrane-bound interleukin (IL)-15 Ra/IL-15 complexesmediate proliferation of high-avidity central memory CD81T cells foradoptive immunotherapy of cancer and infections," Clinical and Experimental Immunology, 186: 249-265, 2016.

Leitner et al., "T cell stimulator cells, an efficient and versatile cellular system to assess the role of costimulatory ligands in the activation of human T cells," Journal of Immunological Methods, 362, 131-141, 2010.
Oyer et al., "Natural killer cells stimulated with PM21 particles expand and biodistribute in vivo: Clinical implications for cancer treatment," Cytotherapy, 18: 653-663, 2016.
Wang et al., "Human NK cells maintain licensing status and are subject to killer immunoglobulin-like receptor (KIR) and KIR-ligand inhibition following ex vivo expansion," Cancer Immunol Immunother, 65:1047-1059, 2016.
Zhang et al., "Improving Adoptive T Cell Therapy by Targeting and Controlling IL-12 Expression to the Tumor Environment," The American Society of Gene & Cell Therapy Molecular Therapy, vol. 19, No. 4, 751-759, 2011.
Atreya, et al., "Blockade of interleukin 6 trans signaling suppresses T-cell resistance against apoptosis in chronic intestinal inflammation: Evidence in Crohn disease and experimental colitis in vivo;" Nature Medicine, vol. 6, No. 5, May 2000; pp. 583-588.
Call et al., "The structural basis for intramembrane assembly of an activating immunoreceptor complex;" Nat Immunol Nov. 2010; 11(11): 1023-1029.
Figueiredo et al., "Permanent silencing of NKG2A expression for cell-based therapeutics;" J. Mol. Med. (2009) 87:199-210.
Gillet et al., "Selectable markers for gene therapy," Chapter 27 of Gene and Cell Therapy:Therapeutic Mechanisms and Strategies, 3rd Ed. N .S. Templeton Ed, (CRC Press:Boca Raton, FL), pp. 701-738 (2009).
Hong, et al., "Interleukin-6 expands homeostatic space for peripheral T cells;" Cytokine 64 (2013) pp. 532-540.
Iacobucci et al., Truncating Erythropoietin Receptor Rearrangements in Acute Lymphoblastic Leukemia, Cancer Cell, vol. 29, No. 2, pp. 186-200, published on Feb. 8, 2016.
Jiang, Z., et al., "IL-6 trans-signaling promotes the expansion and anti-tumor activity of CAR T cells" Leukemia (2021) 35; pp. 1380-1391.
Li, et al., "IL-6 Promotes T Cell Proliferation and Expansion under Inflammatory Conditions in Association with Low-Level ROR-yt Expression" J. Immunol (2018) 201(10); pp. 2934-2946.
Nish, et al., "T cell-intrinsic role of IL-6 signaling in primary and memory responses" eLife 2014;3:e01949.
Qin et al., "Incorporation of a hinge domain improves the expansion of chimeric antigen receptor T cells" J. Hematol. Oneal. Mar. 13, 2017; 10(1):68.
Rochman, et al., "IL-6 Increases Primed Cell Expansion and Survival" The Journal of Immunology (2005) 174(8); pp. 4761-4767.
Teachey, et al., "Identification of Predictive Biomarkers for Cytokine Release Syndrome after Chimeric Antigen Receptor T-cell Therapy for Acute Lymphoblastic Leukemia" Cancer Discovery, Jun. 2016, pp. 664-679.
Abken et al., "Chimeric T-cell receptors: highly specific tools to target cytotoxic T-lymphocytes to tumour cells," Cancer Treat Rev., 23(2): 97-112, Mar. 1997.
Abken, H., et al., "Tuning tumor-specific T-cell activation: a matter of costimulation?" TRENDS in Immunol. 23: 240-245 (2002).
Aguera-Gonzalez et al., "Palmitoylation of MICA, a ligand for NKG2D, mediates its recruitment to membrane microdomains and promotes its shedding," Eur. J. Immunol. vol. 41, pp. 3667-3676 (2011).
Alderson et al., "Molecular and Biological Characterization of Human 4-1BB and its Ligand," Eur. J. Immunol., 1994, 24: 2219-2227.
Allison et al., "Structure, function, and serology of the T-cell antigen receptor complex," Ann. Rev. Immunol., 1987, 5:503-540.
Alvarez-Vallina, L. and Hawkins, R.E., "Antigen-specific targeting of CD28-mediated T cell co-stimulation using chimeric single-chain antibody variable fragment-CD28 receptors," Eur. J. Immunol., 26: 2304-2309 (1996).
Ang, S.O. et al., "Avoiding the need for clinical-grade OKT3: cx vivo expansion of T cells using artificial antigen presenting cells genetically modified to crosslink CD3" Biology of Blood and Marrow Transplantation, Jan. 9, 2012, vol. 8, No. 2, pp. S258.

(56) References Cited

OTHER PUBLICATIONS

Annenkov, A., et al., "Engineering mouse T lymphocytes specific to type II collagen by transduction with a chimeric receptor consisting of a single chain Fv and TCR zeta," Gene Therapy, 7: 714-722 (2000).

Antony, G.K., et al., "Interleukin 2 in cancer therapy," Current Medicinal Chemistry,17(29): 3297-3302 (2010).

Aoudjit and Vuori, "Integrin Signaling in Cancer Cell Survival and Chemoresistance," Chemotherapy Research and Practice, 2012(Article ID 283181), 1-16, 2012.

Appelbaum, "Haematopoietic cell transplantation as immunotherapy," Nature, 2001, 411(6835): 385-389.

Aruffo, A., et al., "Molecular cloning of a CD28 cDNA by a high-efficiency COS cell expression system," Proc. Natl. Acad. Sci., 1987, 84:8573-8577.

ATCC No. CCL-243, 1975, 19 pages.

Azuma, M, et al., "Functional Expression of B7/BB1 on Activated T Lymphocytes," J. Exp. Med. 177: 845-850 (1993).

Baek, H.J. et al., "Ex vivo expansion of natural killer cells using cryopreserved irradiated feeder cells," Anticancer Research, 33: 2011-2020 (2013).

Barber et al., "Chimeric NKG2D Expressing T Cells Eliminate Immunosuppression and Activate Immunity within the Ovarian Tumor Microenvironment," J. Immunol, vol. 183, pp. 6939-6947 (2009).

Barber et al., "Chimeric NKG2D Receptor-Bearing T Cells as Immunotherapy for Ovarian Cancer," American Association for Cancer, vol. 67, No. 10, pp. 5003-5008, (May 15, 2007).

Barber et al., "Chimeric NKG2D receptor-expressing T cells as an immunotherapy for multiple myeloma," Experimental Hematology, vol. 36, pp. 1318-1328, (2008).

Barber et al., "Chimeric NKG2D T Cells Require Both T Cell- and Host-Derived Cytokine Secretion and Perforin Expression to Increase Tumor Antigen Presentation and Systemic Immunity," J. Immunol, vol. 183, pp. 2365-2372 (2009).

Barber et al., "Immunotherapy with Chimeric NKG2D Receptors Leads to Long-Term Tumor-Free Survival and Development of Host Antitumor Immunity in Murine Ovarian Cancer," J. Immunol., vol. 180, pp. 72-78, (2008).

Barber et al., "Treatment of multiple myeloma with adoptively transferred chimeric NKG2D receptor-expressing T cells," Gene Therapy, vol. 18, pp. 509-516, (2011).

Barrett, D.M., et al., "Chimeric Antigen Receptor Therapy for Cancer," Annu Rev. Med. 65: 333-347 (2014).

Bartholomew et al., "Mesenchymal stem cells suppress lymphocyte proliferation in vitro and prolong skin graft survival in vivo," Exp Hematol, Jan. 2002, 30(1): 42-48.

Batlevi, C.L., et al. "Novel immunotherapies in lymphoid malignancies," Nature Rev. Clin. Oncol.13:25-40 (2016).

Baum et al., "Side effects of retroviral gene transfer into hematopoietic stem cells," Blood, Mar. 2003, 101(6): 2099-2114.

Bejcek et al., "Development and Characterization of Three Recombinant Single Chain Antibody Fragments (scFvs) Directed against the CD19 Antigen," Cancer Res., 1995, 55:2346-2351.

Berger, C. et al., "Safety and immunologic effects of IL-15 administration in nonhuman primates," Blood, 114(12): 2417-2426 (2009).

Besser, M.J., et al., "Adoptive Transfer of Tumor-Infiltrating Lymphocytes in Patients with Metastatic Melanoma: Intent-to-Treat Analysis and Efficacy after Failure to Prior Immunotherapies," Clin. Cancer Res. 19: 4792-4800 (2013).

Better et al., "Manufacturing and Characterization of KTE-C19 in a Multicenter Trial of Subjects with Refractory Aggressive Non-Hodgkin Lymphoma (NHL) (ZUMA-1)," Poster session presented at the American Association for Cancer Research Annual Meeting, New Orleans, Louisiana (2016).

Billadeau et al., "NKG2D-DAP10 triggers human NK cell-mediated killing via a Syk-independent regulatory pathway," Nat Immunol, Jun. 2003, 4(6): 557-564.

Bischof et al., "Autonomous induction of proliferation, JNK and NF-xB activation in primary resting T cells by mobilized CD28," Eur J Immunol., 30(3):876-882, Mar. 2000.

Bork et al., "The immunoglobulin fold. Structural classification, sequence patterns and common core," J Mol Biol., 242(4):309-320, Sep. 30, 1994.

Boyman, O., et al., "The role of interleukin-2 during homeostasis and activation of the immune system," Nat Rev Immunol., 12: 180-190 (2012).

Brand, L.J. et al., "Abstract LB-185: A PSMA-directed natural killer cell approach for prostate cancer immunotherapy," Cancer Research, 77(13 Supplement): Abstract No. LB-185, 1-4 (Jul. 2017).

Brentjens et al., "Eradication of Systemic B-Cell Tumors by Genetically Targeted Human T Lymphocytes Co-Stimulated By CD80 and Interleukin-15," Nature Medicine, 2003, 9: 279-286.

Brentjens, R.J., et al., "CD19-Targeted T Cells Rapidly Induce Molecular Remissions in Adults with Chemotherapy-Refractory Acute Lymphoblastic Leukemia," Sci. Trans. Med. 5: 1-9 (2013).

Brentjens, R.J., et al., "Safety and persistence of adoptively transferred autologous CD19-targeted T cells in patients with relapsed or chemotherapy refractory B-cell leukemias," Blood 119(18): 4817-4828 (2011).

Bridgeman, J.S., et al., "Building Better Chimeric Antigen Receptors for Adoptive T Cell Therapy," Current Gene Therapy 10: 77-90 (2010).

Bridgeman, J.S. et al., "The Optimal Antigen Response of Chimeric Antigen Receptors Harboring the CD3ζ Transmembrane Domain is Dependent upon Incorporation of the Receptor into the Endogenous TCR/CD3 Complex," J Immunol, 184(12): 6938-6949 (May 2010).

Brocker et al., "New simplified molecular design for functional T cell receptor," Eur J Immunol., 23(7):1435-1439, Jul. 1993.

Bromley et al., "The immunological synapse and CD28-CD80 interactions," Nat Immunol., 2(12):1159-1166, Dec. 2001.

Bronte, V., and Mocellin, S., "Suppressive Influences in the Immune Response to Cancer," J. Immunother . 32: 1-11 (2009).

Budagian, V. et al., "IL-15/IL-15 receptor biology: A guided tour through an expanding universe," Cytokine & Growth Factor Reviews, 17: 259-280 (2006).

Bukczynski et al., "Costimulation of Human CD28⁻ T Cells by 4-1BB Ligand," Eur. J. Immunol., 2003, 33: 446-454.

Burkett, P.R. et al., "Coordinate expression and trans presentation of interleukin (IL)-15Rα and IL-15 supports natural killer cell and memory CD8+ T cell homeostasis," J Exp Med., 200(7): 825-834 (2004).

Caligiuri et al., "Immunotherapeutic approaches for hematologic malignancies," Hematology Am Soc Hematol Educ Program, 2004, 37-53.

Campana et al., "Immunophenotyping of Leukemia," Journal of Immunol Methods, 2000, 243: 59-75.

Cardoso AA, et al., " Pre-B acute lymphoblastic leukemia cells may induce T-cell anergy to alloantigen," Blood 88:41-48 (1996).

Carson, W.E. et al., "A potential role for interleukin-15 in the regulation of human natural killer cell survival," J Clin Invest., 99(5): 937-943 (1997).

Carter, P., et al., "Identification and validation of cell surface antigens for antibody targeting in oncology," Endocrine-Related Cancer 11: 659-687 (2004).

Cesano, A., et al. "Reversal of Acute Myelogenous Leukemia in Humanized SCID Mice Using a Novel Adoptive Transfer Approach," J. Clin. Invest. 94: 1076-1084 (1994).

Chambers, C.A., "The expanding world of co-stimulation: the two-signal model revisited," TRENDS in Immunol., 2001, 22(4):217-223.

Champlin R. "T-cell depletion to prevent graft-versus-host disease after bone marrow transplantation," Hematol Oncol Clin North Am. Jun. 1990;4(3):687-698.

Chang et al., "Five Different Anti-Prostate-specific Membrane Antigen (PSMA) Antibodies Confirm PSMA Expression in Tumor-associated Neovasculature," Cancer Res., 59: 3192-3198 (1999).

Chang, Y.H. et al., "A chimeric receptor with NKG2D specificity enhances natural killer cell activation and killing of tumor cells," Cancer Res., 73(6): 1777-1786 (2013).

(56) References Cited

OTHER PUBLICATIONS

Chao, D.T. et al., "BCL-2 family: regulators of cell death," Annu Rev Immunol., 16: 395-419 (1998).

Cheresh et al., "Disialogangliosides GD2 and GD3 Are Involved in the Attachment of Human Melanoma and Neuroblastoma Cells to Extracellular Matrix Proteins," J Cell Biol. 1986, 102(3):688-696.

Chertova, E. et al., "Characterization and favorable in vivo properties of heterodimeric soluble IL-15•IL-15Rα cytokine compared to IL-15 monomer," J Biol Chem., 288(25): 18093-18103 (2013).

Cheung et al., "Anti-Idiotypic Antibody Facilitates scFv Chimeric Immune Receptor-Gene Transduction and Clonal Expansion of Human Lymphocytes for Tumor Therapy," Hybridoma and Hybridomics, 2003, 24(4): 209-218.

Chiorean and Miller, "The biology of natural killer cells and implications for therapy of human disease," J Hematother Stem Cell Res, Aug. 2001, 10(4): 451-463.

Cho, D., and D. Campana, "Expansion and activation of natural killer cells for cancer immunotherapy," The Korean Journal of Laboratory Medicine, 29(2): 89-96 (2009).

Clarke et al., "Folding studies of immunoglobulin-like β-sandwich proteins suggest that they share a common folding pathway," Structure, 7(9):1145-1153, Sep. 15, 1999.

ClinicalTrials.gov, "A Multi-Center Study Evaluating KTE-C19 in Pediatric and Adolescent Subjects With Relapsed/Refractory B-precursor Acute Lymphoblastic Leukemia (ZUMA-4)," available at https://clinicaltrials.gov/show/NCT02625480, NCT02625480 (Retrieved from the Internet on Jun. 21, 2016).

ClinicalTrials.gov, "A Phase 1-2 Multi-Center Study Evaluating KTE-C19 in Subjects With Refractory Aggressive Non-Hodgkin Lymphoma (ZUMA-1) (ZUMA-1)," available at https://clinicaltrials.gov/show/NCT02348216, NCT02348216 (Retrieved from the Internet on Jun. 21, 2016).

ClinicalTrials.gov, "A Phase 2 Multicenter Study Evaluating Subjects With Relapsed/Refractory Mantle Cell Lymphoma (ZUMA-2)," available at https://clinicaltrials.gov/show/NCT02601313, NCT02601313 (Retrieved from the Internet on Jun. 21, 2016).

ClinicalTrials.gov, "A Study Evaluating KTE-C19 in Adult Subjects With Relapsed/Refractory B-precursor Acute Lymphoblastic Leukemia (r/r ALL) (ZUMA-3) (ZUMA-3)," available at https://clinicaltrials.gov/show/NCT02614066, NCT02614066 (Retrieved from the Internet on Jun. 21, 2016).

ClinicalTrials.gov, "Administration of Anti-CD19-chimeric-antigen-receptor-transduced T Cells From the Original Transplant Donor to Patients With Recurrent or Persistent B-cell Malignancies After Allogencic Stem Cell Transplantation," available at https://clinicaltrials.gov/show/NCT01087294, NCT01087294 (Retrieved from the Internet on Jun. 21, 2016).

ClinicalTrials.gov, "Anti-CD19 White Blood Cells for Children and Young Adults With B Cell Leukemia or Lymphoma," available at https://clinicaltrials.gov/show/NCT01593696, NCT01593696 (Retrieved from the Internet on Jun. 21, 2016).

ClinicalTrials.gov, "Car T Cell Receptor Immunotherapy for Patients With B-cell Lymphoma," available at https://clinicaltrials.gov/show/NCT00924326, NCT00924326 (Retrieved from the Internet on Jun. 21, 2016).

ClinicalTrials.gov, "CD19 CAR T Cells for B Cell Malignancies After Allogencic Transplant," available at https://clinicaltrials.gov/show/NCT01475058, NCT01475058 (Retrieved from the Internet on Jun. 21, 2016).

ClinicalTrials.gov, "CD19 Chimeric Receptor Expressing T Lymphocytes In B-Cell Non Hodgkin's Lymphoma, ALL & CLL (CRETI-NH)," available at https://clinicaltrials.gov/show/NCT00586391, NCT00586391 (Retrieved from the Internet on Jun. 21, 2016).

ClinicalTrials.gov, "CD19+ CAR T Cells for Lymphoid Malignancies," available at https://clinicaltrials.gov/show/NCT02529813, NCT02529813 (Retrieved from the Internet on Jun. 21, 2016).

ClinicalTrials.gov, "Consolidation Therapy With Autologous T Cells Genetically Targeted to the B Cell Specific Antigen CD19 in Patients With Chronic Lymphocytic Leukemia Following Upfront Chemotherapy With Pentostatin, Cyclophosphamide and Rituximab," available at https://clinicaltrials.gov/show/NCT01416974, NCT01416974 (Retrieved from the Internet on Jun. 21, 2016).

ClinicalTrials.gov, "Genetically Engineered Lymphocyte Therapy in Treating Patients With B-Cell Leukemia or Lymphoma That is Resistant or Refractory to Chemotherapy," available at https://clinicaltrials.gov/show/NCT01029366, NCT01029366 (Retrieved from the Internet on Jun. 21, 2016).

ClinicalTrials.gov, "High Dose Therapy and Autologous Stem Cell Transplantation Followed by Infusion of Chimeric Antigen Receptor (CAR) Modified T-Cells Directed Against CD19+ B-Cells for Relapsed and Refractory Aggressive B Cell Non-Hodgkin Lymphoma," available at https://clinicaltrials.gov/show/NCT01840566, NCT01840566 (Retrieved from the Internet on Jun. 21, 2016).

ClinicalTrials.gov, "In Vitro Expanded Allogeneic Epstein-Barr Virus Specific Cytotoxic T-Lymphocytes (EBV-CTLs) Genetically Targeted to the CD19 Antigen in B-cell Malignancies," available at https://clinicaltrials.gov/show/NCT01430390, NCT01430390 (Retrieved from the Internet on Jun. 21, 2016).

ClinicalTrials.gov, "Precursor B Cell Acute Lymphoblastic Leukemia (B-ALL) Treated With Autologous T Cells Genetically Targeted to the B Cell Specific Antigen CD19," available at https://clinicaltrials.gov/show/NCT01044069, NCT01044069 (Retrieved from the Internet on Jun. 21, 2016).

ClinicalTrials.gov, "Study Evaluating the Efficacy and Safety of JCAR015 in Adult B-cell Acute Lymphoblastic Leukemia (B-All) (Rocket)," available at https://clinicaltrials.gov/show/NCT02535364, NCT02535364 (Retrieved from the Internet on Jun. 21, 2016).

ClinicalTrials.gov, "T Cells Expressing a Fully-human AntiCD19 Chimeric Antigen Receptor for Treating B-cell Malignancies," available at https://clinicaltrials.gov/show/NCT02659943, NCT02659943(Retrieved from the Internet on Jun. 21, 2016).

ClinicalTrials.gov, "T-Lymphocytes Genetically Targeted to the B-Cell Specific Antigen CD19 in Pediatric and Young Adult Patients With Relapsed B-Cell Acute Lymphoblastic Leukemia," available at https://clinicaltrials.gov/show/NCT01860937, NCT01860937(Retrieved from the Internet on Jun. 21, 2016).

ClinicalTrials.gov, "Treatment of Relapsed or Chemotherapy Refractory Chronic Lymphocytic Leukemia or Indolent B Cell Lymphoma Using Autologous T Cells Genetically Targeted to the B Cell Specific Antigen CD19", Available at: https://clinicaltrials.gov/show/NCT00466531, NCT00466531(Retrieved from the Internet on Jun. 21, 2016).

Cochran et al., "Receptor clustering and transmembrane signaling in T cells," Trends Biochem Sci., 26(5):304-310, May 2001.

Collins et al., "Donor leukocyte infusions in 140 patients with relapsed malignancy after allogencic bone marrow transplantation," J. Clin. Oncol., Feb. 1997, 15(2): 433-444.

Collins et al., "Donor leukocyte infusions in acute lymphocytic leukemia," Bone Marrow Transplantation, 2000, 26: 511-516.

Cooley, S. et al., "Donor selection for natural killer cell receptor genes leads to superior survival after unrelated transplantation for acute myelogenous leukemia," Blood, 116(14): 2411-2419 (2010).

Cooper et al., "T-Cell Clones can be Rendered Specific for CD19: Toward the Selective Augmentation Of the Graft-Versus-B Lineage Leukemia Effect," Blood, 2003, pp. 1637-1644, vol. 101.

Cooper, M.A. et al., "In vivo evidence for a dependence on interleukin 15 for survival of natural killer cells," *Blood*, 100(10): 3633-3638 (2002).

Cruz et al., "Infusion of donor-derived CD19-redirected virus-specific T cells for B-cell malignancies relapsed after allogeneic stem cell transplant: a phase 1 study," Blood 122(17):2965-2973 (2013).

Curti, A. et al., "Successful transfer of alloreactive haploidentical KIR ligand-mismatched natural killer cells after infusion in elderly high risk acute myeloid leukemia patients," Blood, 118(12): 3273-3279 (2011).

Damle et al., "Differential regulatory signals delivered by antibody binding to the CD28 (Tp44) molecule during the activation of human T lymphocytes," J Immunol., 140(6):1753-1761, Mar. 15, 1988.

(56) References Cited

OTHER PUBLICATIONS

Darcy, P.K., et al., "Expression in cytotoxic T lymphocytes of a single-chain anti-carcinoembryonic antigen antibody. Redirected Fas ligand-mediated lysis of colon carcinoma," Eur. J. Immunol. 28: 1663-1672 (1998).
Davila, M.L., et al., "Efficacy and Toxicity Management of 19-28z CAR T Cell Therapy in B Cell Acute Lymphoblastic Leukemia," Science Translat. Med. 6(24) (2014).
De La Chapelle, A. et al., "Truncated erythropoietin receptor causes dominantly inherited benign human erythrocytosis," Proc Natl Acad Sci USA., vol. 90, No. 10, pp. 4495-4499 (May 1993).
Debenedette et al., "Role of 4-1BB ligand in costimulation of T lymphocyte growth and its upregulation on M12 B lymphomas by cAMP," J Exp Med, Mar. 1995, 181(3): 985-992.
DeBenedette, MA, et al.. "Costimulation of CD28⁻ T Lymphocytes by 4-1 BB Ligand," J. Immunol., 1997, pp. 551-559, vol. 158.
Delahaye, N.F. et al., "Alternatively spliced NKp30 isoforms affect the prognosis of gastrointestinal stromal tumors," *Nat Med.*, 17(6): 700-707 (2011).
Diefenbach et al., "Selective associations with signaling proteins determine stimulatory versus costimulatory activity of NKG2D," Nature Publishing Group, vol. 3, No. 12, pp. 1142-1149, (Dec. 2002).
Dotti et al., "Design and Development of Therapies using Chimeric Antigen Receptor-Expressing T cells," Immunol Rev., 257(1), 35 pages, Jan. 2014.
Doubrovina, et al., "Evasion from NK Cell Immunity by MHC Class I Chain-Related Molecules Expressing Colon Adenocarcinoma," Journal of Immunology, vol. 171, pp. 6889-6899, (2003).
Dubois et al., "IL-15Rα recycles and presents IL-15 In trans to neighboring cells," Immunity, Nov. 2002, 17(5): 537-547.
Dubois, S., et al., "Preassociation of IL-15 with IL-15Rα-IgG1-Fc enhances its activity on proliferation of NK and CD8+/CD44$^{high}$ T cells and its antitumor action," Journal of Immunology, 180(4):2099-2106 (2008).
Dudley, M.E., et al., "Adoptive Transfer of Cloned Melanoma-Reactive T Lymphocytes for the Treatment of Patients with Metastatic Melanoma," J. Immunother. 24: 363-373 (2001).
Ellis et al., "Interactions of CD80 and CD86 with CD28 and CTLA4," J Immunol., 156(8):2700-2709, Apr. 15, 1996.
Eshhar et al., "Specific activation and targeting of cytotoxic lymphocytes through chimeric single chains consisting of antibody-binding domains and the γ or ζ subunits of the immunoglobulin and T-cell receptors," Proc. Natl. Acad. Sci. USA, 1993, 90:720-724.
Eshhar, Z, et al. "Functional Expression of Chimeric Receptor Genes in Human T Cells," J. Immunol. Methods, 2001, 248(1-2):67-76.
Eshhar, Z., "Tumor-specific T-bodies: towards clinical application," Cancer Immunol. Immunother. 45: 131-136 (1997).
Fagan, E.A., and Eddleston, A.L.W.F., "Immunotherapy for cancer: the use of lymphokine activated killer (LAK) cells," Gut 28: 113-116 (1987).
Farag et al., "Natural killer cell receptors: new biology and insights into the Graft-versus-leukemia effect," Blood, 2002, 100(6):1935-1947.
Fehniger TA, et al.; "Ontogeny and expansion of human natural killer cells: clinical implications", Int Rev Immunol. Jun. 2001; 20(3-4):503-534.
Fehniger, T.A., et al., "Interleukin 15: biology and relevance to human disease," Blood, 97(1): 14-32 (2001).
Ferlazzo, G. et al., "Distinct roles of IL-12 and IL-15 in human natural killer cell activation by dendritic cells from secondary lymphoid organs," PNAS, 101(47): 16606-16611 (2004).
Fernandez-Messina et al., "Human NKG2D-ligands: cell biology strategies ensure immune recognition," Frontiers in Immunology, vol. 3, Article 299, 9 Pages, (Sep. 2012).
Ferris, R.L. et al., "Tumor antigen-targeted, monoclonal antibody-based immunotherapy: clinical response, cellular immunity, and immunoescape," *J Clin Oncol*, 28(28): 4390-4399 (2010).

Finney et al., "Activation of resting human primary T cells with chimeric receptors: costimulation from CD28, inducible costimulator, CD134, and CD137 in series with signals from the TCR ζ chain", J Immunol. Jan. 1, 2004; 172(1):104-113.
Finney et al., "Chimeric receptors providing both primary and costimulatory signaling in T cells from a single gene product," J Immunol. Sep. 15, 1998;161(6):2791-2797.
Foon et al., "Clinical and immune responses in advanced melanoma patients immunized with an anti-idiotype antibody mimicking disialoganglioside GD2," J. Clin. Oncol.., 18(2):376-384, Jan. 2000.
Freshney, Animal Cell Culture, Cancer Research Campaign, IRL Press, 1986, 248 pages [Table of Contents Only].
Fujisaki, H. et al., "Expansion of highly cytotoxic human natural killer cells for cancer cell therapy," Cancer Res., 69(9): 4010-4017 (2009).
Fujisaki, H. et al., "Replicative potential of human natural killer cells," Br J Haematol, 145: 606-613 (2009).
Galustian, C. et al., "MP84-07A Tale of Tails—A Novel Approach to Immunotherapy of Prostate Cancer," J Urol, 195(4S): e1092 (May 2016).
Gardner, R., et al., "Acquisition of a CD19 negative myeloid phenotype allows immune escape of MLL-rearranged B-ALL from CD19 CAR-T cell therapy," Blood, vol. 127, No. 20 (May 2016), 2406-2410.
Garrity et al., "The activating NKG2D receptor assembles in the membranc with two signaling dimers into a hexameric structure," PNAS, vol. 102, No. 21, pp. 7641-7646, May 24, 2005.
Geiger and Jyothi, "Development and application for receptor-modified T lymphocytes for adoptive immunotherapy," Transfus Med Rev, Jan. 2001, 15(1): 21-34.
Geiger et al., "Integrated src kinase and costimulatory activity enhances signal transduction through single-chain chimeric receptors in T lymphocytes," Blood. Oct. 15, 2001; 98(8):2364-2371.
GenBank Accession No. NM 007360 GI:315221123, *Homo sapiens* killer cell lectin like receptor K1 (KLRK1), mRNA, dated May 29, 2017, 4 pages.
GenBank Accession No. NM_000734 GI: 37595563, *Homo sapiens* CD3Z antigen, ζ polypeptide (TiT3 complex) (CD3Z), transcript variant 2, mRNA, dated Oct. 27, 2004, 6 pages.
GenBank Accession No. NM_001768 GI: 27886640, *Homo sapiens* CD8 antigen, a polypeptide (p32) (CD8A), transcript variant 1, mRNA, dated Oct. 27, 2004, 5 pages.
GenBank Accession No. NM_011612 GI: 6755830, Mus musculus tumor necrosis factor receptor superfamily, member 9 (Tnfrsf9), mRNA, dated Oct. 26, 2004, 8 pages.
Germain et al., "T-cell signaling: the importance of receptor clustering," Curr Biol., 7(10):R640-R644, Oct. 1, 1997.
Ghobadi, et al., "Updated Phase 1 Results from ZUMA-1: A Phase 1-2 Multicenter Study Evaluating the Safety and Efficacy of KTE-C19 (Anti-CD19 CAR T Cells) in Subjects With Refractory Aggressive Non-Hodgkin Lymphoma," Slides accompanying oral presentation at the American Association for Cancer Research Annual Meeting, New Orleans, Louisiana (2016).
Ghorashian, S., et al., "CD19 chimeric antigen receptor T cell therapy for haematological malignancies," Br. J. Haematol. 169:463-478 (2015).
Giebel, S. et al., "Survival advantage with KIR ligand incompatibility in hematopoietic stem cell transplantation from unrelated donors," *Blood*, 102(3): 814-819 (2003).
Gilfillan et al., "NKG2D recruits two distinct adapters to trigger NK cell activation and costimulation," Nature Publishing Group, Nature Immunology, vol. 3, No. 12, pp. 1150-1155, Dec. 2002.
Gill, S., et al., "Chimeric antigen receptor T cell therapy: 25 years in the making," Blood Rev. 11 pages, (2015).
Ginaldi, L., et al., "Levels of expression of CD19 and CD20 in chronic B cell leukaemias," J. Clin. Pathol. 51: 364-369 (1998).
Giuliani, M. et al., "Generation of a novel regulatory NK cell subset from peripheral blood CD34$^+$ progenitors promoted by membrane-bound IL-15," PLos One, 3(5): e2241 (2008).
Gong et al., "Cancer Patient T Cells Genetically Targeted to Prostate-Specific Membrane Antigen Specifically Lyse Prostate Cancer Cells and Release Cytokines in Response to Prostate-Specific Membrane Antigen," Neoplasia, 1999, 1(2): 123-127.

(56) References Cited

OTHER PUBLICATIONS

Goodier and Londei, "CD28 is not directly involved in the response of human CD3⁻ CD56⁺ natural killer cells to lipopolysaccharide: a role for T cells," Immunology, Apr. 2004, 111(4): 384-390.
Goodwin et al., "Molecular cloning of a ligand for the inducible T cell gene 4-1BB: a member of an emerging family of cytokines with homology to tumor necrosis factor", Eur J Immunol. Oct. 1993; 23(10):2631-2641.
Grauer et al., "Identification, Purification, and Subcellular Localization of Prostate-specific Membrane Antigen PSM' Protein in the LNCaP Prostatic Carcinoma Cell Line," Cancer Res., 58: 4787-4789 (1998).
Greene et al., "Covalent dimerization of CD28/CTLA-4 and oligomerization of CD80/CD86 regulate T cell costimulatory interactions," J Biol Chem., 271(43):26762-26771, Oct. 25, 1996.
Greenfield, E.A., et al., "CD28/B7 Costimulation: A Review," Crit. Rev. Immunol. 18: 389-418 (1998).
Greenwald et al., "The B7 Family Revisited," Annu. Rev. Immunol., 2005, 23: 515-548.
Grillo-López, A., "Rituximab: An Insider's Historical Perspective," Seminars in Oncology 27(6 Suppl 12): 9-16 (2012).
Gross et al., "Endowing T cells with antibody specificity using chimeric T cell receptors," FASEB J. Dec. 1992;6(15):3370-3378.
Grupp et al., "Chimeric antigen receptor-modified T cells for acute lymphoid leukemia," N Engl J Med. Apr. 18, 2013; 368 (16):1509-1518.
Handgretinger, R., et al., "A phase I study of neuroblastoma with the anti-ganglioside GD2 antibody 14.G2a," Cancer Immunol. Immunother. 35: 199-204 (1992).
Hara et al., "NKG2D gene polymorphisms are associated with disease control of chronic myeloid leukemia by dasatinib," Int. J. Hematol., 9 pages, Aug. 9, 2017.
Harada H, et al., "Selective expansion of human natural killer cells from peripheral blood mononuclear cells by the cell line, HFWT", Jpn J Cancer Res. Mar. 2002; 93(3):313-319.
Harada H, et al.; "A Wilms tumor cell line, HFWT, can greatly stimulate proliferation of CD56⁺ human natural killer cells and their novel precursors in blood mononuclear cells", Exp Hematol. Jul. 2004; 32(7):614-621.
Harding et al., "CD28-mediated signalling co-stimulates murine T cells and prevents induction of anergy in T-cell clones," Nature, 356(6370):607-609, Apr. 16, 1992.
Harmon et al., "Dexamethasone induces irreversible G1 arrest and death of a human lymphoid cell line," J Cell Physiol, Feb. 1979, 98(2): 267-278.
Haynes NM, et al., "Rejection of syngeneic colon carcinoma by CTLs expressing single-chain antibody receptors codelivering CD28 costimulation", J Immunol., Nov. 15, 2002; 169(10):5780-5786.
Haynes NM, et al., "Single-chain antigen recognition receptors that costimulate potent rejection of established experimental tumors", Blood, Nov. 1, 2002; 100(9):3155-3163.
Haynes, N.M., et al., "Redirecting Mouse CTL Against Colon Carcinoma: Superior Signaling Efficacy of Single-Chain Variable Domain Chimeras Containing TCR-$\zeta$ vs FcεRI-$\gamma$," J. Immunol. 166: 182-187 (2001).
Heuser, C., et al., "T-cell activation by recombinant immunoreceptors: Impact of the intracellular signalling domain on the stability of receptor expression and antigen-specific activation of grafted T cells," Gene Therapy 10: 1408-1419 (2003).
Hoffmann, S.C. et al. "2B4 Engagement Mediates Rapid LFA-1 and Actin-Dependent NK Cell Adhesion to Tumor Cells as Measured by Single Cell Force Spectroscopy," J. Immunol, 186(5): 2757-2764 (Jan. 2011).
Hollyman, D., et al., "Manufacturing Validation of Biologically Functional T Cells Targeted to CD19 Antigen for Autologous Adoptive T cell Therapy," J. Immunother. 32: 169-180 (2009).
Hombach, et al., "Tumor-specific T cell activation by recombinant immunoreceptors: CD3 $\zeta$ signaling and CD28 costimulation are simultaneously required for efficient IL-2 secretion and can be integrated into one combined CD28/CD3 $\zeta$ signaling receptor molecule", J Immunol., Dec. 1, 2001; 167(11):6123-6131.
Hombach et al., "T-Cell Activation by Recombinant Receptors: CD28 Costimulation Is Required for Interleukin 2 Secretion and Receptor-mediated T-Cell Proliferation but Does Not Affect Receptor-mediated Target Cell Lysis," Cancer Res., Mar. 1, 2001, 61:1976-1982.
Hombach et al., "The recombinant T cell receptor strategy: insights into structure and function of recombinant immunoreceptors on the way towards an optimal receptor design for cellular immunotherapy," Curr Gene Ther. 2002 2(2):211-226.
Hombach, A., et al., "Adoptive immunotherapy with genetically engineered T cells: modification of the IgG1 Fc 'spacer' domain in the extracellular moiety of chimeric antigen receptors avoids 'off-target' activation and unintended initiation of an innate immune response," Gene Therapy 17: 1206-1213 (2010).
Hombach, A., et al., "T cell activation by recombinant FcεRI $\gamma$-chain immune receptors: an extracellular spacer domain impairs antigen-dependent T cell activation but not antigen recognition," Gene Therapy 7: 1067-1075 (2000).
Horng et al., "NKG2D signaling is coupled to the interleukin 15 receptor signaling pathway," Nature Immunology, vol. 8, No. 12, pp. 1345-1352, Dec. 2007.
Hsu, C. et al., "Cytokine-independent growth and clonal expansion of a primary human CD8⁺ T-cell clone following retroviral transduction with the IL-15 gene," Blood, 109(12): 5168-5177 (2007).
Hsu, K.C. et al., "Improved outcome in HLA-identical sibling hematopoietic stem-cell transplantation for acute myelogenous leukemia predicted by KIR and HLA genotypes," Blood, 105(12): 4878-4884 (2005).
Huang Q.S. et al, "Expansion of human natural killer cells ex vivo," Chine J Cell Mol. Immunol., Dec. 31, 2008, vol. 24, No. 12, pp. 1167-1170.
Hurtado et al., "Potential role of 4-1BB in T cell activation. Comparison with the costimulatory molecule CD28," J Immunol., Oct. 1995, 155(7): 3360-3367.
Imai C et al. "Genetic modification of primary natural killer cells overcomes inhibitory signals and induces specific killing of leukemic cells," Blood. 2005; 106:376-383.
Imai C, et al., "Chimeric receptors with 4-1BB signaling capacity provoke potent cytotoxicity against acute lymphoblastic leukemia", Leukemia., Feb. 12, 2004; 18(4):676-684.
Imai C, et al., "T-cell immunotherapy for B-lineage acute lymphoblastic leukemia using chimeric antigen receptors that deliver 4-1 BB-mediated costimulatory signals", Blood. Nov. 16, 2003; 102(11):66a-67a. (Abstract #223).
Imai et al. "Genetic Modification of T cells for cancer therapy," Journal of Biological Regulators and Homeostatic Agents, 18 (1): 62-71; Jan. 2004.
Imai, C., et al; "A novel method for propagating primary natural killer (NK) cells allows highly Efficient expression of anti-CD19 chimeric receptors and generation of powerful cytotoxicity Against NK-resistant acute lymphoblastic leukemia cells." Abstract# 306 Blood 104 (Nov. 16, 2004).
Imamura, M. et al., "Autonomous growth and increased cytotoxicity of natural killer cells expressing membrane-bound interleukin-15," *Blood*, 124(7): 1081-1088 (Jul. 8, 2014).
Inaguma et al., "Expression of neural cell adhesion molecule L1 (CD171) in neuroectodermal and other tumors. An immunohistochemical study of 5155 tumors and critical evaluation of CD171 prognostic value in gastrointestinal stromal tumors," Oncotarge., 7(34):55276-55289, Jul. 11, 2016.
Ishii, H. et al., "Monocytes enhance cell proliferation and LMP1 expression of nasal natural killer/T-cell lymphoma cells by cell contact-dependent interaction through membrane-bound IL-15," International Journal of Cancer, 130: 48-58 (2012).
Ishiwata I, et al., "Carcinoembryonic proteins produced by Wilms' tumor cells in vitro and in vivo", Exp Pathol. 1991; 41(1):1-9.
Israeli, R.S., et al., "Expression of the Prostate-specific Membrane Antigen," Cancer Res., 1994, 54:1807-1811.
Ito et al., "Hyperdiploid acute lymphoblastic leukemia with 51 to 65 chromosomes: a distinct biological entity with a marked propensity to undergo apoptosis," Blood, Jan. 1999, 93(1): 315-320.

(56) References Cited

OTHER PUBLICATIONS

Jena et al., "Redirecting T-cell specificity by introducing a tumor-specific chimeric antigen receptor," Blood, 2010, 116(7): 1035-1044.
Jenkins et al., "Inhibition of antigen-specific proliferation of type 1 murine T cell clones after stimulation with immobilized anti-CD3 monoclonal antibody," J Immunol., 144(1):16-22, Jan. 1, 1990.
Jensen, M., et al., "CD20 is a molecular target for scFvFc:ζ receptor redirected T cells: implications for cellular immunotherapy of CD20⁻ malignancy," Biol. Blood and Marrow Transplantation 4: 75-83 (1998).
Jensen, M.C., et al., "Anti-transgene Rejection Responses Contribute to Attenuated Persistence of Adoptively Transferred CD20/CD19-Specific Chimeric Antigen Receptor Redirected T Cells in Humans," Biol. Blood Marrow Transplant 16: 1245-1256 (2010).
Jiang et al., "Functional characterization of interleukin-15 gene transduction into the human natural killer cell line NKL," Cytother. 10(3):265-274, 2008.
Jiang, W. et al., "hIL-15 gene-modified human natural killer cells (NKL-IL15) augments the anti-human hepatocellular carcinoma effect in vivo," Immunobiology, 219: 547-553 (Mar. 12, 2014).
Johnson and Jenkins, "The role of anergy in peripheral T cell unresponsiveness," Life Sci, 1994, 55(23): 1767-1780.
June et al., "The B7 and CD28 receptor families," Immunol Today, Jul. 1994, 15(7): 321-331.
Kabalak et al., "Association of an NKG2D gene variant with systemic lupus erythematosus in two populations," Human Immunology, vol. 71, pp. 74-78, 2010.
Kaiser, B.K. et al., "Structural basis for NKG2A/CD94 Recognition of HLA-E," Proc Nat'l Acad Sci USA, 105(18): 6696-6701 (Apr. 2008).
Kalos et al., "T Cells with Chimeric Antigen Receptors Have Potent Antitumor Effects and Can Establish Memory in Patients with Advanced Leukemia," Sci Transl Med. Aug. 10, 2011;3(95):95ra73.
Kariv, I., et al., "Analysis of the Site of Interaction of CD28 with Its Counter-Receptors CD80 and CD86 and Correlation with Function," J. of Immunol. 157: 29-38 (1996).
Kershaw, M.H., et al., "A Phase I Study on Adoptive Immunotherapy Using Gene-Modified T Cells for Ovarian Cancer," Clin. Cancer Res. 12: 6106-6115 (2006).
Khammari, A., et al., "Long-term follow-up of patients treated by adoptive transfer of melanoma tumor-infiltrating lymphocytes as adjuvant therapy for stage III melanoma," Cancer Immunol. Immunother. 56: 1853-1860 (2007).
Kim Y J, et al., "Human 4-1 BB regulates CD28 co-stimulation to promote Th1 cell responses. Eur J. Immunol", Mar. 1998; 28(3): 881-890.
Kim Y J, et al., "Novel T cell antigen 4-1 BB associates with the protein tyrosine kinase p56lck1," J Immunol. Aug. 1, 1993; 151(3):1255-1262.
Kitaya, K. et al., "IL-15 expression at human endometrium and decidua," Biology of Reproduction, 63(3): 683-687 (2000).
Kitaya, K., et al., "Regulatory role of membrane-bound form interleukin-15 on human uterine microvascular endothelial cells in circulating CD16(-) natural killer cell extravasation into human endometrium," Biology of Reproduction, 89(3): 70, 1-7, (2013).
Klein E, et al., "Properties of the K562 cell line, derived from a patient with chronic myeloid leukemia," Int J Cancer. Oct. 15, 1976; 18(4 ):421-431.
Klingemann HG, et al., "Ex vivo expansion of natural killer cells for clinical applications," Cytotherapy. 2004; 6(1): 15-22.
Kobayashi et al., "Role of trans-cellular IL-15 presentation in the activation of NK cell-mediated killing, which leads to enhanced tumor immunosurveillance," Blood, Jan. 2005, 105(2): 721-727.
Kochenderfer, J.N. et al. "Construction and Pre-clinical Evaluation of an Anti-CD19 Chimeric Antigen Receptor," J. Immunother. 32(7):689-702 (2009).
Kochenderfer, J.N. et al. "Chemotherapy-Refractory Diffuse Large B-Cell Lymphoma and Indolent B-Cell Malignancies Can be Effectively Treated With Autologous T Cells Expressing an Anti-CD19 Chimeric Antigen Receptor," J. Clin. Oncol. 33:540-549 (2014).
Kochenderfer, J.N., et al. "Donor-derived CD19-targeted T cells cause regression of malignancy persisting after allogeneic hematopoietic stem cell transplantation," Blood 122(25): 4129-4139 (2013).
Kochenderfer, J.N., et al., "B-cell depletion and remissions of malignancy along with cytokine-associated toxicity in a clinical trial of anti-CD19 chimeric-antigen-receptor-transduced T cells," Blood 119(12):2709-2720 (2012).
Kochenderfer, J.N., et al., "Eradication of B-lineage cells and regression of lymphoma in a patient treated with autologous T cells genetically-engineered to recognize CD19," Blood 116(20):4099-4102 (2010).
Koeffler and Golde, "Acute myelogenous leukemia: a human cell line responsive to colony-stimulating activity," Science, Jun. 1978, 200(4337): 1153-1154.
Koehler et al. "Engineered T Cells for the Adoptive Therapy of B-Cell Chronic Lymphocytic Leukaemia," Advances in Hematology, vol. 2012, Article ID 595060, 13 pages; doi:10.1155/2012/595060 (2012).
Kohn et al., "CARs on track in the clinic," Mol Ther. Mar. 2011; 19(3):432-438.
Koka, R. et al., "Cutting edge: murine dendritic cells require IL-15R α to prime NK cells," J Immunol., 173(6): 3594-3598 (2004).
Kolb HJ, et al., "Graft-Versus-Leukemia Effect of Donor Lymphocyte Transfusions in Marrow Grafted Patients," Blood, 1995, 86(5):2041-2050.
Kowolik, C.M., "CD28 Costimulation Provided through a CD19-Specific Chimeric Antigen Receptor Enhances In vivo Persistence and Antitumor Efficacy of Adoptively Transferred T Cells," Cancer Research 66(22): 10995-11004 (2006).
Krampera et al., "Bone marrow mesenchymal stem cells inhibit the response of naïve and memory antigen-specific T cells to their cognate peptide," Blood, May 2003, 101(9): 3722-3729.
Krause et al., "Antigen-dependent CD28 Signaling Selectively Enhances Survival and Proliferation in Genetically Modified Activated Human Primary T Lymphocytes," J. Exp. Med., 1998, 188(4): 619-626.
Krug, C., et al., "Stability and activity of MCSP-specific chimeric antigen receptors (CARs) depend on the scFv antigen-binding domain and the protein backbone," Cancer Immunol. Immunother. 64:1623-1635 (2015).
Kuo et al., "Efficient gene transfer into primary murine lymphocytes obviating the need for drug selection," Blood, Aug. 1993, 82(3): 845-852.
Kurokawa, M., et al., "Caspases and kinases in a death grip," Cell, 138(5): 838-854 (2009).
Kwon, BS, et al., "cDNA sequences of two inducible T-cell genes", Proc Natl Acad Sci U SA. Mar. 1989; 86(6):1963-1967.
LaBonte, M.L. et al., "Molecular Determinants Regulating the Pairing of NKG2 Molecules with CD94 for Cell Surface Heterodimer Expression," J Immunol, 172(11): 6902-6912 (May 2004).
Lafreniere, R., et al.., "Successful Immunotherapy of Murine Experimental Hepatic Metastases with Lymphokine-activated Killer Cells and Recombinant Interleukin 2," Cancer Res. 45: 3735-3741 (1985).
Lamers, C.H.J., et al., "Treatment of Metastatic Renal Cell Carcinoma With Autologous T-Lymphocytes Genetically Retargeted Against Carbonic Anhydrase IX: First Clinical Experience," J. Clin. Oncol. vol. 24, No. 13: e20-e22 (May 1, 2006).
Lang et al., "Absence of B7.1-CD28/CTLA-4-mediated co-stimulation in human NK cells," Eur. J. Immunol, Mar. 1998, 28: 780-786.
Langer et al., "Comparative Evaluation of Peripheral Blood T Cells and Resultant Engineered Anti-CD19 CAR T-Cell Products From Patients With Relapsed/Refractory Non-Hodgkin Lymphoma (NHL)," Abstract 2305, Proceedings: AACR 107th Annual Meeting 2016; Apr. 16-20, 2016, New Orleans, Louisiana.
Lanzavecchia et al., "Antigen decoding by T lymphocytes: from synapses to fate determination," Nat Immunol., vol. 2, No. 6:487-492, Jun. 2001.
Lapteva, N. et al., "Large-scale ex vivo expansion and characterization of natural killer cells for clinical applications," Cytotherapy, 14(9): 1131-1143 (2012).

(56) References Cited

OTHER PUBLICATIONS

Le Blanc et al., "Mesenchymal stem cells inhibit and stimulate mixed lymphocyte cultures and mitogenic responses independently of the major histocompatability complex," Scand J Immunol, Jan. 2003, 57(1): 11-20.
Lee, D.W., et al., "T cells expressing CD19 chimeric antigen receptors for acute lymphoblastic leukaemia in children and young adults: a phase 1 dose-escalation trial," Lancet 385:517-528 (2015).
Lehner et al., "Redirecting T Cells to Ewing's Sarcoma Family of Tumors by a Chimeric NKG2D Receptor Expressed by Lentiviral Transduction of MRNA Transfection," PLoS One, vol. 7, Issue 2; e31210, Feb. 2012.
Leung, W. et al., "Determinants of antileukemia effects of allogeneic NK cells," J Immunol., 172(1): 644-650 (2004).
Li et al., "Costimulation by CD48 and B7-1 induces immunity against poorly immunogenic tumors," J Exp Med, Feb. 1996, 183(2): 639-644.
Li et al., "Polarization Effects of 4-1BB during CD28 Costimulation in Generating Tumor-reactive T Cells for Cancer Immunotherapy," Cancer Research, vol. 63, pp. 2546-2552, May 15, 2003.
Li, Q., et al., "Bifacial effects of engineering tumour cell-derived exosomes on human natural killer cells" Experimental Cell Research, Dec. 19, 2017, vol. 363, No. 2, pp. 141-150.
Liao, W., et al., "Interleukin-2 at the crossroads of effector responses, tolerance, and immunotherapy," Immunity, 38(1): 13-25 (2013).
Liebowitz et al., "Costimulatory approaches to adoptive immunotherapy," Curr Opin Oncol, Nov. 1998, 10(6): 533-541.
Linsley et al., "The role of CD28 receptor during T cell responses to antigen," Annu. Rev. Immunol., 1993, 191-212.
Liu, H., et al., "Monoclonal Antibodies to the Extracellular Domain of Prostate-specific Membrane Antigen Also React with Tumor Vascular Endothelium," Cancer Res. 57: 3629-3634 (1997).
Liu, L, et al. "Novel CD4-Based Bispecific Chimeric Antigen Receptor Designed for Enhanced Anti-HIV Potency and Absence of HIV Entry Receptor Activity," J. Virol. 89(13):6685-6694 (2015).
Lode et al., "Targeted cytokines for cancer immunotherapy," Immunol Res., 21(2-3):279-288, (2000).
López-Requena et al., "Gangliosides, Ab1 and Ab2 antibodies III. The idiotype of anti-ganglioside mAb P3 is immunogenic in a T cell-dependent manner," Mol Immunol., 2007, 44(11):2915-2922.
López-Requena et al., "Gangliosides, Ab1 and Ab2 antibodies IV. Dominance of VH domain in the induction of anti-idiotypic antibodies by Jene gun immunization," Mol Immunol. Apr. 2007;44(11):3070-3075. Epub Mar. 2, 2007.
Lozzio CB, et al., "Human chronic myelogenous leukemia cell-line with positive Philadelphia chromosome", Blood. Mar. 1975; 45(3):321-334.
Lozzio et al., "Properties and Usefulness of the Original K-562 Human Myelogenous Leukemia Cell Line," Leukemia Research, vol. 3, No. 6, pp. 363-370, 1979.
Lugli, E. et al., "Transient and persistent effects of IL-15 on lymphocyte homeostasis in nonhuman primates," Blood, 116(17): 3238-3248 (2010).
Ma et al., "Chapter 15: Genetically engineered T cells as adoptive immunotherapy of cancer," Cancer Chemotherapy and Biological Response Modifiers Annual 20, Ch. 15, 315-341, Giaccone et al. (Eds.), Elsevier, 2002.
Maher J., et al., "Human T-lymphocyte cytotoxicity and proliferation directed by a single chimeric Tcrζ /CD28 receptor", Nat Biotechnol. Jan. 2002; 20(1):70-75.
Maloney, D.G., "Newer Treatments for Non-Hodgkin's Lymphoma: Monoclonal Antibodies," Oncology 12(10): 63-76 (1998).
Manabe et al., "Interleukin-4 induces programmed cell death (apoptosis) in cases of high-risk acute lymphoblastic leukemia," Blood, Apr. 1994, 83(7): 1731-1737.
Mann et al., "Construction of a retrovirus packaging mutant and its use to produce helper-free defective retrovirus," Cell, May 1983, 33(1): 153-159.
Manzke et al., "Immunotherapeutic strategies in neuroblastoma: antitumoral activity of deglycosylated Ricin A conjugated anti-GD2 antibodies and anti-CD3xanti-GD2 bispecific antibodies," Med Pediatr Oncol., 36(1):185-189, Jan. 2001.
Manzke et al., "Locoregional treatment of low-grade B-cell lymphoma with CD3xCD19 bispecific antibodies and CD28 costimulation. I. Clinical phase I evaluation," Int J Cancer., 91(4):508-515, Feb. 15, 2001.
Manzke et al., "Locoregional treatment of low-grade B-cell lymphoma with CD3xCD19 bispecific antibodies and CD28 costimulation. II. Assessment of cellular immune responses," Int J Cancer., 91(4):516-522, Feb. 15, 2001.
Marincola, F.M., et al., "Escape of Human Solid Tumors from T-Cell Recognition: Molecular Mechanisms and Functional Significance," Adv. Immunol. 74: 181-273 (2000).
Markowitz et al., "A safe packaging line for gene transfer: separating viral genes on two different plasmids," J Virol, Apr. 1988, 62(4): 1120-1124.
Marktel et al., "Immunologic potential of donor lymphocytes expressing a suicide gene for early immune reconstitution after hematopoietic T-cell-depleted stem cell transplantation," Blood, Feb. 2003, 101(4): 1290-1298.
Martinet O., et al., T cell activation with systemic agonistic antibody versus local 4-1 BB ligand gene delivery combined with interleukin-12 eradicate liver metastases of breast cancer, Gene Ther. Jun. 2002; 9(12):786-792.
Martinez, E., et al., "Cutting Edge: NKG2D-Dependent Cytotoxicity Is Controlled by Ligand Distribution in the Target Cell Membrane", The Journal of Immunology, 2011, 186:5538-5542.
Maude et al., "Chimeric antigen receptor T cells for sustained remissions in leukemia," N Engl J Med., 371(16):1507-1517, Oct. 16, 2014.
Maus MV, et al., "Ex vivo expansion of polyclonal and antigen-specific cytotoxic T lymphocytes by artificial APCs expressing ligands for the T-cell receptor, CD28 and 4-1BB", Nat Biotechnol. Feb. 2002; 20(2): 143-148.
May KF, JR, et al., "Anti-4-1 BB monoclonal antibody enhances rejection of large tumor burden by promoting survival but not clonal expansion of tumor-specific CDS+ T cells," Cancer Res. 2002, 62(12):3459-3465.
McLaughlin et al., "Adoptive T-cell therapies for refractory/relapsed leukemia and lymphoma: current strategies and recent advances," Ther Adv Hematol., 6(6):295-307, Dec. 2015.
Melero I, et al., "Amplification of tumor immunity by gene transfer of the co-stimulatory 4-1 BB ligand: synergy with the CD28 co-stimulatory pathway," Eur J Immunol., 1998, 28(3):1116-1121.
Melero I, et al., "NK1.1 cells express 4-1BB (CDw137) costimulatory molecule and are required for tumor immunity elicited by anti-4-1 BB monoclonal antibodies," Cell Immunol., 1998, 190(2):167-172.
Melero, I. et al., "Monoclonal antibodies against the 4-1BB T-cell activation molecule eradicate established tumors," Nature Med., 1997, 3:682-685.
Mihara et al., "Development and functional characterization of human bone marrow mesenchymal cells immortalized by enforced expression of telomerase," Br J Haematol, Mar. 2003, 120(5):846-849.
Miller et al., "Role of monocytes in the expansion of human activated natural killer cells," Blood, Nov. 1992, 80(9): 2221-2229.
Miller et al., "Successful adoptive transfer and in vivo expansion of human haploidentical NK cells in patients with cancer," Blood, Apr. 2005, 105(8): 3051-3057.
Miller, J.S., "Therapeutic applications: natural killer cells in the clinic," *Hematology Am Soc Hematol Educ Program* 2013: 247-253 (2013).
Milone MC, et al., "Chimeric receptors containing CD137 signal transduction domains mediate enhanced survival of T cells and increased antileukemic efficacy in vivo", Mol Ther. Apr. 21, 2009; 17(8): 1453-1464.
Minamoto, S. et al., "Acquired Erythropoietin Responsiveness of Interleukin-2-dependent T lymphocytes Retrovirally Transduced with Genes Encoding Chimeric Erythropoietin/Interleukin-2 Receptors," Blood, vol. 86, No. 6, pp. 2281-2287 (1995).

(56) References Cited

OTHER PUBLICATIONS

Mishra, A. et al., "Aberrant overexpression of IL-15 initiates large granular lymphocyte leukemia through chromosomal instability and DNA hypermethylation," *Cancer Cell*, 22(5): 645-655 (2012).

Mogi et al., "Tumour rejection by gene transfer of 4-1BB ligand and into a CD80(+) murine squamous cell carcinoma and the requirements of co-stimulatory molecules on tumour and host cells," Immunology, Dec. 2000, 101(4): 541-547.

Mohammed, S. et al., "Improving Chimeric Antigen Receptor-Modified T Cell Function by Reversing the Immunosuppressive Tumor Microenvironment of Pancreatic Cancer," Mol. Ther. 4, vol. 25, No. 1, pp. 249-258 (2017).

Mondino et al., "Surface proteins involved in T cell costimulation," J Leukoc Biol, Jun. 1994, 55(6): 805-815.

Mora, "Dinutuximab for the treatment of pediatric patients with high-risk neuroblastoma," Expert Rev Clin Pharmacol., 9(5):647-653, Epub Mar. 21, 2016.

Morandi, B. et al., "NK cells provide helper signal for CD8+ T cells by inducing the expression of membrane-bound IL-15 on DCs," International Immunology, 21(5): 599-606 (2009).

Moretta L, et al., "Unravelling natural killer cell function: triggering and inhibitory human NK receptors," EMBO J., 2004, 23(2):255-259.

Moritz et al., "A spacer region between the single chain antibody- and the CD3 ω-chain domain of chimeric T cell receptor components is required for efficient ligand binding and signaling activity," Gene Ther. Oct. 1995; 2(8):539-546.

Moritz, D., et al., "Cytotoxic T lymphocytes with a grafted recognition specificity for ERBB2-expressing tumor cells," Proc. Natl. Acad. Sci. USA 91:4318-4322 (1994).

Mortier, E., et al., "IL-15Rα chaperones IL-15 to stable dendritic cell membrane complexes that activate NK cells via trans presentation," *The Journal of Experimental Medicine*, 205(5): 1213-1225 (2008).

Musso, T. et al., "Human monocytes constitutively express membrane-bound, biologically active, and interferon-γ-upregulated interleukin-15," *Blood*, 93(10): 3531-3539 (1999).

Nadler et al., "B4, a human B lymphocyte-associated antigen expressed on normal, mitogen-activated, and malignant B lymphocytes," J Immunol, Jul. 1983, 131(1): 244-250.

Nagashima et al., "Stable transduction of the interleukin-2 gene into human natural killer cell lines and their phenotypic and functional characterization in vitro and in vivo," Blood, May 1998, 91(10): 3850-3861.

Nakamura et al., "Chimeric anti-ganglioside $G_{M2}$ antibody with antitumor activity," Cancer Res. Mar. 15, 1994; 54(6):1511-1516.

Naume et al., "A comparative study of IL-12 (cytotoxic lymphocyte maturation factor)-, IL-2-, and IL-7-induced effects on immunomagnetically purified CD56+ NK cells," J Immunol, Apr. 1992, 148(8): 2429-2436.

Neepalu et al., "Phase 1 Biomarker Analysis of the ZUMA-1 Study: A Phase 1-2 Multi-Center Study Evaluating the Safety and Efficacy of Anti-CD19 Car T Cells (KTE-C19) in Subjects with Refractory Aggressive Non-Hodgkin Lymphoma," Poster session presented at the American Society of Hematology Annual Meeting, Orlando, Florida (Dec. 5-8, 2015).

Negrini, S. et al., "Membrane-bound IL-15 stimulation of peripheral blood natural killer progenitors leads to the generation of an adherent subset co-expressing dendritic cells and natural killer functional markers," *Haematologica*, 96(5): 762-766 (2011).

Nicholson et al., "Construction and characterisation of a functional CD19 specific single chain Fv fragment for immunotherapy of B lineage leukaemia and lymphoma," Mol Immunol., 34(16-17):1157-1165, Nov.-Dec. 1997.

Nishigaki et al., "Prevalence and growth characteristics of malignant stem cells in B-lineage acute lymphoblastic leukaemia," Blood, May 1997, 89(10): 3735-3744.

Nunès et al., "The role of $p21^{ras}$ in CD28 signal transduction: triggering of CD28 with antibodies, but not the ligand B7-1, activates $p21^{ras}$," J Exp Med., 180(3):1067-1076, Sep. 1, 1994.

Oelke, M. et al., "Ex vivo induction and expansion of antigen-specific cytotoxic T cells by HLA-Ig-coated artificial antigen-presenting cells," Nat Med., 2003, 9(5):619-624.

Olsen, S.K. et al., "Crystal structure of the interleukin-15 interleukin-15 receptor α complex Insights into trans and cis presentation," The Journal of Biological Chemistry, 282(51): 37191-37204 (2007).

Ozkaynak, M.F. et al., "Phase I Study of Chimeric Human/Murine Anti-Ganglioside $G_{D2}$ Monoclonal Antibody (ch14.18) With Granulocyte-Macrophage Colony-Stimulating Factor in Children With Neuroblastoma Immediately After Hematopoietic Stem-Cell Transplantation: A Children's Cancer Group Study," J. Clinical Oncol. 18: 4077-4085 (2000).

Pan et al., "Regulation of dendritic cell function by NK cells: mechanisms underlying the synergism in the combination therapy of IL-12 and 4-1BB activation," J Immunol, Apr. 2004, 172(8): 4779-4789.

Park, J.H., et al., "Are All Chimeric Antigen Receptors Created Equal?" J. Clin. Oncol. 33: 651-653 (2015).

Park, J.H., et al., "CD19-Targeted 19-28z CAR Modified Autologous T Cells Induce High Rates of Complete Remission and Durable Responses in Adult Patients with Relapsed, Refractory B-Cell ALL," Abstract presented at the American Society of Hematology Annual Meeting, San Francisco, California, available at https://ash.confex.com/ash/2014/webprogram/Paper76573.html (Dec. 6-9, 2014).

Park, J.H., et al., Abstract, "682 Implications of Minimal Residual Disease Negative Complete Remission (MRD-CR) and Allogeneic Stem Cell Transplant on Safety and Clinical Outcome of CD19-Targeted 19-28z CAR Modified T cells in Adult Patients with Relapsed, Refractory B-Cell ALL," Am. Soc'y Hematol., available at https://ash.confex.com/ash/2015/webprogram/Paper86688.html (Dec. 5-8, 2015).

Park, Y.P., et al., "Complex Regulation of Human NKG2D-DAP10 Cell Surface Expression: Opposing Roles of the γc Cytokines and TGF-β1", Blood, Sep. 15, 2011, vol. 118, No. 11, pp. 3019-3027.

Parkhurst, M.R. et al., "Adoptive transfer of autologous natural killer cells leads to high levels of circulating natural killer cells but does not mediate tumor regression," Clin Cancer Res., 17(19): 6287-6297 (2011).

Patel, S.D., et al., "Impact of chimeric immune receptor extracellular protein domains on T cell function," Gene Therapy 6: 412-419 (1999).

Paul, W.E., Fundamental Immunology, Third Edition, Chs. 1, 13 and 32 (pp. 1-20, 467-504, and 1143-1178), Raven Press, New York (1993).

Peach, R.J., et al., "Complementarity Determining Region 1 (CDR1)- and CDR3-analogous Regions in CTLA-4 and CD28 Determine the Binding to B7-1," J. Exp. Med. 180: 2049-2058 (1994).

Perussia et al., "Preferential proliferation of natural killer cells among peripheral blood mononuclear cells cocultured with B lymphoblastoid cell lines," Nat Immun Cell Growth Regul, 1987, 6(4): 171-188.

Pollok et al., "Regulation of 4-1BB expression by cell-cell interactions and the cytokines, interleukin-2 and interleukin-4*," Eur J Immunol, Feb. 1995, 25(2): 488-494.

Pollok KE, et al., "Inducible T cell antigen 4-1 BB Analysis of expression and function," J Immunol., 1993, 150(3):771-781.

Porter et al., "The graft-versus-leukemia of allogencic cell therapy," Annu Rev Med, 1999, 50: 369-386.

Porter DL et al., "Chimeric Antigen Receptor-Modified T Cells in Chronic Lymphoid Leukemia," N. Eng. J. Med. Aug. 25, 2011; 365(8):725-733.

Porter et al., "Induction of graft-versus-host disease as immunotherapy for relapsed chronic myeloid leukemia," N Engl J Med, Jan. 1994, 330(2): 100-106.

Pui et al., "Childhood acute lymphoblastic leukaemia—current status and future perspectives," Lancet Oncol, Oct. 2001, 2(10): 597-607.

Pule et al. "Virus-specific T cells engineered to coexpress tumor-specific receptors: persistence and antitumor activity in individuals with neuroblastoma," Nature Med., 2008, 14(11):1264-1270.

Qi L. et al., "Multiple effects of IL-21 on the ex vivo expansion of human primary NK cells," Immunology, Nov. 28, 2014, vol. 143, No. S2, p. 62-176, Poster Abstract 708.

(56) References Cited

OTHER PUBLICATIONS

Qian, L. et al., "Construction of a plasmid for co-expression of mouse membrane-bound form of IL-15 and RAE-1ε and its biological activity," Plasmid, 65(3): 239-245 (2011).
Rajagopalan et al., Found: a cellular activating ligand for N Kp44, Blood, 122(17):2921-2922, Oct. 2013.
Ramos et al., "Chimeric antigen receptor (CAR)-engineered lymphocytes for cancer therapy," Expert Opin Biol Ther., 2011, 11(7):855-873.
Ramos, C.A., et al., "CD19-CAR Trials," The Cancer J. 20: 112-118 (2014).
Riddell, S.R., et al., "T-Cell Therapy of Leukemia," Cancer Control 9: 114-122 (2002).
Riley et al., "The CD28 family: a T-cell rheostat for therapeutic control of T-cell activation," Blood, 2005, 105:13-21.
Roberts et al., "Antigen-specific cytolysis by neutrophils and NK cells expressing chimeric immune receptors bearing ζ or γ signaling domains," J Immunol, Jul. 1998, 161(1): 375-384.
Robertson MJ, et al.; "Costimulation of human natural killer cell proliferation: role of accessory cytokines and cell contact-dependent signals", Nat Immun. 1996-1997; 15(5):213-226.
Rooney et al., "Use of gene-modified virus-specific T lymphocytes to control Epstein-Barr-virus-related lymphoproliferation," Lancet, Jan. 1995, 345(8941): 9-13.
Rosenberg et al., "Special Report: Use of tumor-infiltrating lymphocytes and interleukin-2 in the immunotherapy of patients with metastatic melanoma," N. Engl. J. Med., 1988, 319:1676-1680.
Rosenberg, S.A., et al., "Adoptive cell therapy for the treatment of patients with metastatic melanoma," Curr. Opin. Immunol. 21: 233-240 (2009).
Rosenfeld et al., "Phenotypic characterization of a unique non-T, non-B acute lymphoblastic leukaemia cell line," Nature, Jun. 1977, 267(5614): 841-843.
Rosenstein, M. et al., "Extravasation of intravascular fluid mediated by the systemic administration of recombinant interleukin 2," J Immunol, 137(5): 1735-1742 (1986).
Ross et al., "Classification of pediatric acute lymphoblastic leukemia by gene expression profiling," Blood, Oct. 2003, 102(8): 2951-2959.
Rossi, J.M., et al., "Phase 1 Biomarker Analysis of ZUMA-1 (KTEC19-101) Study: A Phase 1-2 Multi-Center Study Evaluating the Safety and Efficacy of Anti-CD19 CAR T cells (KTE-C19) in Subjects with Refractory Aggressive Non-Hodgkin Lymphoma (NHL)," Abstracted presented at the American Society of Hematology Annual Meeting, Orlando, Florida, available at https://ash.confex.com/ash/2015/webprogram/Paper80339.html. (Dec. 5-8, 2015).
Rossig C, et al., "Epstein-Barr virus-specific human T lymphocytes expressing antitumor chimeric T-cell receptors: potential for improved immunotherapy," Blood, 2002, 99:2009-2016.
Rossig et al., "Targeting of $G_{D2}$-positive tumor cells by human T lymphocytes engineered to express chimeric T-cell receptor genes," Int J Cancer, Oct. 2001, 94(2): 228-236.
Rowley, J. et al., "Expression of IL-15RA or an IL-15/IL-15RA fusion on CD8+ T cells modifies adoptively transferred T-cell function in cis," European Journal of Immunology, 39: 491-506 (2009).
Rubnitz, J.E. et al., "NKAML: a pilot study to determine the safety and feasibility of haploidentical natural killer cell transplantation in childhood acute myeloid leukemia," J Clin Oncol, 28(6): 955-959 (2010).
Ruggeri, L. et al., "Effectiveness of donor natural killer cell alloreactivity in mismatched hematopoietic transplants," Science, 295(5562): 2097-2100 (2002).
Sadelain et al., "The promise and potential pitfalls of chimeric antigen receptors," Curr Opin Immunol., 2009, 21(2):215-223.
Sadelain et al., "Targeting tumours with genetically enhanced T lymphocytes," Nat Rev Cancer. Jan. 2003;3(1):35-45.
Sadelain, M., "CAR Therapy: the CD19 Paradigm," J. Clin. Investigation 125: 3392-3400 (2015).

Sahm et al., "Expression of IL-15 in N K cells results in rapid enrichment and selective cytotoxicity of gene-modified effectors that carry a tumor-specific antigen receptor," Cancer Immunother., 61 (9): 1451-1461, Feb. 2012.
Salih, H.R., et al., "Cutting Edge: Down-Regulation of MICA on Human Tumors by Proteolytic Shedding", The Journal of Immunology, 2002, 169:4098-4102.
Salomon and Bluestone, "Complexities of CD28/B7: CTLA-4 costimulatory pathways in autoimmunity and transplantation," Annu Rev Immunol, 2001, 19: 225-252.
Sambrook et al., "Molecular Cloning: A Laboratory Manual," (1989) [Table of Contents and Preface Only].
Sankhla, S.K., et al., "Adoptive immunotherapy using lymphokine-activated killer (LAK) cells and interleukin-2 for recurrent malignant primary brain tumors," J Neurooncol. 27: 133-140 (1995).
Santegoets, S.J. et al., "IL-21 promotes the expansion of CD27+ CD28+ tumor infiltrating lymphocytes with high cytotoxic potential and low collateral expansion of regulatory T cells," Journal of Translational Medicine, Feb. 12, 2013, vol. 11, No. 37, pp. c1-c10.
Savoldo, B., et al., "CD28 costimulation improves expansion and persistence of chimeric antigen receptor modified T cells in lymphoma patients," J. Clin. Invest. 121(5):1822-1826 (2011).
Schmaltz et al., "T cells require TRAIL for optimal graft-versus-tumor activity," Nat Med, Dec. 2002, 8(12): 1433-7.
Schneider et al., "Characterization of EBV-genome negative "null" and "T" cell lines derived from children with acute lymphoblastic leukemia and leukemic transformed non-Hodgkin lymphoma," Int J Cancer, May 1977, 19(5): 621-626.
Schroers et al., "Gene transfer into human T lymphocytes and natural killer cells by Ad5/F35 chimeric adenoviral vectors," Exp Hematol, Jun. 2004, 32(6): 536-546.
Schulz, G., et al., "Detection of Ganglioside GD2 in Tumor Tissues and Sera of Neuroblastoma Patients," Cancer Research 44: 5914-5920 (1984).
Schumacher, "T-cell-receptor gene therapy," Nat Rev Immunol, Jul. 2002, 2(7): 512-519.
Schwartz et al., "Structural basis for co-stimulation by the human CTLA-4/B7-2 complex," Nature, 410(6828): 604-608, Mar. 29, 2001.
Schwarz et al., "ILA, the human 4-1BB homologue, is inducible in lymphoid and other cell lineages," Blood, Feb. 1995, 85(4): 1043-1052.
Scott, A.M. et al., "Antibody therapy of cancer," *Nat Rev Cancer*, 12(4): 278-287 (2012).
Sentman, C.L., et al., "NK Cell Receptors as Tools in Cancer Immunotherapy", Advances in Cancer Research, 2006, pp. 249-292.
Sentman, C.L., et al., "NKG2D CARs as Cell Therapy for Cancer", The Cancer Journal, vol. 20, No. 2, Mar./Apr. 2014, pp. 156-159.
Sheard, M.A. et al., "Membrane-bound TRAIL supplements natural killer cell cytotoxicity against neuroblastoma cells," Journal of Immunotherapy, 36(5): 319-329 (2013).
Shimasaki, N. et al., "A clinically adaptable method to enhance the cytotoxicity of natural killer cells against B-cell malignancies," Cytotherapy, 14(7): 830-840 (2012).
Shook et al., "Natural Killer Cell Engineering for Cellular Therapy of Cancer," National Institutes of Health, Tissue Antigens, vol. 78, No. 6, pp. 409-415, Dec. 2011.
Shuford, WW, et al., "4-1 BB costimulatory signals preferentially induce CD8+ T cell proliferation and lead to the amplification in vivo of cytotoxic T cell responses", J Exp Med. Jul. 7, 1997; 186(1):47-55.
Shum et al., "Conservation and Variation in Human and Common Chimpanzee CD94 and NKG2 Genes," The American Association of Immunologists, The Journal of Immunology, pp. 240-252, Downloaded on Jun. 18, 2017.
Sica G, et al., "Modulation of the immune response through 4-1BB." In: Habib N, ed. Cancer gene therapy: past achievements and future challenges. New York: Kluwer Academic/Plenum Publishers; 355-362 (2000) [BOOK].
Slavik et al., "CD28/CTLA-4 and CD80/CD86 families: signaling and function," Immunol Res., 19(1):1-24, 1999.

(56) References Cited

OTHER PUBLICATIONS

Slavin et al., "Allogeneic cell therapy with donor peripheral blood cells and recombinant human interleukin-2 to treat leukemia relapse after allogeneic bone marrow transplantation," Blood, Mar. 1996, 87(6): 2195-2204.
Sneller, M.C. et al., "IL-15 administered by continuous infusion to rhesus macaques induces massive expansion of CD8+ T effector memory population in peripheral blood," Blood, 118(26): 6845-6848 (2011).
Somanchi, S.S. et al., "Expansion, purification, and functional assessment of human peripheral blood NK cells," Journal of Visualized Experiments, 48A: 2540 (2011).
Song et al., "Chimeric NKG2D CAR-Expressing T Cell-Mediated Attack of Human Ovarian Cancer is Enhanced by Histone Deacetylase Inhibition," Human Gene Therapy, vol. 24, pp. 295-305, Mar. 2013.
Spear et al., "Chimeric Antigen Receptor T Cells Shape Myeloid Cell Function within the Tumor Microenvironment through IFN-γ and GM-CSF," The Journal of Immunology, pp. 6389-6399, 2014.
Spear et al., "Collaboration of chimeric antigen receptor (CAR)-expressing T cells and host T cells for optimal elimination of established ovarian tumors," OncoImmunology, vol. 2, No. 2, 12 pages, Apr. 2013.
Spear et al., "NKG2D Car T-cell therapy inhibits the growth of NKG2D ligand heterogeneous tumors," Immunology and Cell Biology, vol. 91, pp. 435-440, 2013.
Srinivasan et al., "A retro-inverso peptide mimic of CD28 encompassing the MYPPPY motif adopts a polyproline type II helix and inhibits encephalitogenic T cells in vitro," J Immunol., 167(1):578-585, Jul. 1, 2001.
Srivannaboon et al., "Interleukin-4 variant (BAY 36-1677) selectively induces apoptosis in acute lymphoblastic leukemia cells," Blood, Feb. 2001, 97(3): 752-758.
Stamper et al., "Crystal structure of the B7-1/CTLA-4 complex that inhibits human immune responses," Nature, 410(6828):608-611, Mar. 29, 2001.
Steel et al., "Interleukin-15 biology and its therapeutic implications in cancer," Trends Pharmacol. Sci. 33(1) :35-41, Jan. 2012.
Stein, P.H., et al., "The Cytoplasmic Domain of CD28 is both Necessary and Sufficient for Costimulation of Interleukin-2 Secretion and Association with Phosphatidylinositol 3'-Kinase," Mol. Cell. Biol. 14: 3392-3402 (1994).
Stong RC, et al., "Human acute leukemia cell line with the t(4;11) chromosomal rearrangement exhibits B lineage and monocytic characteristics," Blood, 1985,65:21-31.
Sullivan, L.C. et al., "The Heterodimeric Assembly of the CD94-NKG2 Receptor Family and Implications for Human Leukocyte Antigen-E Recognition," Immunity, 27(6): 900-911 (Dec. 2007).
Sun, J., et al., "Early transduction produces highly functional chimeric antigen receptor-modified virus-specific T-cells with central memory markers: a Production Assistant for Cell Therapy (PACT) translational application," J. Immunother. Cancer (2015).
Sundstrom and Nilsson, "Establishment and characterization of a human histiocytic lymphoma cell line (U-937)," Int J Cancer, May 1976, 17(5): 565-577.
Sussman et al., "Protein Data Bank (PDB): database of three-dimensional structural information of biological macromolecules," Acta Crystallogr D Biol Crystallogr., 54(Pt 6 Pt 1):1078-1084, Nov. 1, 1998.
Swerdlow, S.H. et al., eds., "WHO Classification of Tumours of Haematopoietic and Lymphoid Tissues," International Agency for Research on Cancer (IARC) (4th ed. 2008) (Excerpts).
Tacke et al., "CD28-mediated induction of proliferation in resting T cells in vitro and in vivo without engagement of the T cell receptor: evidence for functionally distinct forms of CD28," Eur J Immunol., 27(1):239-247, Jan. 1997.
Tagaya, Y. et al., "IL-15: a pleiotropic cytokine with diverse receptor/signaling pathways whose expression is controlled at multiple levels," Immunity, 4(4): 329-336 (1996).
Takahashi, C, et al., "Cutting edge: 4-1 BB is a bona fide CD8 T cell survival signal," J Immunol. May 1, 1999; 162(9):5037-5040.

Thomas et al., "Monoclonal antibody therapy with rituximab for acute lymphoblastic leukemia," Hematol Oncol Clin North Am., 23(5):949-971, Oct. 2009.
Topp, M.S., et al., "Universal chimeric immunoreceptors for targeting B-cell malignancies with engineered CTL: combining CD19-specific TCR ζ signaling with engineered CD28-mediated co-stimulation," Mol. Ther. 3(5)(part 2 of 2): S21 (2001).
Trinchieri et al., "Response of resting human peripheral blood natural killer cells to interleukin 2," J Exp Med, Oct. 1984, 160(4): 1147-1169.
Trompeter et al., "Rapid and highly efficient gene transfer into natural killer cells by nucelofection," J Immunol Methods, Mar. 2003, 274(1-2): 245-256.
Tsukamoto, K. et al., "Juxtacrine function of interleukin-15/interleukin-15 receptor system in tumour derived human B-cell lines," *Clinical and Experimental Immunology*, 146(3): 559-566 (2006).
Turtle, "Therapy of B Cell Malignancies with CD19-Specific Chimeric Antigen Receptor Modified T Cells of Defined Subset Composition," Blood 124(21): 384, 6 pages, 2014.
Turtle, C.J., et al., Abstract, "A Phase I/II Clinical Trial of Immunotherapy for CD19+ B Cell Malignancies With Defined Composition of CD4+ and CD8+ Central Memory T Cells Lentivirally Engineered To Express a CD19-Specific Chimeric Antigen Receptor" Mol. Ther., 2014, 22(Supp.1):296.
Upshaw et al., "NKG2D-mediated signaling requires a DAP10-bound Grb2-Vav! intermediate and hosphatidylinositol-3-kinase in human natural killer cells," Nature Immunology, vol. 7, No. 5, pp. 524-532, May 2006.
Verdonck et al., "Donor leukocyte infusions for recurrent hematologic malignancies after allogeneic bone marrow transplantation: impact of infused and residual donor T cells," Bone Marrow Transplant, Dec. 1998, 22(11): 1057-1063.
Verma and Stock, "Management of adult acute lymphoblastic leukemia: moving toward a risk-adapted approach," Curr Opin Oncol, Jan. 2001, 13(1): 14-20.
Vinay, DS et al., "Role of 4-1 BB in immune responses," Seminars in Immunol. Dec. 1998; 10(6):481-489.
Viola, "The amplification of TCR signaling by dynamic membrane microdomains," Trends Immunol., 22(6):322-327, Jun. 2001.
Vivier, E. et al., "Innate or adaptive immunity? The example of natural killer cells," Science, 331(6013): 44-49 (2011).
Voss et al., "Targeting p53, hdm2, and CD 19: vaccination and immunologic strategies," Bone Marrow Transplant., 25 Suppl 2:S43-S45, May 2000.
Vujanovic, L. et al., "Virally infected and matured human dendritic cells activate natural killer cells via cooperative activity of plasma membrane-bound TNF and IL-15," Blood, 116(4): 575-583 (2010).
Waldmann, T.A. et al., "Safety (toxicity), pharmacokinetics, immunogenicity, and impact on clements of the normal immune system of recombinant human IL-15 in rhesus macaques," *Blood*, 117(18): 4787-4795 (2011).
Walter et al., "Reconstitution of cellular immunity against cytomegalovirus in recipients of allogeneic bone marrow by transfer of T-cell clones from the donor," N Engl J Med, Oct. 1995, 333(16): 1038-1044.
Wang, et al., "Phase I Studies of central-memory-derived CD19 CAR T cell therapy following autologous HSCT in patients with B-Cell NHL," Blood (forthcoming 2016).
Warrens AN, et al., "Splicing by overlap extension by PCR using asymmetric amplification: an improved technique for the generation of hybrid proteins of immunological interest," Gene 20;186: 29-35 (1997).
Watzl, C., et al., "Signal Transduction During Activation and Inhibition of Natural Killer Cells," Curr Protoc Immunol., Aug. 2010, pp. 1-19.
Weijtens, M.E.M., et al., "Functional balance between T cell chimeric receptor density and tumor associated antigen density: CTL mediated cytolysis and lymphokine production," Gene Ther. 7: 35-42 (2000).
Weissman et al., "Molecular cloning and chromosomal localization of the human T-cell receptor ζ chain: Distinction from the molecular CD3 complex," PNAS USA, 1988, 85:9709-9713.

(56) References Cited

OTHER PUBLICATIONS

Westwood, J.A., et al., "Adoptive transfer of T cells modified with a humanized chimeric receptor gene inhibits growth of Lewis-Y expressing tumors in mice," PNAS 102(52): 19051-19056 (2005).
WHO, "WHO Classification of Tumours of Haematopoietic and Lymphoid Tissues," International Agency for Research on Cancer (IARC), 4th Edition, 40 pages, 2008.
Wilkie, S. et al., "Selective Expansion of Chimeric Antigen Receptor-targeted T-cells with Potent Effector Function Using Interleukin-4," J Biol Chem., vol. 295, No. 33, pp. 25538-25544 (2010).
Willimsky, G. and Blankenstein, T., "Sporadic immunogenic tumours avoid destruction by inducing T-cell tolerance," Nature 437: 141-146 (2005).
Wittnebel, S. et al., "Membrane-bound interleukin (IL)-15 on renal tumor cells rescues natural killer cells from IL-2 starvation-induced apoptosis," Cancer Research, 67(12): 5594-5599 (2007).
Wu and Lanier, "Natural killer cells and cancer," Adv Cancer Res, 2003, 90: 127-156.
Wu, et al. "An Activating Immunoreceptor Complex Formed by NKG2D and DAP10," Science, vol. 285, pp. 730-732, Jul. 30, 1999.
Wyss-Coray, T., et al., "The B7 adhesion molecule is expressed on activated human T cells: functional involvement in T-T cell interactions," Eur. J. Immunol., 23: 2175-2180 (1993).
Xu, Y., et al., "Closely related T-memory stem cells correlate with in vivo expansion of CAR.CD19-T cells and are preserved by IL-7 and IL-15," Blood 123(24):3750-3759 (2014).
Yan et al., "Murine CD8 lymphocyte expansion in vitro by artificial antigen-presenting cells expressing CD137L (4-1 BBL) is superior to CD28, and CD137L expressed on neuroblastoma expands CD8 tumour-reactive effector cells in vivo," Immunology, 2004, 112(1):105-116.
Ye et al., "Gene therapy for cancer using single-chain Fv fragments specific for 4-1BB," Nat Med, Apr. 2002, 8(4): 343-348.
Ye et al. "Effects of target cell overexpression of IL-15, 4-1 BBL and IL-18 1-102 combine with IL-2 on NK cell activation and cytotoxicity during ex vivo expansion," *Chin J Cancer Biother*, Oct. 31, 2014, vol. 21, No. 5, pp. 537-542 (Non-English, Copy Search Report for PCT/SG2018/050138 attached).
Yeoh et al., "Classification, subtype discovery, and prediction of outcome in pediatric acute lymphoblastic leukemia by gene expression profiling," Cancer Cell, Mar. 2002, 1(2): 133-143.
Yoshida et al., "A novel adenovirus expressing human 4-1BB ligand enhances antitumor immunity," Cancer Immunol Immunother, Feb. 2003, 52(2): 97-106.
Zah, E. et al., "T Cells Expressing CD19/CD20 Bispecific Chimeric Antigen Receptors Prevent Antigen Escape by Malignant B Cells," Cancer Immunol Res, 4(6): 498-508 (Apr. 2016).
Zanoni, I. et al., "IL-15 cis presentation is required for optimal NK cell activation in lipopolysaccharide-mediated inflammatory conditions," *Cell Reports*, 4: 1235-1249 (2013).
Zeis, M. et al., "Allogeneic MHC-Mismatched Activated Natural Killer Cells Administered After Bone Marrow Transplantation Provide a Strong Graft-Versus-Leukemia Effect in Mice," BrJ Haematol, 1997, pp. 757-761, vol. 96.
Zhang et al., "Chimeric NKG2D-Modified T Cells Inhibit Systemic T-Cell Lymphoma Growth in a Manner Involving Multiple Cytokines and Cytotoxic Pathways," Cancer Research, vol. 67, No. 22, pp. 11029-11036, Nov. 15, 2007.
Zhang et al., "Chimeric NK-receptor-bearing T cells mediate antitumor immunotherapy," Gene Therapy, Blood, vol. 106, No. 5, pp. 1544-1551, Sep. 2005.
Zhang et al., "Generation of Antitumor Responses by Genetic Modification of Primary Human T Cells with a Chimeric NKG2D Receptor," Cancer Research, vol. 66, No. 11, pp. 5927-5933, Jun. 1, 2006.
Zhang, J. et al., "Characterization of interleukin-15-gene-modified human natural killer cells: implications for adoptive cellular immunotherapy," Haematologica, 89(3): 338-347 (2004).
U.S. Appl. No. 60/383,872, filed May 28, 2002 by Saidelain, et al.

International Search Report and Written Opinion for Int'l Application No. PCT/IB2019/052636, titled: Neutralization of Human Cytokines with Membrane-Bound Anti-Cytokine Non-Signaling Binders Expressed in Immune Cells, Date Mailed: Jul. 15, 2019.
Zhang et al., "Mouse Tumor Vasculature Expresses NKG2D Ligands and Can Be Targeted by Chimeric NKG2D-Modified T Cells," The Journal of Immunology, pp. 2455-2463, (2013) Downloaded Feb. 20, 2018.
Aagaard et al., "RNAi therapeutics: Principles, prospects and challenges," Advanced Drug Delivery Reviews, 59 (2007) 75-86 (Year: 2007).
Arnau et al., "Current strategies for the use of affinity tags and tag removal for the purification of recombinant proteins" Protein expression and purification, 2006, v. 48, n. 1, p. 1-13.
Auerbach et al., "Angiogenesis assays: Problems and pitfalls," Cancer and Metastasis Reviews, 2000, 19: 167-172 (Year: 2000).
Beans, "Targeting metastasis to halt cancer's spread," PNAS 2018; 115(50): 12539-12543 (Year: 2018).
Berger, C. et al., "CD28 costimulation and immunoaffinity-based selection efficiently gernate primary gene-modified T cells for adoptive immunotherapy," Blood, 101: 476-484 (2003).
Blumberg et al., "Unraveling the autoimmune translational research process layer by layer," (Nat Med.; 18(1): 35-41) (Year: 2015).
Bork, "Powers and Pitfalls in Sequence Analysis: The 70% Hurdle," Genome Research, 2000, 10:398-400 (Year: 2000).
Burgess et al., "Possible Dissociation of the Heparin-binding and Mitogenic Activities of Heparin-binding (Acidic Fibroblast) Growth Factor-1 from Its Receptor-binding Activities by Site-directed Mutagenesis of a Single Lysine Residue" J. Cell Biol. 111 :2129-2138, 1990 (Year: 1990).
De Sousa Abreu et al., "Global signatures of protein and mRNA expression levels" Mol. BioSys. 5:1512-1526, 2009.
Frankel et al., "Characterization of diphtheria fusion proteins targeted to the human interleukin-3 receptor" Protein Eng., 2000, v.13, n.8, p. 575-581.
Gravanis et al., "The changing world of cancer drug development: the regulatory bodies' perspective," Chin Clin Oneal, 2014, 3, pp. 1-5 (Year: 2014).
Greenspan et al., "Defining epitopes: It's not as easy as it seems" Nature Biotechnology, 17:936-937 (Year: 1999).
Gura T, "Systems for Identifying New Drugs are Often Faulty," Science 1997, 278(5340): 1041-1042 (Year: 1997).
Hait., "Anticancer drug development: the grand challenges," Nature Reviews/Drug Discovery, 2010, 9, pp. 253-254 (Year: 2010).
Heppner et al., "Tumor heterogeneity: biological implications and therapeutic consequences," 1983, Cancer Metastasis Reviews 2:5-23 (Year: 1983).
Hopp et al., "A Short Polypeptide Marker Sequence Useful for Recombinant Protein Identification and Purification" Bio/Technology, vol. 6, pp. 1204-1210 (Oct. 1988).
Hu, et al., "Gene Therapy of Malignant Solid Tumors by Targeting erbB2 Receptors and by Activating T Cells" Cancer Biotherapy and Radiopharmaceuticals, vol. 27, No. 10, 2012.
Jain RK, "Barriers to Drug Delivery in Solid Tumors," 1994, Scientific American, pp. 58-645 (Year: 1994).
Kontermann, et al., "Bispecific antibodies," Drug Discovery Today, 2015, v. 7, n. 20, p. 838-847, Fig. 1.
Kulmanov et al., "DeepGO: predicting protein functions from sequence and interactions using a deep ontology-aware classifier," Bioinformatics, 34(4), 2018, 660-668 (Year: 2018).
Lazar et al., "Transforming Growth Factor • : Mutation of Aspartic Acid 47 and Leucine 48 Results in Different Biological Activities" Mol. Cell. Biol., vol. 8, No. 3, 1247-1252, 1988 (Year: 1988).
LeBien et al., "B lymphocytes: how they develop and function" Blood, vol. 112, No. 5, Sep. 1, 2008. pp. 1570-1580.
McKeague, et al., "Challenges and Opportunities for Small Molecule Aptamer Development," Review Article, Journal of Nucleic Acids, vol. 2012, Article ID 748913.
Miosge, "Comparison of predicted and actual consequences of missense mutations," Proc Natl Acad Sci USA Sep. 15, 2015;112(37):E5189-98 (Year: 2015).

(56) References Cited

OTHER PUBLICATIONS

Morgan, et al., "Case Report of a Serious Adverse Event Following the Administration of T Cells Transduced With a Chimeric Antigen Receptor Recognizing ERBB2" Molecular Therapy, vol. 18, No. 4, 843-851, Apr. 2010.
NIH National Cancer Institute, NCI Dictionary of Cancer Terms, Antigen-Presenting Cell, Retrieved online from: <URL: https://www.cancer.gov/publications/dictionaries/cancer-terms/def/antigen-presenting-cell > [retrieved on May 8, 2024], 2024.
Park et al., "Follicular Dendritic Cells Produce IL-15 That Enhances Germinal Center B Cell Proliferation in Membrane-Bound Form" J. Immunol. 173(11), 2004, pp. 6676-6683.
Skolnick et al., "From genes to protein structure and function: novel applications of computational approaches in the genomic era," Trends Biotechnol. Jan. 2000; 18(1 ):34-9 (Year: 2000).
Sporn et al., "Chemoprevention of Cancer," Carcinogenesis, vol. 21, No. 3 (2000), 525-530 (Year: 2000).
The Human Protein Atlas, KLRK1, Immune Cell, Retrieved online from: <URL:https://www.proteinatlas.org/ENSG00000213809-KLRK1/immune+cell> [retrieved on May 8, 2024], 2024.
The Human Protein Atlas, NCR3, Immune Cell, Retrieved online from: <URL:https://www.proteinatlas.org/ENSG00000204475-NCR3/immune+cell> [retrieved on May 8, 2024], 2024.
Torok et al., "Pharmacogenetics of Crohn's disease," Pharmacogenomics (2008) 9(7), 881-893 (Year: 2008).
Warzocha et al., "Antisense Strategy: Biological Utility and Prospects in the Treatment of Hematological Malignancies," Leukemia and Lymphoma (1997) vol. 24. pp. 267-281 (Year: 1997).
Yan et al., "HER2 expression status in diverse cancers: review of results from 37,992 patients," Cancer Metastasis Rev (2015) 34:157-164 (Year: 2015).
U.S. Appl. No. 62/651,311, filed Apr. 2, 2018, obtained from PatentCenter.
Barrett, D., "IL-6 Blockade in Cytokine Storm Syndromes," Ch. 37 in Cytokine Storm Syndrome, Second Edition, Advances in Experimental Medicine and Biology 1448 (Cron and Behrens, Eds. 2024).
Behrens, et al., "Anti-Interferon-γ Therapy for Cytokine Storm Syndromes," Ch. 28 in Cytokine Storm Syndrome, Second Edition, Advances in Experimental Medicine and Biology 1448 (Cron and Behrens, Eds. 2024).
Childs, et al., "Bringing natural killer cells to the clinic: ex vivo manipulation," Hematology Am Soc Hematol Educ Program. Dec. 6, 2013(1):234-246.
Royer, Y. et al., "High-Throughput Gateway Bicistronic Retroviral Vectors for Stable Expression in Mammalian Cells: Exploring the Biologic Effects of STAT5 Overexpression," DNA Cell Biol., vol. 23, No. 6, pp. 355-365 (2004).
Gardner, et al., "Preemptive mitigation of CD19 CAR T-cell cytokine release syndrome without attenuation of antileukemic efficacy," blood, Dec. 12, 2019, vol. 134, No. 24, pp. 2149-2158.
Grabstein et al., "Cloning of a T cell growth factor that interacts with the β chain of the interleukin-2 receptor," Comparitive Study, Science, May 13, 1994;264(5161):965-8.
Heberlein, C. et al., "The Gene for Erythropoietin Receptor Is Expressed in Multipotential Hematopoietic and Embryonal Stem Cells: Evidence for Differentiation Stage-Specific Regulation," Molecular and Cellular Biology 1992 1815-1826.
Hoshino S. et al., "Expression and Characterimtion of Erythropoietin Receptors on Normal Human Bone Marrow Cells," International Journal of Cell Cloning 1989, 7:156-167.
Hurton, L.V. et al., "Improved Costimulation of CD19-Specific T Cells Transpresenting a Membrane-Bound IL-15," Molecular Therapy vol. 19, Supplement 1, May 2011, S138.
Kadauke, et al., "Risk-Adapted Preemptive Tocilizumab to Prevent Severe Cytokine Release Syndrome After CTL019 for Pediatric B-Cell Acute Lymphoblastic Leukemia: A Prospective Clinical Trial," ASCO, Journal of Clinical Oncology, vol. 39, Issue 8, pp. 920-931.
Lanier LL., "DAP10- and DAP12-associated receptors in innate immunity," Immunol Rev. Jan. 2009;227(1):150-60. doi: 10.1111/j.1600 -065X.2008.00720.x. PMID: 19120482; PMCID: PMC2794881. (Year: 2009).
Lisowska, K.A. et al., "Erythropoietin receptor is expressed on human peripheral blood T and B lymphocytes and monocytes and is modulated by recombinant human erythropoietin treatment," Artif Organs. Aug. 2010;34(8):654-62.
Locke, et al., "Preliminary Results of Prophylactic Tocilizumab after Axicabtageneciloleucel (axi-cel; KTE-C19) Treatment for Patients with Refractory, Aggressive Non-Hodgkin Lymphoma (NHL)," Blood blood (2017) 130 (Suppl_1):1547.
Lu, et al., "Genetic engineering of dendritic cells to express immunosuppressive molecules (viral IL-10, Tgf-•, and CTLA4lg)," J. Leukocyte Biol., Aug. 1999, 66:293-96.
Miyake, et al., "IL-6 receptor antibody treatment improves muscle weakness in experimental autoimmune myasthenia gravis mouse model," Frontiers in Neurology, May 1, 2024.
Murthy et al., "Cytokine Release Syndrome: Current Perspectives," Immuno Targets and Therapy, 2019:8, 43-52.
Neely, et al., "Monocyte Surface-Bound IL-15 Can Function as an Activating Receptor and Participate in Reverse Signaling," The Journal of Immunology, 2004, 172(7): 4225-4234.
Neelapu, et al., "Chimeric antigen receptor T-cell therapy—assessment and management of toxicities," Nature Reviews, Clinical Oncology, vol. 15, Jan. 2018.
Peng, et al., Erythropoietin and its derivatives: from tissue protection to immune regulation Cell Death & Disease 11, 79 (2020).
Saikh, et al., "IL-15 induced conversion of monocytes to mature dendritic cells," Clin Exp Immunol 2001; 126(3):447-455.
Sarkis, et al., "Long term survival and limited migration of genetically modified monocytes/macrophages grafted into the mouse brain," J. Biomed. Sci. Engineer. (2013) 6(5): 561-71.
Shinjo K., et al., "Erythropoietin receptor expression on human bone marrow erythroid precursor cells by a newly-devised quantitative flow-cytometric assay," British Journal of Haematology, 1997, 551-558.
Speake, et al., "IL-6-targeted therapies to block the cytokine or its receptor drive distinct alterations in T cell function," JCI Insight 2022;7(22):e159436.
Ueda, et al., "Novel genetically-humanized mouse model established to evaluate efficacy of therapeutic agents to human interleukin-6 receptor," Scientific Reports, 3:1196, Feb. 1, 2013.
UniProt P26717 NKG2C_HUMAN. Integrated into UniProtKB/Swiss-Prot Aug. 1, 1992. https://www.uniprot.org/uniprotkb/P26717/ entry. Accessed Jul. 17, 2024 (Year: 1992).
Xu, Y., et al., "γc Cytokines IL7 and IL15 Expanded Chimeric Antigen Receptor-Redirected T Cells (CAR-T) with Superior Antitumor Activity In Vivo," Cell Processing and Vector Production, Molecular Therapy vol. 21, Supplement 1, May 2013, pp. S20-S21.

\* cited by examiner

NEUTRALIZATION OF HUMAN CYTOKINES WITH MEMBRANE-BOUND ANTI-CYTOKINE NON-SIGNALING BINDERS EXPRESSED IN IMMUNE CELLS

RELATED APPLICATION

This application is the U.S. National Stage of International Application No. PCT/IB2019/052636, filed Mar. 29, 2019, which designates the U.S., published in English, and claims the benefit of U.S. Provisional Application No. 62/651,311, filed Apr. 2, 2018. The entire teachings of the above applications are incorporated herein by reference.

INCORPORATION BY REFERENCE OF MATERIAL IN ASCII TEXT FILE

This application incorporates by reference the Sequence Listing contained in the following ASCII text file:
 a) File name: 44591149002_SEQUENCELISTING.txt; created Sep. 21, 2020, 31 KB in size.

BACKGROUND

Interleukin-6 (IL-6) is a pro-inflammatory cytokine that is involved in the pathogenesis of multiple autoimmune and inflammatory diseases, including rheumatoid arthritis, systemic lupus erythematosus, and graft-versus-host disease (GvHD).

IL-6 is also involved in the development of cytokine release syndrome (CRS), one of the most common side effects of infusion of T cells redirected with chimeric antigen receptors (CARs). CRS can be severe and, in some cases, fatal. IL-6 is central to the development of CRS, and an anti-IL-6 receptor antibody (tocilizumab) is currently used to curb its effects.

Methods for reducing the severity and incidence of autoimmune disease and CRS are desirable.

SUMMARY

Described herein are nucleic acids, vectors, and transgenic host cells, and methods of making and using the same. The nucleic acids can be incorporated into a vector, which can be used to express the nucleic acid in a host cell. The transgenic host cells can be introduced (e.g., infused, implanted, engrafted, injected) into a host mammal (e.g., a human) in a method of reducing the concentration of a cytokine, such as IL-6. The nucleic acids can be expressed in a host mammal (e.g., a human) in a method of reducing the concentration of a cytokine, such as IL-6.

In some embodiments, a vector includes a nucleic acid that encodes a membrane-bound anti-cytokine single-chain variable fragment (scFv). The membrane-bound anti-cytokine can include an anti-cytokine single-chain variable fragment (anti-cytokine scFv), and a hinge and transmembrane domain coupled to the anti-cytokine scFv. The anti-cytokine scFv can include an anti-cytokine variable light chain domain, an anti-cytokine variable heavy chain domain, and a linker domain joining the variable light chain domain and the variable heavy chain domain. The anti-cytokine construct can be specific to a wide variety of cytokines, such as IL-6 (e.g., anti-IL-6), (TNF)-α (e.g., anti-TNF-α), IL-1β (e.g., anti-IL-1β), IL-12 (e.g., anti-IL-12), IL-17 (e.g., anti-IL-17), IL-18 (e.g., anti-IL-18), IFNγ (e.g., anti-IFNγ), and others.

In some embodiments, the nucleic acid encodes a membrane-bound anti-IL6 (mb-aIL6) single-chain variable fragment (scFv). The mb-aIL6 can include an anti-IL6 single-chain variable fragment (anti-IL6 scFv). The anti-IL6 scFv can include an anti-IL-6 variable light chain domain, an anti-IL-6 variable heavy chain domain, and a linker domain joining the variable light chain domain and the variable heavy chain domain. A hinge and transmembrane domain can be coupled to the anti-IL6 scFv. In some embodiments, the nucleic acid of the vector can further encode a chimeric antigen receptor (CAR), such as anti-CD19-41BB-CD3ζ.

The vectors described herein can be used to create transgenic cells, such as transgenic T cells. The transgenic T cells, in particular, can be used to suppress proliferation of IL-6-dependent cells, reduce IL-6 concentration, or both. In some embodiments, the transgenic T cells can be used to reduce the risk or severity of cytokine release syndrome (CRS) in a mammal (e.g., a human), such as a mammal being treated (e.g., for cancer). In some embodiments, the mammal is being treated (e.g., treated for cancer) with a chimeric antigen receptor (CAR) T cell. One example is a patient that is being treated for cancer with T cells that express an anti-CD19 CAR.

The transgenic T cells can also be used to treat a mammal suffering from a disease or disorder in which cytokines are involved in the pathogenesis, such as an autoimmune disease, an inflammatory disease, or a lymphoproliferative disorder. Examples of autoimmune diseases include rheumatoid arthritis and systemic lupus erythematosus. Examples of inflammatory diseases include graft versus host disease and hemophagocytic lymphohistiocytosis. An example of a lymphoproliferative disorder is Castleman disease.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1A is a schema of the mb-aIL6 construct. FIG. 1B is a schema of the MSCV-mb-aIL6-IRES-GFP plasmid. FIG. 1C is flow cytometric analysis of Jurkat cells transduced with either GFP alone ("Mock") or GFP plus mb-aIL6. Dot plots illustrate GFP fluorescence, and mb-aIL6 expression after staining with biotin-conjugated goat anti-human F(ab')2 antibody and streptavidin-APC (Jackson ImmunoResearch Laboratories). FIG. 1D is flow cytometric analysis of IL-6 binding to mock- or mb-aIL6-transduced Jurkat cells. Dot plots illustrate GFP fluorescence, and IL-6 binding after staining with IL-6 biotin (Abcam) and streptavidin-APC. Soybean-trypsin inhibitor (STI)-biotin was used as a control.

FIG. 2A is a chart showing levels of IL-6. Jurkat cells ($2\times10^6$/mL) transduced with either GFP alone ("Mock") or GFP plus mb-aIL6 were cultured for 2 hours in tissue culture medium containing 1 ng/mL human IL-6. At the end of the cultures, levels of IL-6 were measured by ELISA. FIG. 2B is a graph showing that IL-6 neutralization is cell-dose dependent. Different cell concentrations were tested (0.25-$2\times10^6$/mL) and levels of IL-6 in the supernatant after 2 hours of culture were measured by ELISA. FIG. 2C is a graph showing that IL-6 neutralization is time-dependent. Cultures were set up as described with respect to FIG. 2A and levels of IL-6 in the supernatant were measured after the indicated culture times. Cells were incubated for 10, 30, 60, and 120 minutes. Dashed curve represents fitted exponential decay curve. FIG. 2D is a chart showing that mb-aIL6 Jurkat cells remained effective at low IL-6 concentrations. Cultures were set up as described with respect to FIG. 2A but with initial concentrations of IL-6 in the tissue culture medium ranging from 0.025 to 0.2 ng/mL and Jurkat cells at $0.5 \times 10^6$/mL. FIG. 2E is a graph showing that IL-6 neutralization is augmented by allowing proliferation of Jurkat-mb-aIL6 cells. Cultures were set up as described with respect to FIG. 2A but with an initial cell concentration of $0.2 \times 10^6$ cells/mL; IL-6 in the supernatant was measured by ELISA after 2-72 hours.

FIG. 3A is a chart showing Stat3 phosphorylation in U937 cells triggered by IL-6 is prevented by exposure to mb-aIL6 Jurkat cells. Jurkat cells ($2 \times 10^6$/mL) untransduced ("WT") or transduced with GFP plus mb-aIL6 were cultured for 2 hours in tissue culture medium containing 1 ng/mL human IL-6. The supernatant was then added to U937 cells for 15 minutes at 37° C. Tissue culture medium ("no T cells") with or without IL-6 was used as a control. Bars show the mean ($\pm$SD) of Stat3 phosphorylation as measured by flow cytometry after staining with an anti-PhosphoStat3 antibody (BD Biosciences anti-Stat3 pY705). *$P<0.001$. FIG. 3B is a graph showing the IL-6-dependent proliferation of DS-1 cells is suppressed by exposure to mb-aIL6 Jurkat cells. DS-1 transduced with mCherry and either mock-transduced or mb-IL6 transduced Jurkat cells were co-cultured at a 1:1 ratio, with IL-6 (0.5 ng/mL). DS-1 proliferation was quantitated using the IncuCyte live Imaging System (Essen); results are expressed as mean ($\pm$SD) of red calibrated unit (RCU)$\times\mu m^2$/well in triplicate measurements.  $P<0.01$ for the measurements at 120 hours.

FIG. 4A is a flow cytometric analysis of peripheral blood T cells transduced with either GFP alone ("Mock") or GFP plus mb-aIL6. Dot plots illustrate GFP fluorescence, and mb-aIL6 expression after staining with biotin-conjugated goat anti-human F(ab')2 antibody and streptavidin-APC. FIG. 4B is a flow cytometric analysis of IL-6 binding to mock- or mb-aIL6-transduced peripheral blood T cells. Dot plots illustrate GFP fluorescence, and IL-6 binding after staining with IL-6 biotin and streptavidin-APC. FIG. 4C is a cell marker profile of mock- or mb-aIL6-transduced peripheral blood T cells, labelled with anti-CD3 APC, anti-CD56 PE, anti-CD4 V450, and anti-CD8 PerCP (BD Biosciences). FIG. 4D is a graph showing the IL-6-dependent proliferation of DS-1 cells is suppressed by exposure to mb-aIL6 T lymphocytes. DS-1 transduced with mCherry and either mock-transduced or mb-aIL6 transduced T cells were co-cultured at a 1:1 ratio, with IL-6 (0.5 ng/mL). DS-1 proliferation was quantitated using the IncuCyte live Imaging System (Essen); results are expressed as mean ($\pm$SD) of red calibrated unit (RCU)$\times\mu m^2$/well in triplicate measurements. ** $P<0.01$ for the measurements at 120 hours.

FIG. 5A is a schema of the MSCV plasmid containing both receptors ("DUAL"). FIG. 5B is a flow cytometric analysis of peripheral blood T-cells transduced with either GFP alone (Mock), GFP plus anti-CD19-41BB-CD3ζ CAR, mb-aIL6, or both. Dot plots illustrate mb-aIL6 expression after staining with biotin-conjugated goat anti-human F(ab')2 antibody and streptavidin-APC, and anti-CD19 CAR expression after staining with CD19-myc, followed by R-phycoerythrin (PE)-conjugated anti-myc (Cell Signaling Technology). FIG. 5C is a graph showing neutralization of IL-6 by mb-aIL6 T lymphocytes is not affected by CAR co-expression. T lymphocytes transduced as described with respect to FIG. 5B were cultured in tissue culture medium containing 1 ng/mL IL-6. After 2 hours, IL-6 was measured in the supernatant by ELISA.

FIG. 6A is a plot showing IFN-7 production in T-cells co-cultured with CD19+ ALL cell line OP-1 for 6 hours at an E:T ratio of 1:1. Expression of IFN was measured by flow cytometry after staining with PE-conjugated anti-human IFNγ antibody (BD Biosciences). Symbols represent results of triplicate experiments obtained with T cells from 3 donors. FIG. 6B is a plot showing CD107a expression in T-cells co-cultured with OP-1 for 4 hours at an E:T ratio of 1:1. CD107a expression was measured by flow cytometry after staining with PE-conjugated anti-human CD107a antibody (BD Biosciences). FIG. 6C is a plot showing cytotoxicity of T-cells against OP-1 after 4 hours at an E:T ratio of 1:1. FIG. 6D is two charts showing proliferation of T cells co-cultured with or without irradiated OP-1 for 21 days at an E:T ratio of 1:1 with 120 IU/mL IL-2. Irradiated OP-1 cells were added on day 0, day 7 and day 14. Symbols represent the mean ($\pm$SD) of triplicate measurements.

FIG. 7A is two graphs showing cytotoxicity of T-cells co-cultured with mCherry-transduced OP-1 cells with or without THP-1 cells (1:5:1 T-cell:OP-1:THP-1 ratio). OP-1 cell numbers were quantitated using the IncuCyte Live Imaging System (Essen); results are expressed as mean ($\pm$SD) of red calibrated unit (RCU)$\times\mu m^2$/well in triplicate measurements. FIG. 7B is a chart showing levels of IL-6 in the supernatant of the cultures shown in FIG. 7A after 40 hours of culture, measured by ELISA.

FIG. 8A is a schematic of a nucleic acid construct for secreted aIL6 and a cell expressing secreted aIL6. FIG. 8B is a schematic of a nucleic acid construct for an anti-IL-6 scFv linked to a 41BB domain and a CD3ζ domain, forming an anti-IL6 CAR. FIG. 8C is a schematic of a nucleic acid construct where the anti-IL6 scFv is replaced by an IL-6 receptor deprived of signaling capacity.

FIG. 9A is ventral and dorsal images of mice. FIG. 9B is a chart showing change in luminescence in mice engrafted with DS-1 expressing luciferase. Each symbol corresponds to one bioluminescence measurement; lines connect all measurements in one mouse.

FIG. 10A is ventral and dorsal images of mice. Images on day 3 were processed with enhanced sensitivity to show the presence of tumors before injection of engineered T-cells. FIG. 10B is a chart showing change in luminescence in mice engrafted with Nalm-6 expressing luciferase. FIG. 10C is ventral and dorsal images of mice. Images on day 3 were processed with enhanced sensitivity to show the presence of tumors before injection of engineered T-cells. FIG. 10D is a chart showing CAR T-cell counts on day 53. Blood from mice were obtained via cheek prick and CAR T-cells were quantified using flow cytometry. FIG. 10E is a chart showing the survival curve of the mice. Curves for mice injected with no T cells versus those injected with CAR-T cells or CAR-T+ mb-aIL6 was calculated by log rank test (P<0.01 for either comparison). FIG. 10F is a chart showing change in luminescence in mice engrafted with Nalm-6 expressing luciferase. Each symbol corresponds to one bioluminescence measurement; lines connect all measurements in one mouse.

FIG. 11A is a schema of the mb-aTNFα construct. FIG. 11B is a schema of the MSCV-mb-aTNFα-IRES-GFP plasmid.

DETAILED DESCRIPTION

Figure 1A:
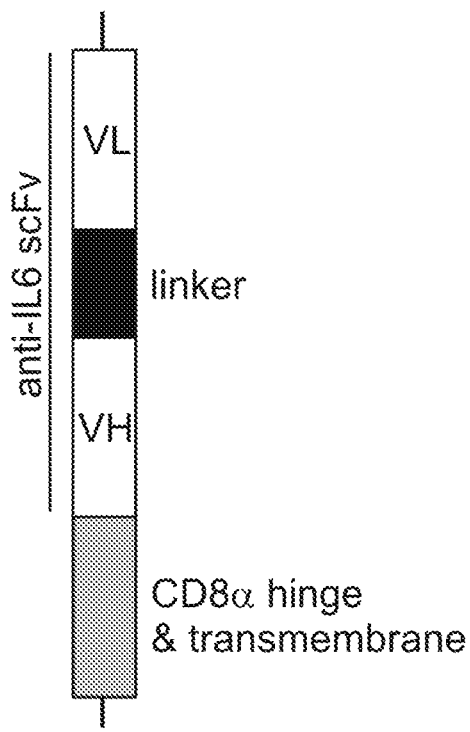
FIGS. 1A-D pertain to design and expression of mb-aIL6.

A description of example embodiments follows.
Interleukin-6 and Cytokine Release Syndrome Interleukin-6 (IL-6) is a pro-inflammatory cytokine that is involved in the pathogenesis of multiple autoimmune diseases, inflammatory diseases, and lymphoproliferative disorders, including graft-versus-host disease (GvHD), rheumatoid arthritis, and systemic lupus erythematosus. IL-6 is also involved in the development of cytokine release syndrome (CRS), one of the most common side effects of infusion of T cells redirected with chimeric antigen receptors (CARs). CRS can be severe and, in some cases, fatal.[7-10] IL-6 is central to the development of CRS, and an anti-IL-6 receptor antibody (tocilizumab) is currently used to curb its effects.[7-10]

The vectors described herein can be used to generate modified T cells, which, in turn, can be used for treatment of auto-immune diseases and CRS. The processes described herein can be used to create transgenic T cells that can neutralize IL-6, thereby decreasing the risk and/or severity of CRS. While the particular examples described herein use IL-6 as a paradigm, the approach is applicable to the neutralization of other cytokines involved in the pathogenesis of autoimmune diseases and CRS.
Nucleic Acids As used herein, the term "nucleic acid" refers to a polymer comprising multiple nucleotide monomers (e.g., ribonucleotide monomers or deoxyribonucleotide monomers). "Nucleic acid" includes, for example, DNA (e.g., genomic DNA and cDNA), RNA, and DNA-RNA hybrid molecules. Nucleic acid molecules can be naturally occurring, recombinant, or synthetic. In addition, nucleic acid molecules can be single-stranded, double-stranded or triple-stranded. In certain embodiments, nucleic acid molecules can be modified. In the case of a double-stranded polymer, "nucleic acid" can refer to either or both strands of the molecule.

The terms "nucleotide" and "nucleotide monomer" refer to naturally occurring ribonucleotide or deoxyribonucleotide monomers, as well as non-naturally occurring derivatives and analogs thereof. Accordingly, nucleotides can include, for example, nucleotides comprising naturally occurring bases (e.g., adenosine, thymidine, guanosine, cytidine, uridine, inosine, deoxyadenosine, deoxythymidine, deoxyguanosine, or deoxycytidine) and nucleotides comprising modified bases known in the art.

As used herein, the term "sequence identity," refers to the extent to which two nucleotide sequences, or two amino acid sequences, have the same residues at the same positions when the sequences are aligned to achieve a maximal level of identity, expressed as a percentage. For sequence alignment and comparison, typically one sequence is designated as a reference sequence, to which a test sequences are compared. The sequence identity between reference and test sequences is expressed as the percentage of positions across the entire length of the reference sequence where the reference and test sequences share the same nucleotide or amino acid upon alignment of the reference and test sequences to achieve a maximal level of identity. As an example, two sequences are considered to have 70% sequence identity when, upon alignment to achieve a maximal level of identity, the test sequence has the same nucleotide or amino acid residue at 70% of the same positions over the entire length of the reference sequence.

Alignment of sequences for comparison to achieve maximal levels of identity can be readily performed by a person of ordinary skill in the art using an appropriate alignment method or algorithm. In some instances, the alignment can include introduced gaps to provide for the maximal level of identity. Examples include the local homology algorithm of Smith & Waterman, *Adv. Appl. Math.* 2:482 (1981), the homology alignment algorithm of Needleman & Wunsch, *J. Mol. Biol.* 48:443 (1970), the search for similarity method of Pearson & Lipman, *Proc. Natl. Acad. Sci. USA* 85:2444 (1988), computerized implementations of these algorithms (GAP, BESTFIT, FASTA, and TFASTA in the Wisconsin Genetics Software Package, Genetics Computer Group, 575 Science Dr., Madison, Wis.), and visual inspection (see generally Ausubel et al., *Current Protocols in Molecular Biology*).

When using a sequence comparison algorithm, test and reference sequences are input into a computer, subsequent coordinates are designated, if necessary, and sequence algorithm program parameters are designated. The sequence comparison algorithm then calculates the percent sequence identity for the test sequence(s) relative to the reference sequence, based on the designated program parameters. A commonly used tool for determining percent sequence identity is Protein Basic Local Alignment Search Tool (BLASTP) available through National Center for Biotechnology Information, National Library of Medicine, of the United States National Institutes of Health. (Altschul et al., *J. Mol Biol.* 215(3):403-10 (1990)).

In various embodiments, two nucleotide sequences, or two amino acid sequences, can have at least, e.g., 70%, 75%, 80%, 85%, 86%, 87%, 88%, 89%, 90%, 91%, 92%, 93%, 94%, 95%, 96%, 97%, 98%, 99%, or more, sequence identity. When ascertaining percent sequence identity to one or more sequences described herein, the sequences described herein are the reference sequences.

In some embodiments, the variable light chain domain has at least 70%, 75%, 80%, 85%, 86%, 87%, 88%, 89%, 90%, 91%, 92%, 93%, 94%, 95%, 96%, 97%, 98%, 99%, or more, sequence identity to SEQ ID NO: 4. In some embodiments, the variable heavy chain domain has at least 70%, 75%, 80%, 85%, 86%, 87%, 88%, 89%, 90%, 91%, 92%, 93%, 94%, 95%, 96%, 97%, 98%, 99%, or more, sequence identity to SEQ ID NO: 8.

Vectors

The terms "vector", "vector construct" and "expression vector" mean the vehicle by which a DNA or RNA sequence (e.g. a foreign gene) can be introduced into a host cell, so as to transform the host and promote expression (e.g. transcription and translation) of the introduced sequence. Vectors typically comprise the DNA of a transmissible agent, into which foreign DNA encoding a protein is inserted by restriction enzyme technology. A common type of vector is a "plasmid", which generally is a self-contained molecule of double-stranded DNA that can readily accept additional (foreign) DNA and which can readily introduced into a suitable host cell. A large number of vectors, including plasmid and fungal vectors, have been described for replication and/or expression in a variety of eukaryotic and prokaryotic hosts.

The terms "express" and "expression" mean allowing or causing the information in a gene or DNA sequence to become manifest, for example producing a protein by activating the cellular functions involved in transcription and translation of a corresponding gene or DNA sequence. A DNA sequence is expressed in or by a cell to form an "expression product" such as a protein. The expression product itself, e.g. the resulting protein, may also be said to be "expressed" by the cell. A polynucleotide or polypeptide is expressed recombinantly, for example, when it is expressed or produced in a foreign host cell under the control of a foreign or native promoter, or in a native host cell under the control of a foreign promoter.

Gene delivery vectors generally include a transgene (e.g., nucleic acid encoding an enzyme) operably linked to a promoter and other nucleic acid elements required for expression of the transgene in the host cells into which the vector is introduced. Suitable promoters for gene expression and delivery constructs are known in the art. Recombinant plasmids can also comprise inducible, or regulatable, promoters for expression of an enzyme in cells.

Various gene delivery vehicles are known in the art and include both viral and non-viral (e.g., naked DNA, plasmid) vectors. Viral vectors suitable for gene delivery are known to those skilled in the art. Such viral vectors include, e.g., vector derived from the herpes virus, baculovirus vector, lentiviral vector, retroviral vector, adenoviral vector, adeno-associated viral vector (AAV), and murine stem cell virus (MSCV). The viral vector can be replicating or non-replicating. Such vectors may be introduced into many appropriate host cells, using methods disclosed or cited herein or otherwise known to those skilled in the relevant art.

Non-viral vectors for gene delivery include naked DNA, plasmids, transposons, and mRNA, among others. Non-limiting examples include pKK plasmids (Clonetech), pUC plasmids, pET plasmids (Novagen, Inc., Madison, Wis.), pRSET or pREP plasmids (Invitrogen, San Diego, Calif.), pMAL plasmids (New England Biolabs, Beverly, Mass.). Such vectors may be introduced into many appropriate host cells, using methods disclosed or cited herein or otherwise known to those skilled in the relevant art.

In certain embodiments, the vector comprises an internal ribosome entry site (IRES). In some embodiments, the vector includes a selection marker, such as an ampicillin resistance gene (Amp). In some embodiments, the nucleic acid encodes a fluorescent protein, such as green fluorescent protein (GFP). In some embodiments, the nucleic acid is suitable for subcloning into pMSCV-IRES-GFP between EcoRI and XhoI. In some embodiments, the vector contains a multiple cloning site (MCS) for the insertion of the desired gene.

Although the genetic code is degenerate in that most amino acids are represented by multiple codons (called "synonyms" or "synonymous" codons), it is understood in the art that codon usage by particular organisms is nonrandom and biased towards particular codon triplets. Accordingly, in some embodiments, the vector includes a nucleotide sequence that has been optimized for expression in a particular type of host cell (e.g., through codon optimization). Codon optimization refers to a process in which a polynucleotide encoding a protein of interest is modified to replace particular codons in that polynucleotide with codons that encode the same amino acid(s), but are more commonly used/recognized in the host cell in which the nucleic acid is being expressed. In some aspects, the polynucleotides described herein are codon optimized for expression in T cells.

Membrane-Bound Anti-Cytokine Constructs

Membrane-bound anti-cytokine constructs, an example of which is the mb-aIL6 construct of FIG. 1A, can be created as described herein. The anti-cytokine construct can be specific to a wide variety of cytokines, such as IL-6, (TNF)-α, IL-1β, IL-12, IL-17, IL-18, IFNγ, and others.

Figure 1B:
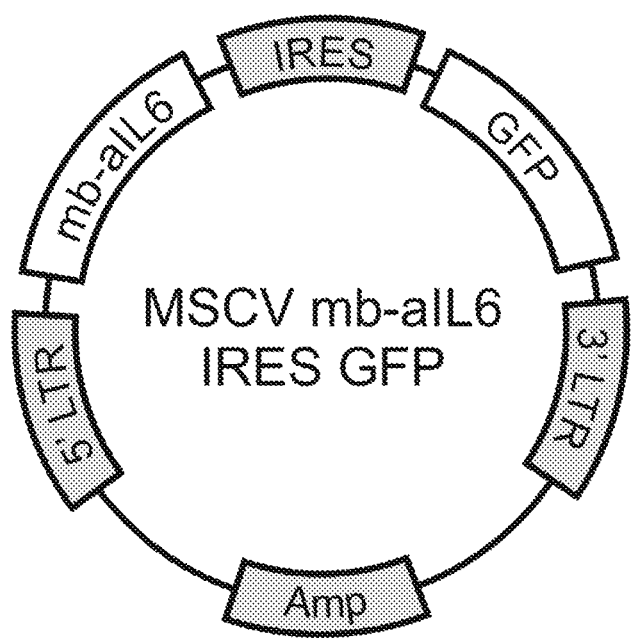

FIG. 1A illustrates a particular construct that is an anti-IL6 single-chain variable fragment (anti-IL6 scFv) coupled to a hinge and transmembrane domain. The anti-IL6 scFv includes an anti IL-6 variable light chain domain, an anti IL-6 variable heavy chain domain, and a linker domain joining the variable light chain domain and the variable heavy chain domain. The relative positions of the variable light and variable heavy chain domain can be reversed, but they are both N' terminal to a transmembrane domain, illustrated in FIG. 1A as a CD8α hinge and transmembrane domain. The construct can also include an N-terminal signal peptide (not shown in FIG. 1A), such as a CD8α signal peptide. FIG. 1B is a schema for a MSCV mb-aIL6-IRES-GFP plasmid.

A variety of linker domains are suitable. In some embodiments, the linker domain can be $(G4S)_x$, wherein x is an integer from 1 to 100. In some embodiments, the linker domain can be $(G4S)_3$. In other embodiments, the linker domain can be one or more glycine residues. In other embodiments, the linker domain can be $(EAAAK)_3$.

A variety of hinge and transmembrane domains are suitable. In some embodiments, the hinge domain can be a CD8α hinge domain. In some embodiments, the transmembrane domain can be a CD8α transmembrane domain. In some embodiments, the hinge and transmembrane domain can be a CD8α hinge and transmembrane domain. In some embodiments, the hinge can be a plurality of glycine and serine residues. In some embodiments, the transmembrane domain can be a transmembrane domain from CD4, CD8β, CD16, CD28, CD32, CD34, CD64, CD137, FcεRIγ, OX40, CD3ζ, CD3ε, CD3γ, CD3δ, TCRα, VEGFR2, FAS, or FGFR2B.

Figure 11A:
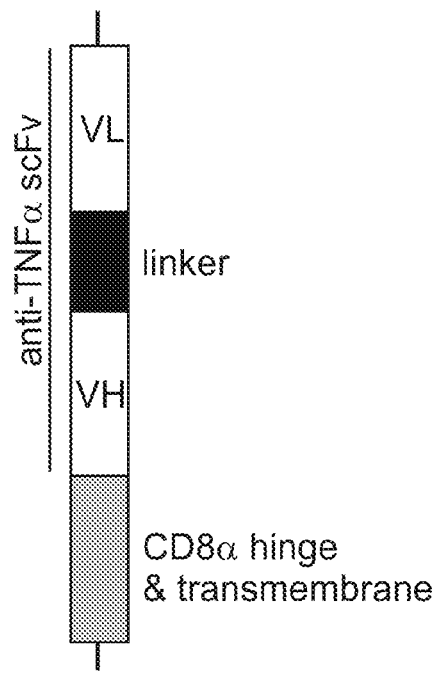
FIGS. 11A-B pertain to design of mb-aTNFα.
Figure 11B:
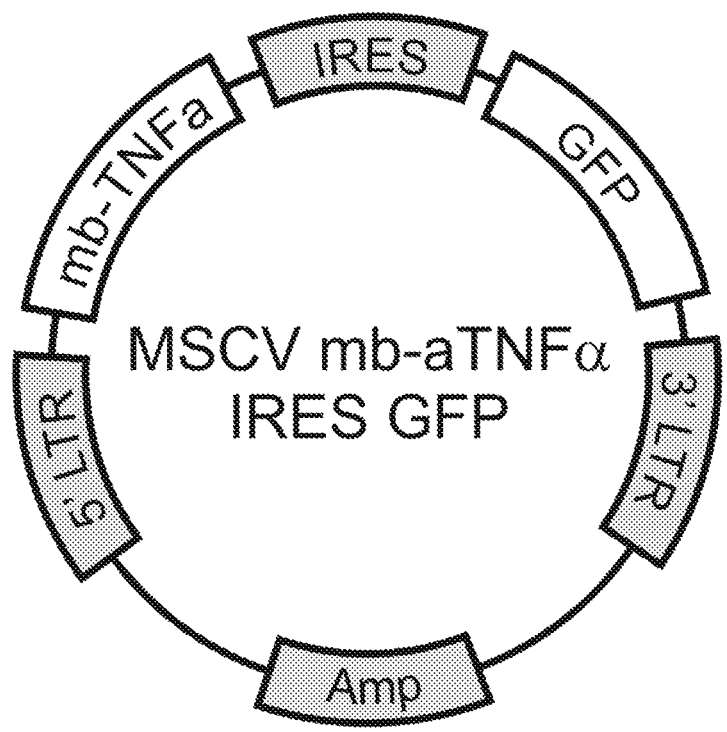

While the embodiment of FIG. 1A is an anti-IL6 construct, a similar approach can be applied to generate constructs for other cytokines, such as tumor necrosis factor (TNF)-α, IL-1β, IL-12, IL-17, IL-18, IFNγ, etc., and/or block their receptors. For example, based on the schema in FIG. 1A, the anti-IL6 scFv portion can be replaced with a different scFv that specifically binds to a different cytokine, such as (TNF)-α (FIG. 11), IL-1β, IL-12, IL-17, IL-18, or IFNγ. All of the teachings herein are equally applicable to constructs for expression of a membrane-bound protein that neutralizes cytokines.

Multiple neutralizing receptors can be expressed on the same cell or in different cell subsets to exert a comprehensive and long-lasting anti-inflammatory effect.

Methods of Making Transgenic Host Cells

Described herein are methods of making a transgenic host cell, such as transgenic T cells. The transgenic host cells can be made, for example, by introducing one or more of the vector embodiments described herein into the host cell.

In one embodiment, the method comprises introducing into a host cell a vector that includes a nucleic acid that encodes a membrane-bound anti-IL6 (mb-aIL6) single-chain variable fragment (scFv). In some embodiments, the nucleic acid of the vector can further encode a chimeric antigen receptor (CAR), such as an anti-CD19-41BB-CD3ζ. In some embodiments, a nucleic acid, such as a bicistronic vector, expresses the mb-aIL6 and the CAR. In some embodiments, two separate vectors can be used to create a transgenic cell, such as a transgenic T cell, that expresses mb-aIL6 and the CAR.

In some embodiments, one or more of the nucleic acids are integrated into the genome of the host cell. In some embodiments, the nucleic acids to be integrated into a host genome can be introduced into the host cell using any of a variety of suitable methodologies known in the art, including, for example, homologous recombination, CRISPR-based systems (e.g., CRISPR/Cas9; CRISPR/Cpf1) and TALEN systems.

Values and Ranges

Unless otherwise indicated or otherwise evident from the context and understanding of one of ordinary skill in the art, values that are expressed as ranges can assume any specific value or subrange within the stated ranges in various embodiments, unless the context clearly dictates otherwise. "About" in reference to a numerical value generally refers to a range of values that fall within ±8%, in some embodiments ±6%, in some embodiments ±4%, in some embodiments ±2%, in some embodiments ±1%, in some embodiments ±0.5% of the value unless otherwise stated or otherwise evident from the context.

Example Embodiments: Vector

An embodiment is a vector that includes a nucleic acid encoding a membrane-bound anti-IL6 (mb-aIL6) single-chain variable fragment (scFv). The mb-aIL6 scFv includes a) an anti-IL6 single-chain variable fragment (anti-IL6 scFv) comprising an anti-IL-6 variable light chain domain, an anti-IL-6 variable heavy chain domain, and a linker domain joining the variable light chain domain and the variable heavy chain domain; and b) a hinge and transmembrane domain coupled to the anti-IL6 scFv.

In some embodiments, one or more of the anti-IL-6 variable light chain domain and the anti-IL-6 variable heavy chain domain are human anti-IL6 variable light and variable heavy chains domains. In some embodiments, the variable light chain domain has at least 90% sequence identity to SEQ ID NO: 4. In some embodiments, the variable heavy chain domain has at least 90% sequence identity to SEQ ID NO: 8.

In some embodiments, the linker domain is $(G4S)_x$, wherein x is an integer from 1 to 100. In some embodiments, the linker domain is $(G4S)_3$. In some embodiments, the linker domain is one or more glycine residues. In some embodiments, the linker domain is $(EAAAK)_3$.

In some embodiments, the hinge and transmembrane domain are CD8α hinge and transmembrane domain. In some embodiments, the hinge comprises a plurality of glycine and serine residues. In some embodiments, the transmembrane domain is a transmembrane domain from CD4, CD8β, CD16, CD28, CD32, CD34, CD64, CD137, FcεRIγ, OX40, CD3ζ, CD3ε, CD3γ, CD3δ, TCRα, VEGFR2, FAS, or FGFR2B.

In some embodiments, the nucleic acid further encodes a chimeric antigen receptor (CAR), such as an anti-CD19-41BB-CD3ζ chimeric antigen receptor (CAR). In some embodiments, the mb-aIL6 is coupled to the anti-CD19-41BB-CD3ζ by a P2A sequence.

Example Embodiments: Vector

Another embodiment is a vector that includes a nucleic acid encoding an anti-IL6 (aIL6) single-chain variable fragment (scFv). The aIL6 scFv includes: a) an anti-IL6 single-chain variable fragment (anti-IL6 scFv) comprising an anti-IL-6 variable light chain domain, an anti-IL-6 variable heavy chain domain, and a linker domain joining the variable light chain domain and the variable heavy chain domain.

Example Embodiments: Vector

Another embodiment is a vector that includes a nucleic acid encoding an anti-IL6 chimeric antigen receptor (CAR). The anti-IL6 CAR includes: a) an anti-IL6 single-chain variable fragment (anti-IL6 scFv) comprising an anti-IL-6 variable light chain domain, an anti-IL-6 variable heavy chain domain, and a first linker domain joining the variable light chain domain and the variable heavy chain domain; b) a second linker domain N-terminal to the anti-IL6 scFv; c) a hinge and transmembrane domain N-terminal to the second linker domain; and d) an intracellular signaling domain N-terminal to the hinge and transmembrane domain.

In some embodiments, the intracellular signaling domain is a 41BB domain.

In some embodiments, the vector further includes a co-stimulatory domain N-terminal to the intracellular signaling domain. In some embodiments, the co-stimulatory domain is a CD3ζ domain.

Example Embodiments: Vector

Another embodiment is a vector that includes a nucleic acid encoding a membrane-bound IL-6 receptor. The membrane-bound IL-6 receptor includes: a) an extracellular domain; b) a linker domain N-terminal to the extracellular domain; c) an IL-6 receptor α domain; and d) a transmembrane domain.

In some embodiments, the extracellular domain is a gp130 extracellular domain.

In some embodiments, the transmembrane domain is a CD8α transmembrane domain.

Example Embodiments: Mammalian T Cell

Another embodiment is a mammalian T cell that includes a transgene encoding a membrane-bound anti-IL6 (mb-aIL6) single-chain variable fragment (scFv), in accordance with any embodiment described herein.

In some embodiments, the mb-aIL6 scFv can include: a) an anti-IL6 single-chain variable fragment (anti-IL6 scFv) comprising an anti-IL-6 variable light chain domain, an anti-IL-6 variable heavy chain domain, and a linker domain joining the variable light chain domain and the variable heavy chain domain; and b) a hinge and transmembrane domain coupled to the anti-IL6 scFv.

In some embodiments, the mammalian T cell is a human T cell. In some embodiments, the mammalian T cell is a human peripheral blood T lymphocyte.

Example Embodiments: Method of Suppressing Proliferation of IL-6-Dependent Cells in a Mammal Another embodiment is a method of suppressing proliferation of IL-6-dependent cells in a mammal. The method includes: expressing in a T cell a membrane-bound anti-IL6 (mb-aIL6) single-chain variable fragment (scFv). The mb-aIL6 scFv can be in accordance with any embodiment described herein.

In some embodiments, the mb-aIL6 scFv includes: a) an anti-IL6 single-chain variable fragment (anti-IL6 scFv) comprising an anti-IL-6 variable light chain domain, an anti-IL-6 variable heavy chain domain, and a linker domain joining the variable light chain domain and the variable heavy chain domain; and b) a hinge and transmembrane domain coupled to the anti-IL6 scFv.

In some embodiments, the mammal is a human.

Example Embodiments: Method of Reducing IL-6 Concentration in a Mammal

Another embodiment is a method of reducing IL-6 concentration in a mammal. The method includes: expressing in a T cell a membrane-bound anti-IL6 (mb-aIL6) single-chain variable fragment (scFv) and contacting the T cell with a fluid containing IL-6. The mb-aIL6 scFv can be in accordance with any embodiment described herein.

In some embodiments, the mb-aIL6 includes: a) an anti-IL6 single-chain variable fragment (anti-IL6 scFv) comprising an anti-IL-6 variable light chain domain, an anti-IL-6 variable heavy chain domain, and a linker domain joining the variable light chain domain and the variable heavy chain domain; and b) a hinge and transmembrane domain coupled to the anti-IL6 scFv.

In some embodiments, the mammal is a human.

In some embodiments, the method further includes culturing the T cell to generate new T cells that express the mb-aIL6.

In some embodiments, the method further includes reducing risk of cytokine release syndrome (CRS), and wherein the T cells of the mammal express a chimeric antigen receptor.

In some embodiments, the chimeric antigen receptor is an anti-CD19-41BB-CD3ζ CAR.

In some embodiments, the chimeric antigen receptor includes an anti-CD22 domain, an anti-CD20 domain, an anti-CD123 domain, a B-cell maturation antigen (BCMA) domain, an anti-mesothelin domain, an anti-CD7 domain, an anti-CD2 domain, an anti-CD5 domain, an anti-CD3 domain, an anti-Lewis Y domain, an anti-EpCam domain, an anti-Her2 domain, an or anti-prostate-specific membrane antigen (PSMA).

In some embodiments, the CAR further includes a 4-1BB domain, a CD3ζ domain, a CD28 domain, an inducible T cell co-stimulator (ICOS) domain, a DNAX-activating protein 10 (DAP10) domain, or a DNAX-activating protein 12 (DAP12) domain.

In some embodiments, the mammal is suffering from an autoimmune disease, and reducing IL-6 concentration in the mammal treats the autoimmune disease.

In some embodiments, the mammal is suffering from rheumatoid arthritis, and reducing IL-6 concentration treats rheumatoid arthritis.

In some embodiments, the mammal is suffering from systemic lupus erythematosus, and reducing IL-6 concentration treats systemic lupus.

In some embodiments, the mammal is suffering from an inflammatory disease, and reducing IL-6 concentration in the mammal treats the inflammatory disease.

In some embodiments, the mammal is suffering from graft-versus-host disease, and reducing IL-6 concentration treats graft-versus-host disease.

In some embodiments, the mammal is suffering from a lymphoproliferative disorder, and reducing IL-6 concentration treats the lymphoproliferative disorder.

In some embodiments, the mammal is suffering from Castleman disease, and reducing IL-6 concentration treats Castleman disease.

Example Embodiments: Vector

In another embodiment, a vector includes a nucleic acid encoding a membrane-bound anti-cytokine single-chain variable fragment (scFv). The membrane-bound anti-cytokine scFv can be in accordance with any embodiment described herein.

In some embodiments, the membrane-bound anti-cytokine includes: a) an anti-cytokine single-chain variable fragment (anti-cytokine scFv) comprising an anti-cytokine variable light chain domain, an anti-cytokine variable heavy chain domain, and a linker domain joining the variable light chain domain and the variable heavy chain domain; and b) a hinge and transmembrane domain coupled to the anti-cytokine scFv.

In some embodiments, the anti-cytokine is anti-(TNF)-α, anti-IL-1β, anti-IL-12, anti-IL-17, anti-IL-18, or anti-IFNγ.

EXEMPLIFICATION

Materials and Methods

Cells

Human cell lines Nalm-6 (B-cell acute lymphoblastic leukemia, ALL), Jurkat (T-cell ALL), THP-1 and U937 (acute monocytic leukemia), DS-1 (B-cell lymphoma) and HEK293T (embryonic kidney fibroblasts) were purchased from the American Type Culture Collection (Manassas, VA). The B-ALL cell line OP-1 was developed in our laboratory.[11] Nalm-6, OP-1, THP-1, U937 and Jurkat cells were maintained in RPMI-1640 (ThermoFisher Scientific, Waltham, MA), supplemented with 10% fetal bovine serum (FBS) (HyClone GE Healthcare, Logan, UT) and 1% penicillin/streptavidin (P/S) (PAN-Biotech, Aidenbach, Germany). DS-1 cells were maintained in RPMI-1640 supplemented with 10% FBS, 1% P/S and 1 ng/mL interleukin-6 (IL-6) (ThermoFisher Scientific). HEK-293T was maintained in DMEM (HyClone Laboratories) supplemented with 10% FBS and 1% P/S.

DS-1 and Nalm-6 were transduced with a murine stem cell virus (MSCV)-internal ribosome entry site (IRES)-green fluorescent protein (GFP) retroviral vector (obtained from the St. Jude Children's Research Hospital Vector Development and Production Shared Resource, Memphis, TN), containing the firefly luciferase gene and selected for GFP expression with a MoFlo cell sorter (Beckman Coulter, Brea, CA). DS-1 and OP-1 were transduced with a MSCV- IRES-GFP retroviral vector containing mCherry and selected for mCherry expression with a MoFlo cell sorter.

To induce differentiation of THP-1, $2\times10^6$ THP-1 cells were cultured in 10 mL of RPMI-1640 supplemented with 10% FBS, 1% P/S, and 20 ng/ml phorbol 12-myristate 13-acetate (PMA) for 72 hours. The differentiated THP-1 cells were subsequently harvested using 1% EDTA (Merck, Kenilworth, NJ).

Peripheral blood mononucleated cells were isolated by density gradient from discarded, anonymized by-products of platelet donations provided by the National University Hospital Blood Donation Centre. Mononucleated cells were cultured with Dynabeads Human T-Activator CD3/CD28 (ThermoFisher) in RPMI-1640 supplemented with 10% FBS, 1% P/S and 120 IU/ml interleukin-2 (IL-2) (Novartis, Basel, Switzerland) for 3 days. On day 4, anti-CD3/CD28 beads were removed and cells were restimulated with fresh anti-CD3/CD28 beads. Expanded T-cells were subsequently cultured in RPMI-1640 supplemented with 10% FBS, 1% P/S and 120 IU/ml IL-2.

Plasmids and Retroviral Transduction

The heavy chain and light chain domains of the anti-IL6 scFv in mb-aIL6 were derived from the published sequence of the human anti-IL6 monoclonal antibody AME-19a and joined with a 15 amino acid [(G4S)$_3$] linker to form a single chain variable fragment (scFv); the construct was synthesized by Genscript (Nanjing, China). The scFv was linked to the CD8α hinge and transmembrane domain ("mb-aIL6"). The anti-CD19-41BB-CD3ζ construct was previously developed in our laboratory.[12] The P2A sequence used to link mb-aIL6 and anti-CD19-41BB-CD3ζ was previously reported.[13] All constructs were subcloned into pMSCV-IRES-GFP between EcoRI and XhoI.

Preparation of retroviral supernatant and transduction were performed as previously described.[14] Briefly, T-cells were incubated with retroviral supernatant in the presence of RetroNectin (Takara, Kusatsu, Japan) at 37° C. Retroviral supernatant was replaced with freshly harvested supernatant every 12 hours thereafter for the next three days. Transduced T-cells were subsequently harvested and cultured in RPMI-1640 supplemented with 10% FBS, 1% P/S and 200 IU/mL IL-2.

Surface Staining of Transduced Cells

Surface expression of mb-aIL6 and anti-CD19-41BB-CD3c was detected by flow cytometry. For mb-aIL6, biotin-conjugated goat anti-human F(ab)'2 (Jackson ImmunoResearch, West Grove, PA) was used followed by secondary staining with allophycocyanin (APC)-conjugated streptavidin (BD Biosciences, San Jose, CA). Cells were also labeled with human IL-6 conjugated to biotin (Abcam, Cambridge, UK), followed by streptavidin-APC; soybean-trypsin inhibitor conjugated to biotin (from R&D, Minneapolis, MN) was used as a negative control. CD19-myc, a soluble fusion protein produced by our laboratory containing the extracellular domain of human CD19 linked to a myc-tag, was used to specifically detect anti-CD19-41BB-CD3ζ. T-cells were incubated with CD19-myc for 30 minutes, followed by R-phycoerythrin (PE)-conjugated anti-myc (Cell Signaling Technology, Danvers, MA). For cell immunophenotyping, T-cells were labeled with anti-CD3 APC, anti-CD56 PE, anti-CD4 V450, and anti-CD8 PerCP (BD Biosciences). Cell staining was analyzed using Accuri C6 or Fortessa flow cytometers (BD Biosciences).

IL-6 Depletion Assays

To measure IL-6 depletion, $2\times10^6$ T cells were cultured in 1 mL RPMI-1640 containing 1 ng IL-6 for 2 hours. In another experiment, 0.5-$2\times10^6$ T cells were cultured in 1 mL RPMI-1640 containing 10 IU IL-6 for 2 hours. In yet another experiment, $2\times10^6$ T cells were cultured in 1 mL RPMI-1640 containing 1 ng IL-6 for different time intervals of 20 minutes to 2 hours. In a further experiment, $0.5\times10^6$ cells were cultured in 1 mL of RPMI containing 25-200 pg/mL recombinant human IL-6 for 2 hours at 37° C. In another further experiment, $0.2\times10^6$ T cells were cultured in 1 mL RPMI-1640 containing 1 ng IL-6 for 2-72 hours. At the end of the cultures, the supernatant was harvested, filtered with a 0.22 μm filter, and diluted at 1:10. Levels of IL-6 were measured by ELISA using the Human IL-6 Platinum ELISA kit (ThermoFisher). Interpolation from the calculated standard curve was used to determine the concentration of IL-6 in each sample.

For Stat3 phosphorylation measurements, $2\times10^6$ cells were seeded in 1 mL RPMI-1640 containing 10 IU IL-6 for 2 hours. Supernatant was harvested and incubated with $0.2\times10^6$ U937 cells for 15 minutes at 37° C. Lysefix buffer (BD Bioscience) was added and samples were further kept for 10 minutes at 37° C. The cells were then washed and placed in Perm III Buffer for 30 minutes on ice. After three washes, PE-conjugated anti-Stat3 (pY705) antibody (BD Biosciences) was added. After 1 hour, cells were washed and analyzed by flow cytometry.

To determine the effect of IL-6 depletion by mb-aIL6 on the growth of the IL-6-dependent cell line DS-1, $1.5\times10^4$ T cells were incubated with DS-1 cells transduced with mCherry at 1:1 ratio in RPMI-1640 supplemented with 10% FBS, 1% P/S, and 0.5 ng/ml IL-6. For expanded T-cells, 120 IU/ml IL-2 was added. DS-1 cells had been starved for 72 hours before initiation of the experiments. IL-2 and IL-6 were added every 2 days during the culture. A 4× image of each well was captured every 4 hours using the IncuCyte Live Cell Analysis System (Essen Biosciences, Ann Arbor, MI). Cell count was measured using fluorescence and the total red object integrated intensity was used as a measure for the amount of DS-1 mCherry in the well. In other experiments, similar culture were performed with T cells, OP-1 and differentiated THP-1 at a 1:5:1 ratio. Differentiated THP-1 were seeded 1 hour before the beginning of the assay. A 4× image of each well was captured as above using IncuCyte system. After 40 hours, the supernatant from each well was harvested, diluted at 1:5, and IL-6 measured by ELISA as described above.

Interferon-γ (IFNγ) Production, CD107a Expression, Cytotoxicity and Proliferation Assays To test for IFNγ production, $1\times10^5$ T cells were cultured with OP-1 cells at a 1:1 ratio. After 1 hour, GolgiPlug (BD Biosciences) was added to the cells, which were cultured for another 5 hours. After cell membrane permeabilization with 8E, a permeabilization reagent developed in our laboratory, cells were labelled with PE-conjugated anti-human IFNγ antibody (BD Biosciences), and analyzed by flow cytometry.

To measure exocytosis of cytotoxic granules, cells were cultured as described above. At the beginning of the cultures, PE-conjugated anti-human CD107a antibody (BD Biosciences) was added. After 1 hour, GolgiStop (BD Biosciences) was added and the cultures continued for another 3 hours before analysis by flow cytometry.

To test cytotoxicity, OP-1 cells were labelled with calcein-AM Red (Invitrogen, Carlsbad, CA) and plated into a 96-well round-bottom plate. T cells ($1\times10^5$) were added at a 1:1 E:T ratio and co-cultured for 4 hours. Viable target cells (Calcein-AM positive) were counted by flow cytometry, as previously described.[14]

To measure cell proliferation, $1\times10^5$ T cells were co-cultured with irradiated OP-1 at 1:1 E:T ratio in RPMI-1640 supplemented with 10% FBS, 1% P/S and 120 IU/ml IL-2. IL-2 was added every 2 days into each well. On day 7, 14, and 21, T cells were counted by flow cytometry. Fresh irradiated OP-1 cells were added after cell counting to reconstitute the 1:1 E:T ratio.

Xenograft Experiments

DS-1 cells expressing luciferase were injected intraperitoneally (i.p.; 1×10⁶ cells/mouse) in NOD.Cg-Prkdc$^{scid}$ IL2rg$^{tm1Wjl}$/SzJ (NOD/scid IL2RGnull) mice (Jackson Laboratory). Two days after DS-1 inoculation, mice received an i.p. injection of either 1×10⁷ T cells transduced with GFP alone, 1×10⁷ T cells transduced with MSCV-mb-aIL6, or RPMI 1640 with 10% FBS instead of T cells. All mice received 20 000 IU of IL-2 and 1000 IU of IL-6 i.p. every 2 days. Tumor load was determined twice a week using the Xenogen IVIS-200 System (Caliper Life Sciences, Waltham, MA) after injecting aqueous d-luciferin potassium salt (Perkin Elmer, Waltham, MA) i.p. (2 mg per mouse). Luminescence was measured with the Living Image 3.0 software.

Figure 10A:
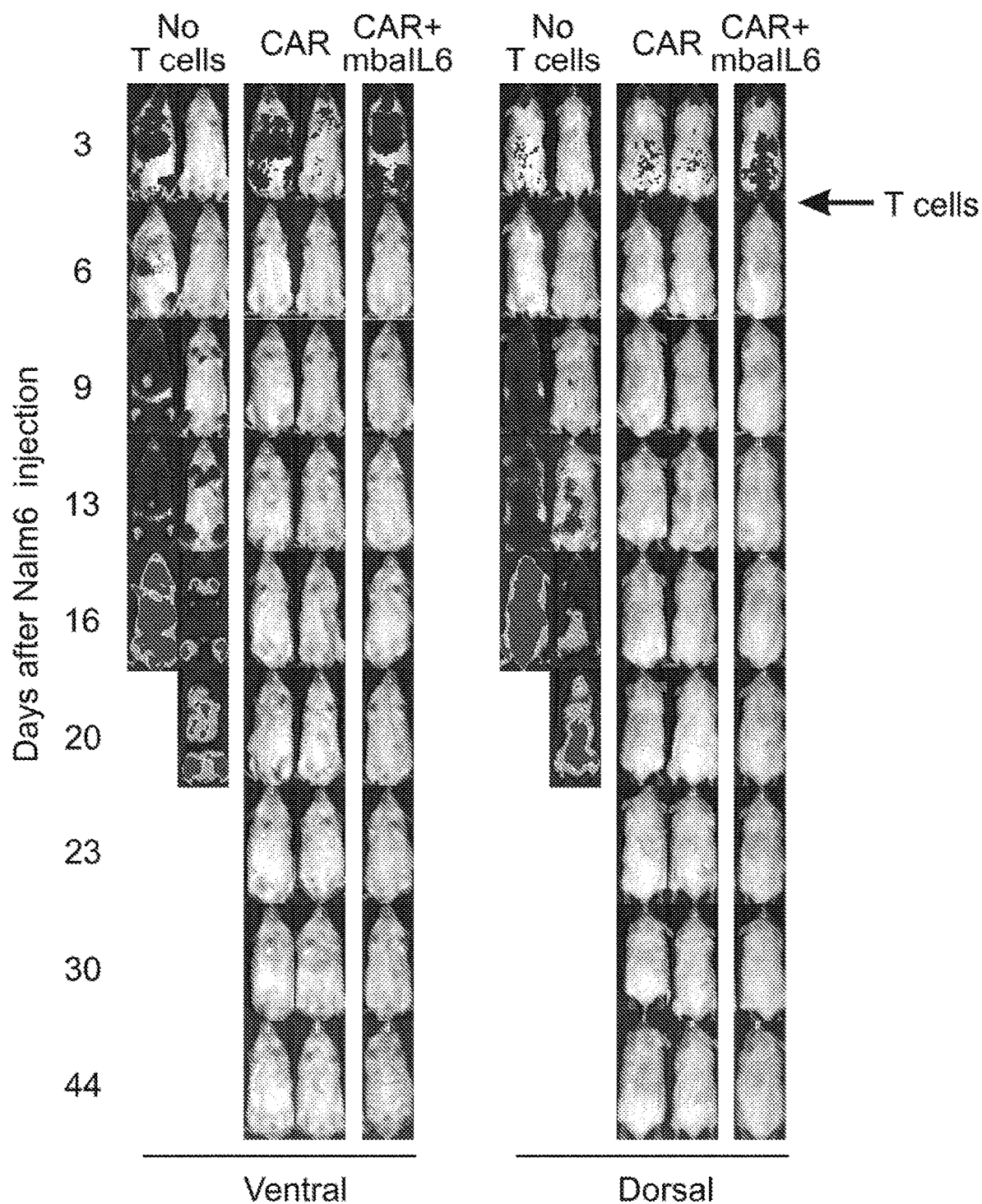
FIGS. 10A-F show that expression of mb-aIL6 does not affect anti-CD19 CAR function in vivo. NOD.Cg-Prkdc$^{scid}$ IL2rg$^{tm1Wjl}$/SzJ (NOD/scid IL2RGnull) mice (Jackson Laboratory, Bar Harbor, ME) were injected intravenously with $0.5 \times 10^6$ Nalm-6 cells on day 0, and $2 \times 10^7$ peripheral blood T-cells transduced with either anti-CD19-41BB-CD3ζ (CAR) or the CAR plus mb-aIL6 (CAR+mb-aIL6) on day 3. Tumor engraftment and growth was measured using the Xenogen IVIS-200 system (Caliper Life Sciences). All mice received 20000 IU human IL-2 every 2 days intraperitoneally starting from day 0. Mice were euthanized when the signal threshold reached $10^{10}$ photons/sec.
Figure 10B:
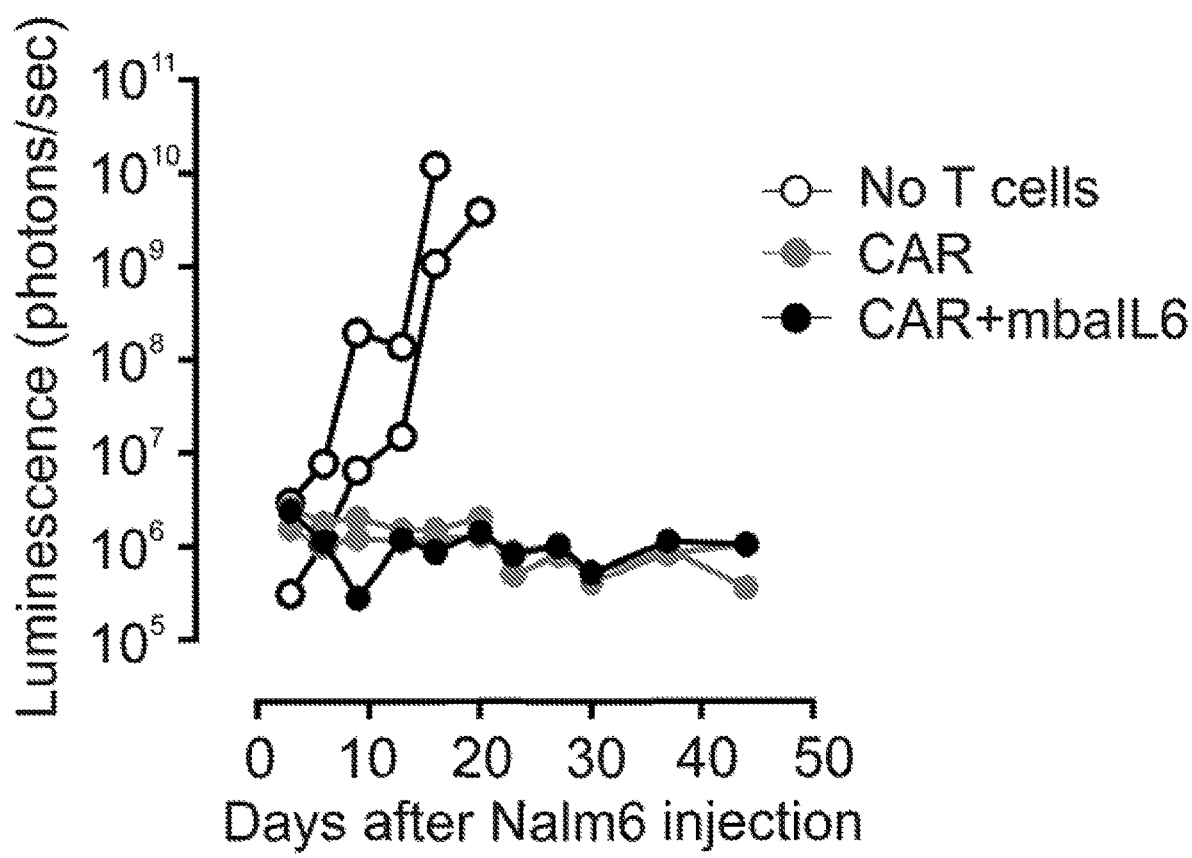
Figure 10C:
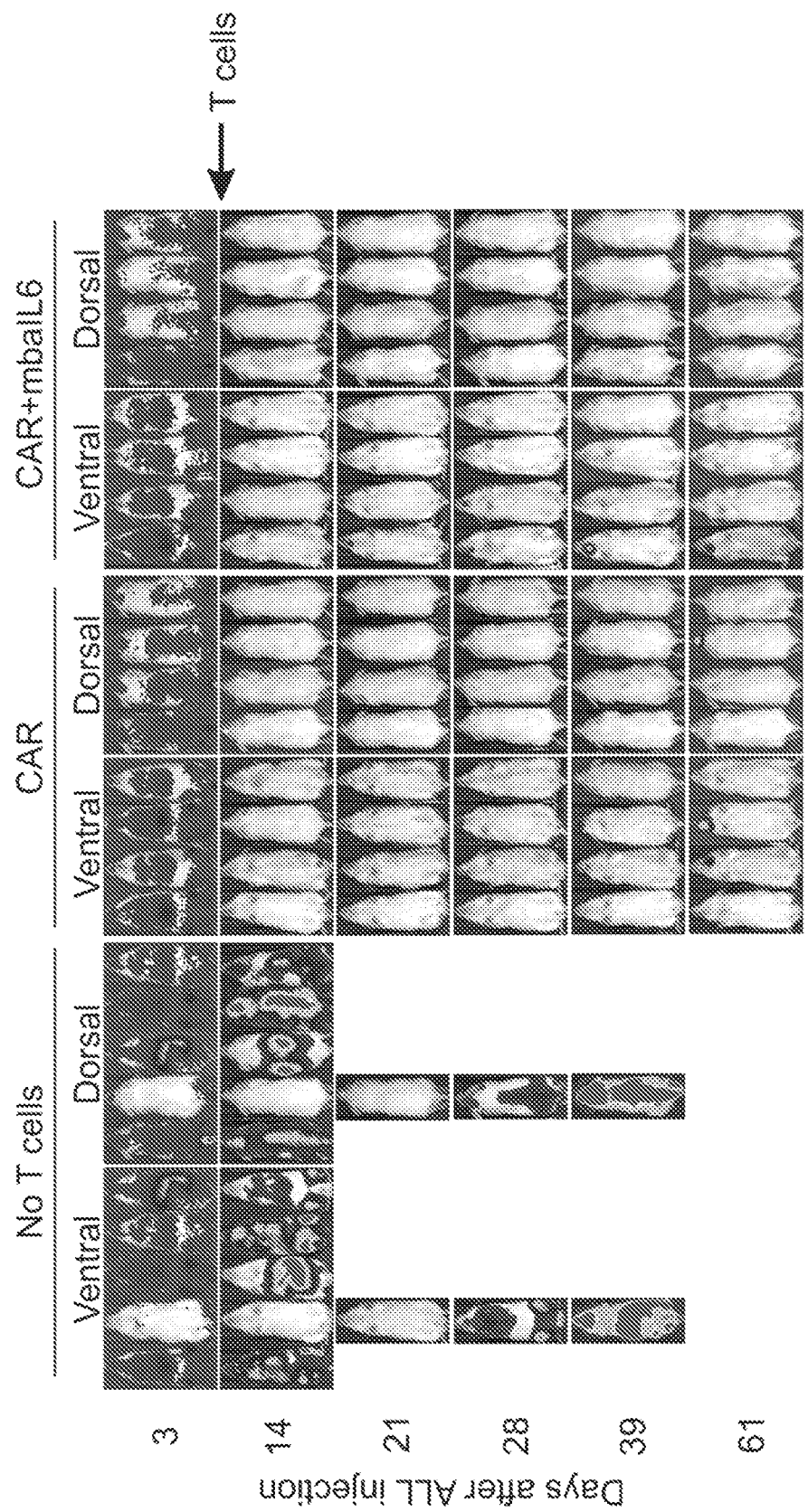
Figure 10D:
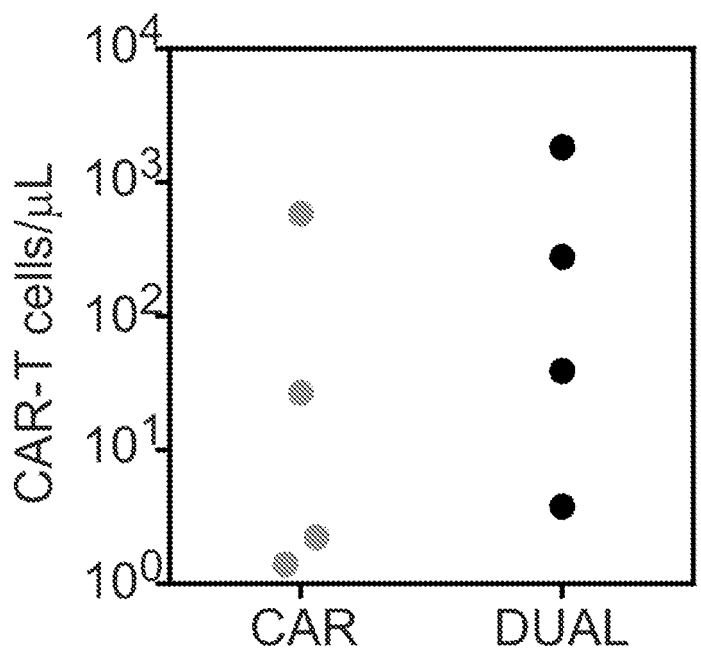
Figure 10E:
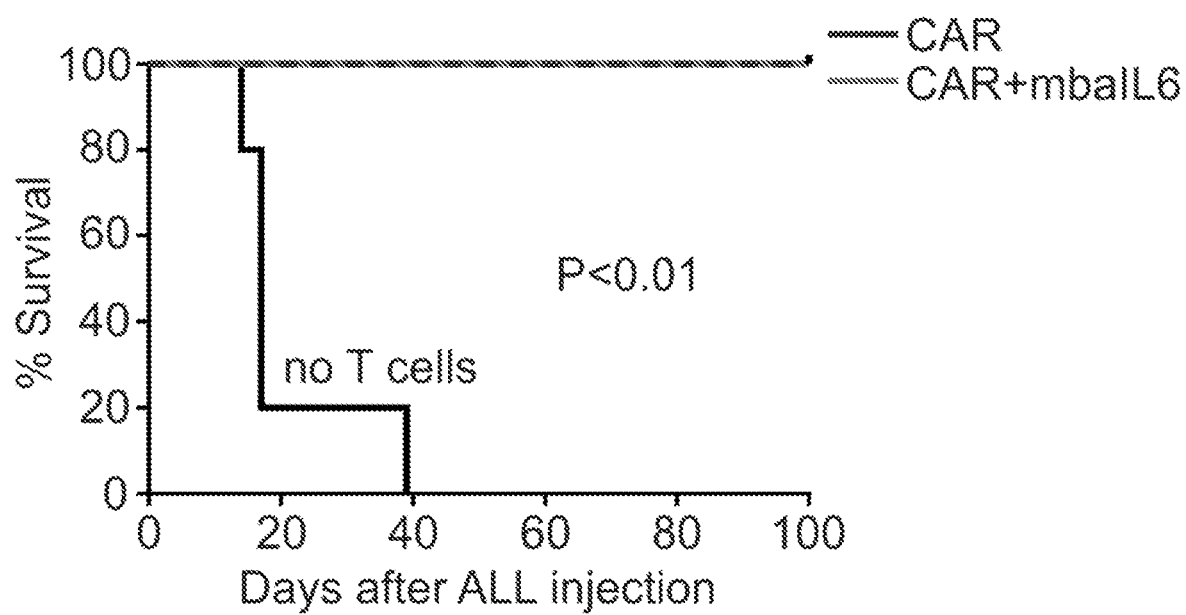
Figure 10F:
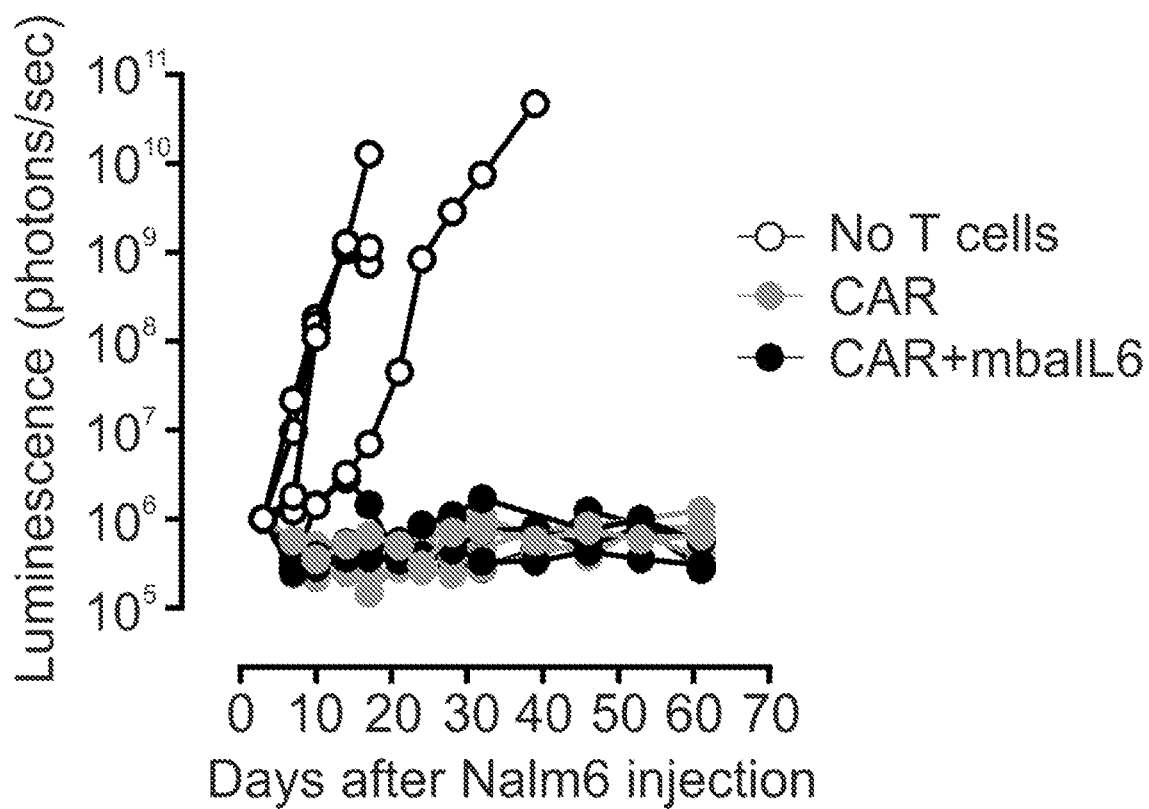

Nalm-6 cells expressing luciferase were injected intravenously (i.v.; 0.5×10⁶ cells/mouse for FIGS. 10A-B, 1×10⁶ cells/mouse for FIGS. 10C-F) in NOD/scid IL2RGnull mice. Three days later, mice received an i.v. injection of either 2×10⁷ T cells transduced with the anti-CD19-41BB-CD3ζ CAR, 2×10⁷ T cells transduced with the construct containing the CAR and mb-aIL6 ("DUAL"), or RPMI 1640 with 10% FBS instead of T cells. All mice received 20 000 IU of IL-2 intraperitoneally every 2 days. Tumor load was determined twice a week using the Xenogen IVIS-200 System (Caliper Life Sciences, Waltham, MA) after injecting aqueous d-luciferin potassium salt (Perkin Elmer, Waltham, MA) i.p. (2 mg per mouse). Luminescence was analyzed with the Living Image 3.0 software.

Results

Design, Expression, and Specificity of Mb-aIL6

Figure 1C:
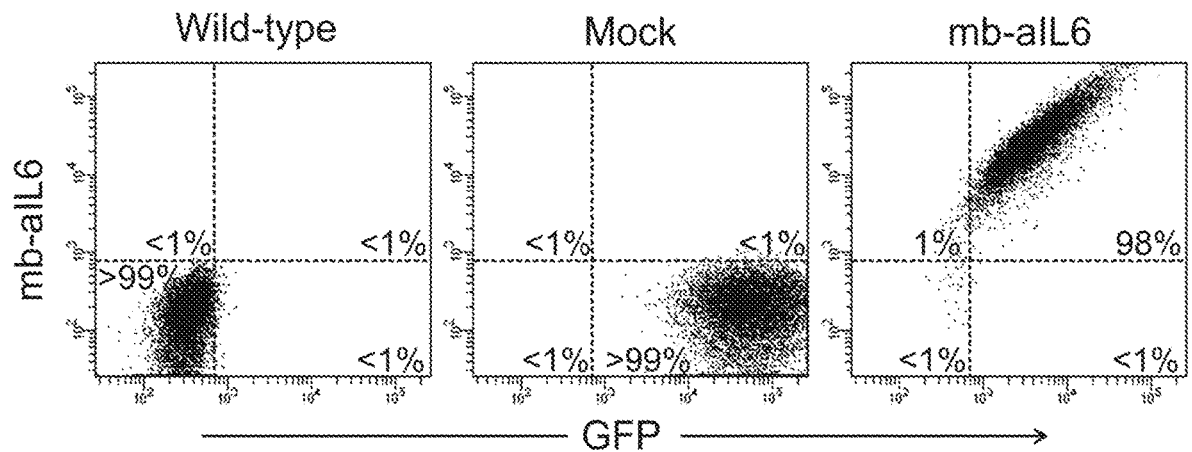

To generate a membrane-bound anti-IL6 construct, a single chain variable fragment (scFv) was synthesized from the sequences of the variable light and heavy chains of the human anti-IL-6 antibody AME-19a and linked to the hinge and transmembrane domains of CD8α (FIG. 1A). The construct was placed in an MSCV retroviral vector containing IRES and GFP (FIG. 1B). This retroviral vector was used to transduce Jurkat T cells. GFP expression was high in cells transduced with the MSCV-mb-aIL6: 98% of cells were GFP-positive. To detect mb-aIL6 on the surface of the transduced Jurkat cells, the cells were labeled with a biotin-conjugated goat anti-human F(ab)' antibody followed by streptavidin-APC. As shown in FIG. 1C, mb-aIL6 was detected in essentially all GFP-expressing Jurkat cells, whereas cells transduced with a vector containing GFP alone ("Mock") were mb-aIL6-negative.

Figure 1D:
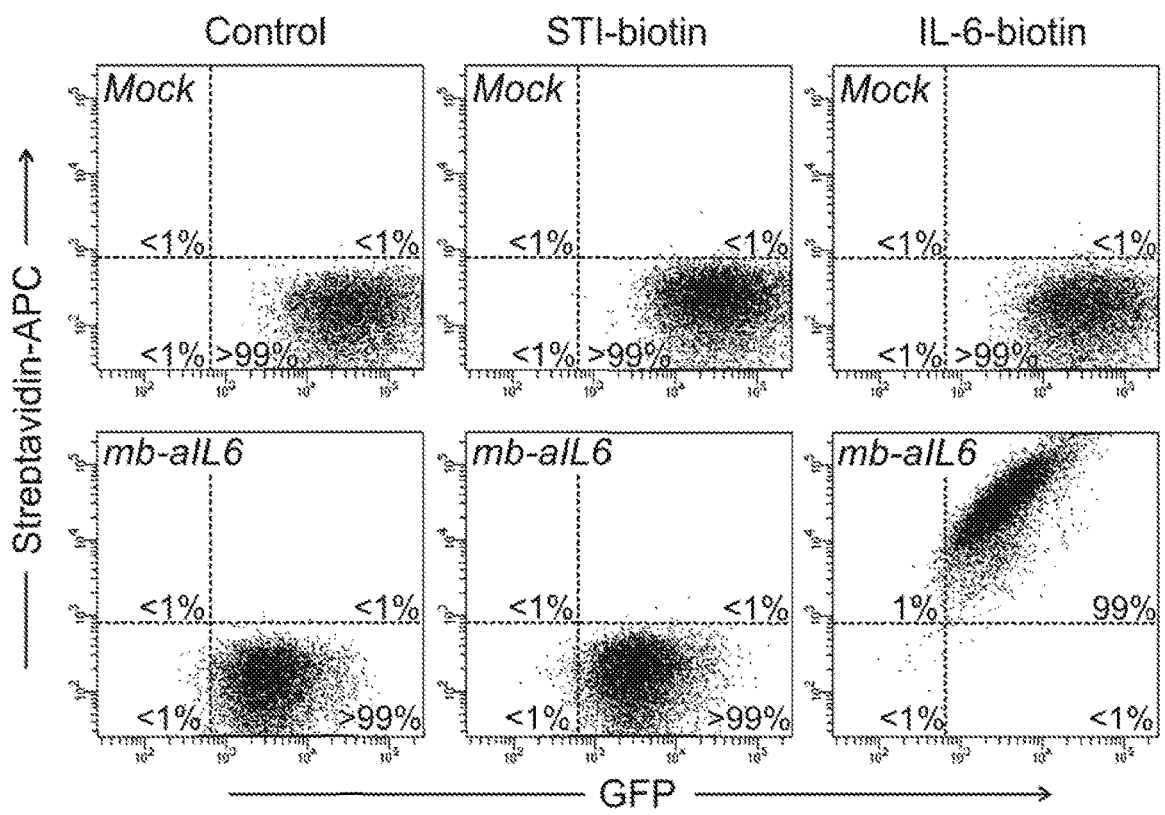

To determine whether mb-aIL6 expressed on the cell surface could bind human IL-6, the transduced Jurkat cells were exposed to biotin-conjugated human IL-6 for 10 minutes; cells were then labelled with streptavidin-APC. As shown in FIG. 1D, mb-aIL6-Jurkat cells bound IL-6 at levels that were proportional to levels of GFP and, hence, receptor expression: 99% of cells bound IL-6, whereas cells labelled with a biotinylated control protein (soybean-trypsin inhibitor) remained unstained.

Neutralization of IL-6 with Mb-aIL6 Cells

Figure 2A:
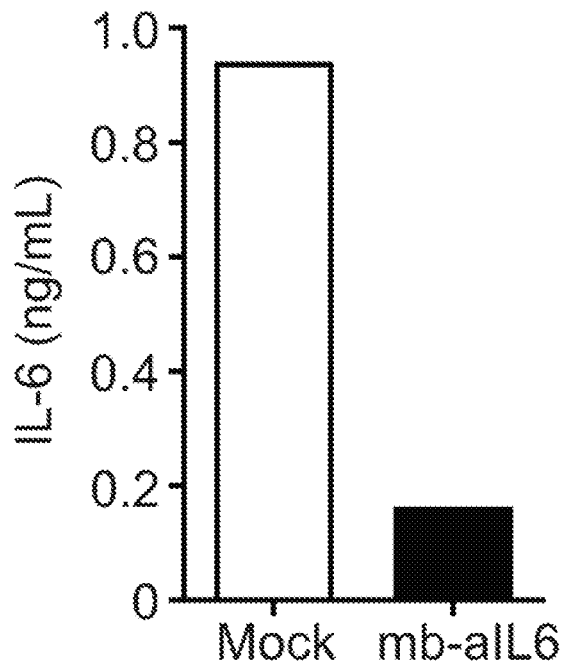
FIGS. 2A-E pertain to functionality of the mb-aIL6 construct.

Binding of mb-aIL6 to IL-6 was corroborated by experiments in which Jurkat cells were cultured for 2 hours in medium containing recombinant human IL-6 (1 ng/mL); residual IL-6 recovered after culture was measured in the supernatant by ELISA. After 2 hours of culture, concentration of IL-6 in the supernatant from the mb-aIL6 Jurkat cells was 0.163 ng/mL versus 0.941 ng/mL in the supernatant of mock-transduced Jurkat cells (FIG. 2A).

Figure 2B:
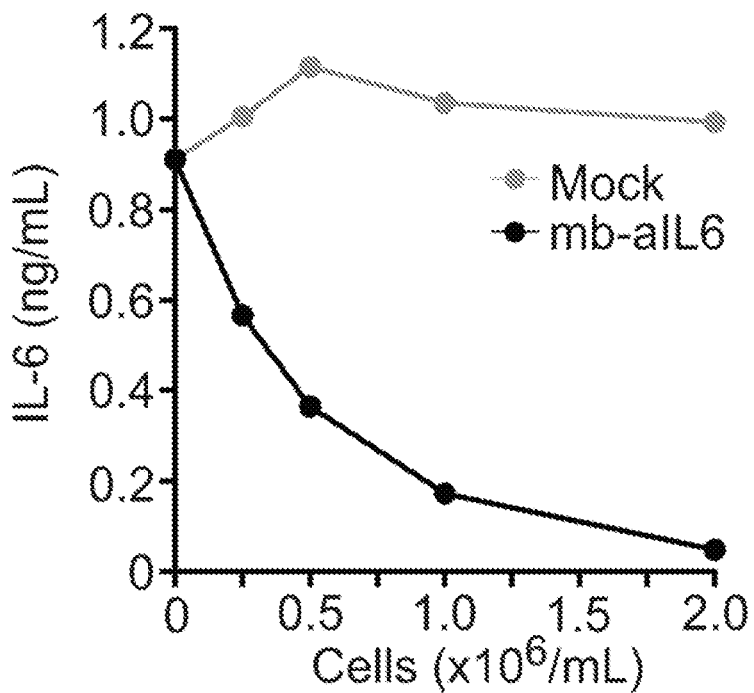
Figure 2C:
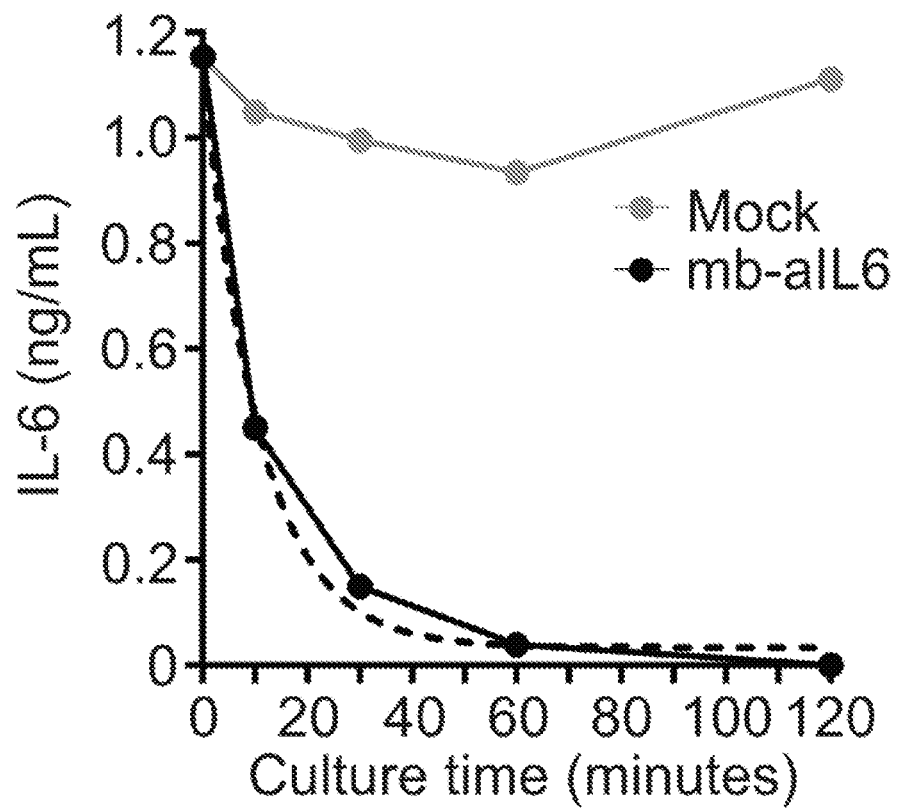

To determine the number of mb-aIL6 Jurkat cells required to neutralize IL-6, increasing concentrations of cells from 0.25×10⁶ cells/mL to 2×10⁶ cells/mL were used. Removal of IL-6 from the supernatant was cell-dose dependent (FIG. 2B). In parallel experiments, the kinetics of IL-6 removal by mb-aIL6 cells was measured. As shown in FIG. 2C, IL-6 neutralization was time-dependent, with nearly 90% being neutralized after 30 minutes, and becoming undetectable after 120 minutes. Notably, the curve fits that of a first order exponential decay curve ($R^2$=0.9957), indicating an IL-6 half-life of 7.443 minutes and a K of 0.09313.

Figure 2D:
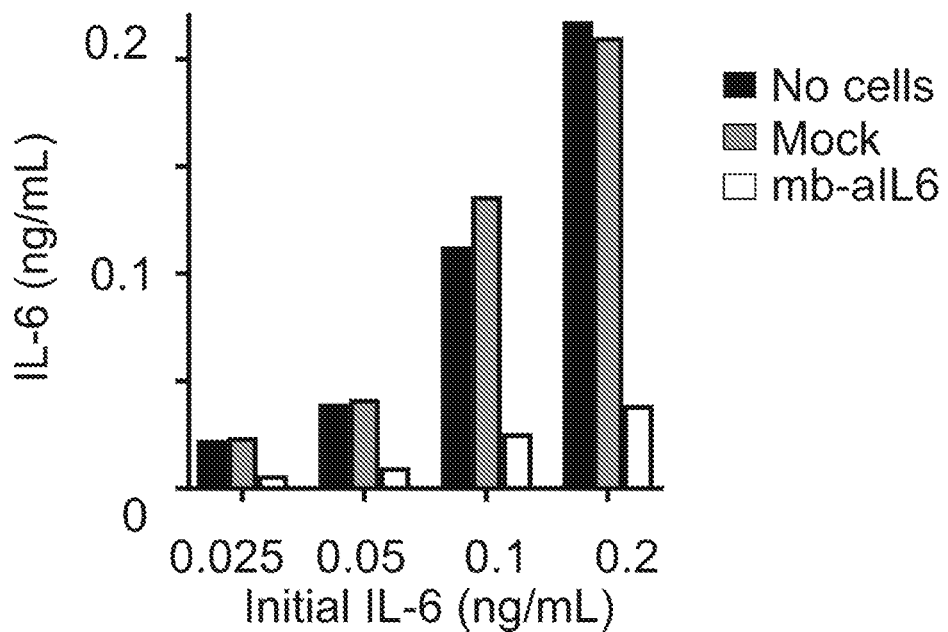

To test whether mb-aIL6 expressing Jurkat cells could also neutralize low concentrations of IL-6, an IL-6 depletion assay was set up using concentrations of IL-6 ranging from 0.025 to 0.2 ng/mL. As shown in FIG. 2D, mb-aIL6 expressing Jurkat cells could neutralize most IL-6 just as well. Consistent with previous experiments, there was a 3.8-5.4 fold decrease in levels of IL-6 across the various concentrations by mb-aIL6 expressing Jurkat cells as compared to mock-transduced cells.

Figure 2E:
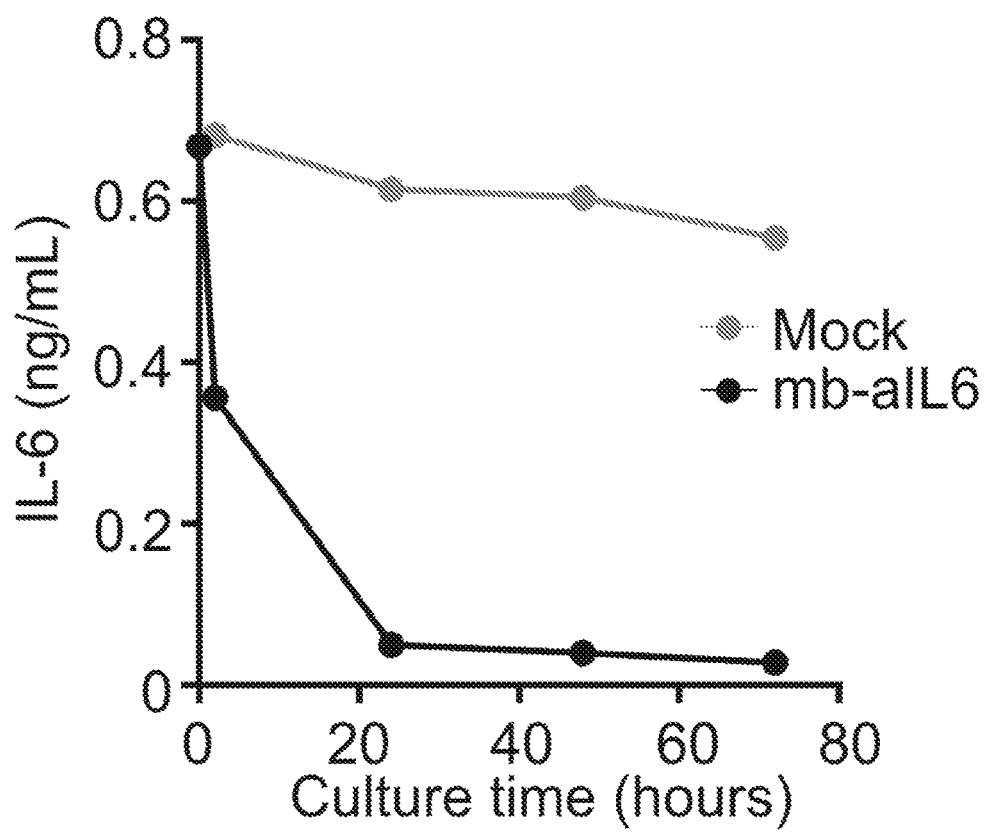

We postulated that cell proliferation would generate new mb-aIL6 cells which would continue to neutralize IL-6 in prolonged cell cultures. To test this notion, we used culture conditions previously determined (FIG. 2B) that were insufficient to neutralize IL-6 in 2 hours, and continue the cultures for 72 hours. At 24 hour, most of the IL-6 had been removed from the supernatant (FIG. 2E).

Functional Consequences of IL-6 Neutralization with Mb-aIL6 T Cells

Figure 3A:
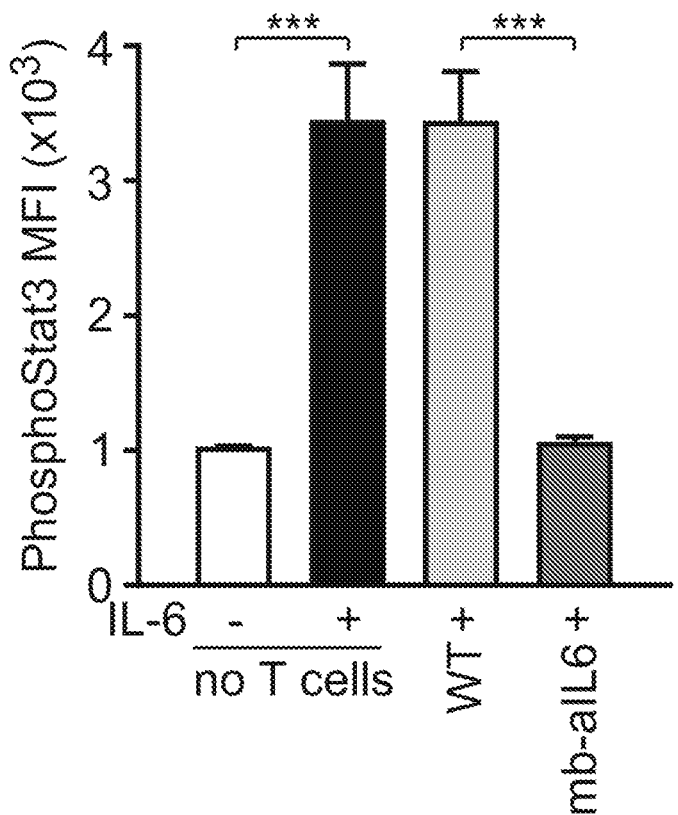
FIGS. 3A-B show that cells expressing mb-aIL6 abrogate IL-6-dependent signal transduction and cell proliferation.

U937 is a monocyte cell line that can be stimulated by IL-6.[15,16] Upon binding to the IL-6 receptor, IL-6 triggers Stat3 phosphorylation.[17] The capacity of IL-6-containing supernatant, after exposure to mb-aIL6- or mock-transduced Jurkat cells for 2 hours, was tested to trigger Stat3 phosphorylation in U937. After 15 minutes of exposure to the supernatant containing 1 ng/mL IL-6, Stat3 phosphorylation was readily detected (P<0.001; n=3; FIG. 3A). A similar levels of phosphorylation was observed if the IL-6 supernatant had been collected from cultures with mock-transduced Jurkat cells (P=not significant). By contrast, when the cultures contained mb-aIL6 Jurkat cells, levels of Stat3 phosphorylation were markedly lower than those measured in U937 cells exposed to IL-6 or to IL-6-containing supernatant of mock-transduced Jurkat cells (P<0.001 for either comparison), and similar to those of unstimulated cells (P=not significant).

Figure 3B:
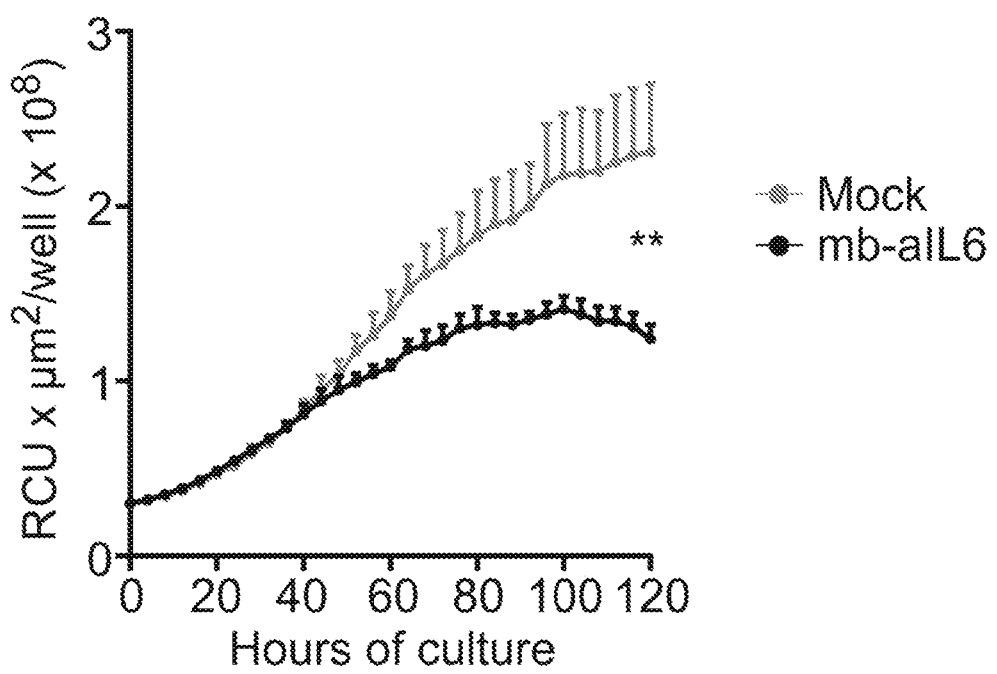

DS-1 is a B-lymphoma cell line whose proliferation requires IL-6.[18] We determined whether co-culture with Jurkat cells expressing mb-aIL6 would affect DS-1 expansion. For this purpose, sequential live cell imaging recording of mCherry-transduced DS-1 cells over 5 days was used. As shown in FIG. 3B, DS-1 cultured in IL-6 containing medium, in the presence of mock-transduced Jurkat rapidly expanded whereas expansion was markedly reduced if mb-aIL6-transduced Jurkat cells were present in the cultures. Under these conditions, DS-1 growth rate was similar to that observed in cultures lacking IL-6, regardless of whether mock- or mb-aIL6-transduced Jurkat cells were present. Collectively, these results corroborate the capacity of cells expressing mb-aIL6 to neutralize the effects of IL-6.

Expression of Mb-aIL6 in Human Peripheral Blood T-Lymphocytes

Figure 4A:
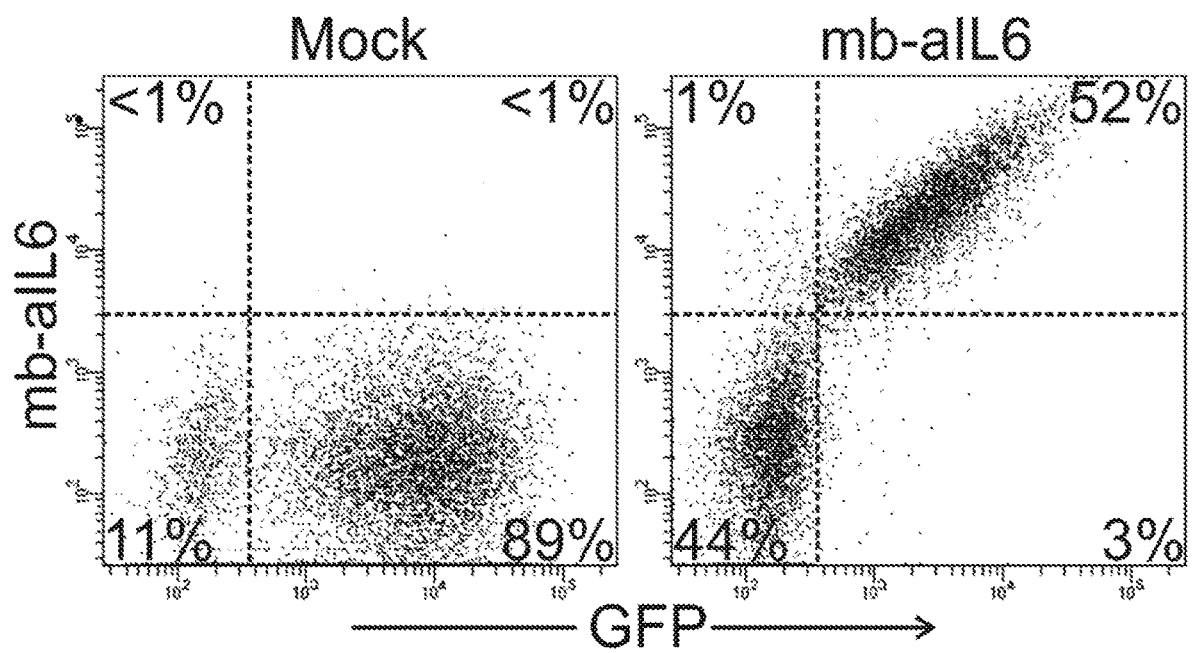
FIGS. 4A-D show expression and functionality of the mb-aIL6 construct on peripheral blood T cells.
Figure 4B:
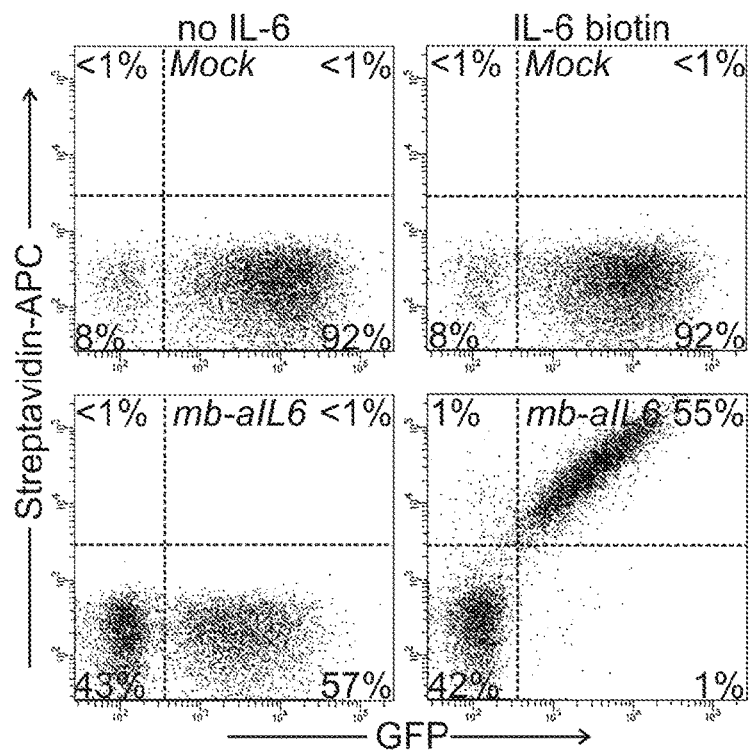
Figure 4C:
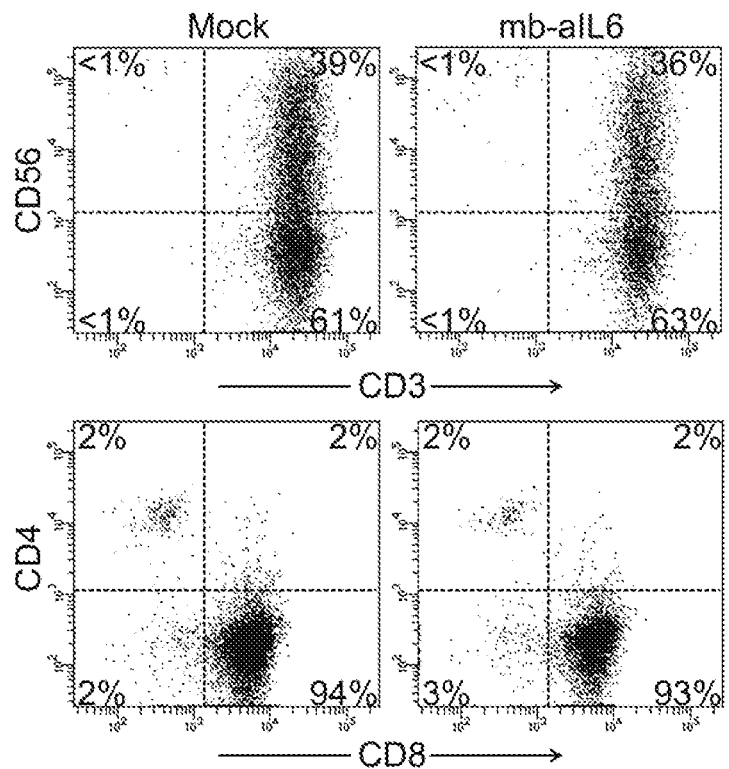

In the next set of experiments, whether mb-aIL-6 could be expressed on the surface of peripheral blood T lymphocytes was determined. For this purpose, peripheral blood mononuclear cells were stimulated with anti-CD3/CD28 beads and then transduced with the MSCV-mb-aIL6 retroviral vector. Cells transduced with a vector containing GFP alone ("Mock") were used as controls. As shown in FIGS. 4A and 4B, mb-aIL6 was highly expressed on the surface of transduced GFP+T lymphocytes, and effectively bound IL-6. The immunophenotype of T cells expressing mb-IL6 remained essentially identical to that of mock-transduced T cells (FIG. 4C).

Figure 4D:
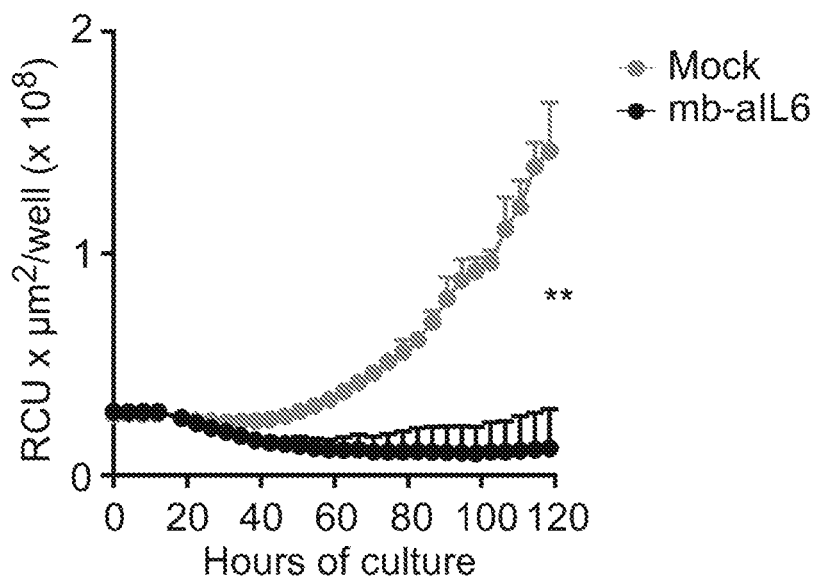

Whether T cells expressing mb-IL6 could suppress the growth of the IL-6-dependent cell line DS-1 was tested. FIG. 4D shows that DS-1 growth was markedly suppressed, indicating that mb-aIL6 expressed in T lymphocytes could neutralize IL-6 as well as Jurkat cells expressing the receptor.

Membrane-Bound Anti-IL-6 and Anti CD19-41BB-CD3z CAR can be Co-Expressed in T Lymphocytes If CAR T cells were to express mb-aIL6 in addition to CARs, this might prevent the occurrence of CRS by neutralizing IL-6 secreted by activated T lymphocytes and by macrophages in the microenvironment.

Figure 5A:
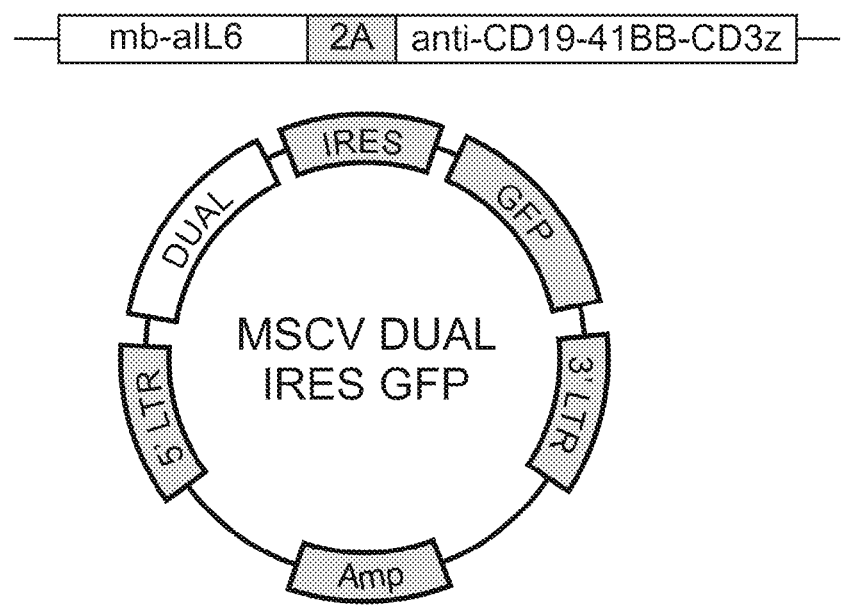
FIGS. 5A-C show the design, expression, and IL-6 neutralizing capacity of a bicistronic construct encoding mb-aIL6 and anti-CD19 CAR.
Figure 5B:
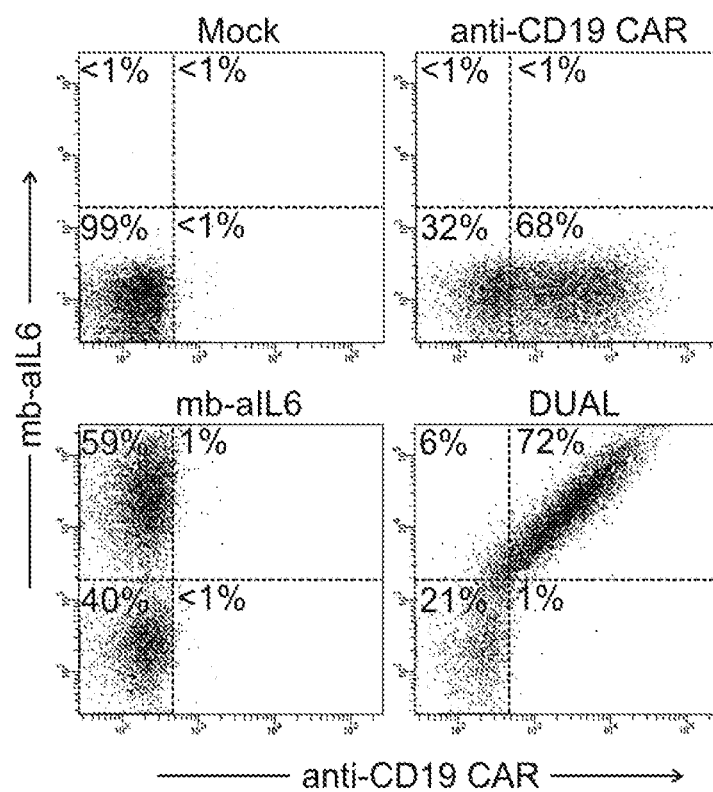
Figure 5C:
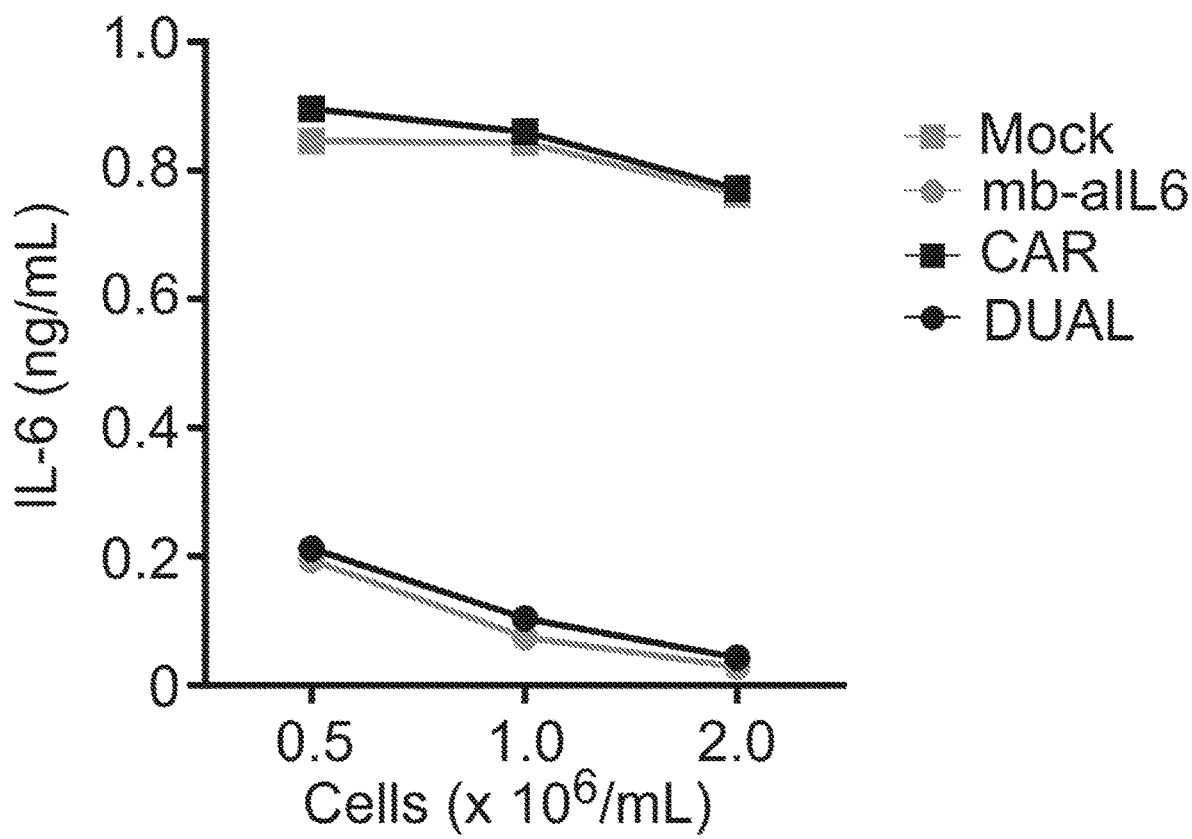

As a first step to test this notion, whether mb-aIL6 and CAR could be effectively expressed simultaneously was determined. To this end, a bicistronic MSCV vector containing genes encoding mb-aIL6 and an anti-CD19-41BB-CD3ζ CAR (FIG. 5A) was developed.[12] To specifically detect the anti-CD19 CAR, the extracellular domain of the human CD19 molecule was linked to a myc tag and cells were stained with an anti-myc antibody. FIG. 5B shows that both mb-aIL6 and the anti-CD19 CAR could be expressed at high levels in peripheral blood T cells. As with mb-aIL6 expressed alone, mb-aIL6 expressed in conjunction with the CAR effectively neutralized IL-6 (FIG. 5C).

Expression of Mb-aIL6 does not Affect CAR T-Cell Function

Figure 6A:
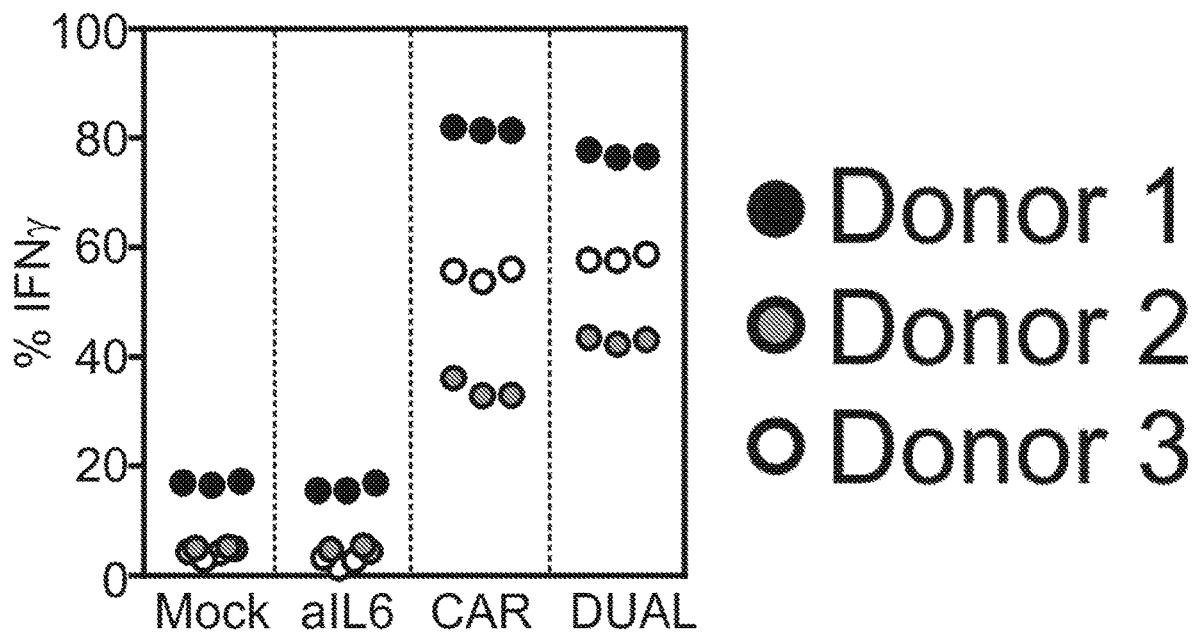
FIGS. 6A-D show expression of mb-aIL6 does not affect anti-CD19 CAR function.

Whether expression of mb-aIL6 and IL-6 neutralization would affect the T cell functions activated by the CAR was determined. Using T lymphocytes from 3 donors expressing either mb-aIL6 or anti-CD19 CAR and T cells expressing both receptors, production of IFNγ after co-culture with CD19+ target cells OP-1 was tested. Production of IFNγ in cells expressing the CAR was high, regardless of whether mb-aIL6 was expressed, whereas T cells expressing mb-aIL6 alone secreted levels of IFNγ similar to those of mock-transduced cells (FIG. 6A).

Figure 6B:
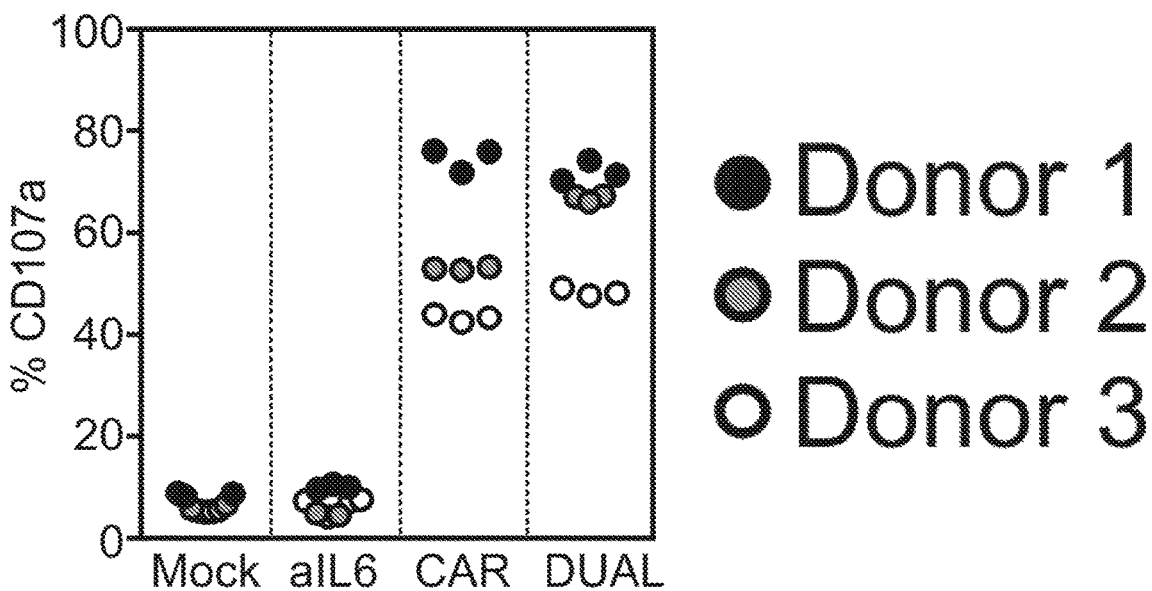
Figure 6C:
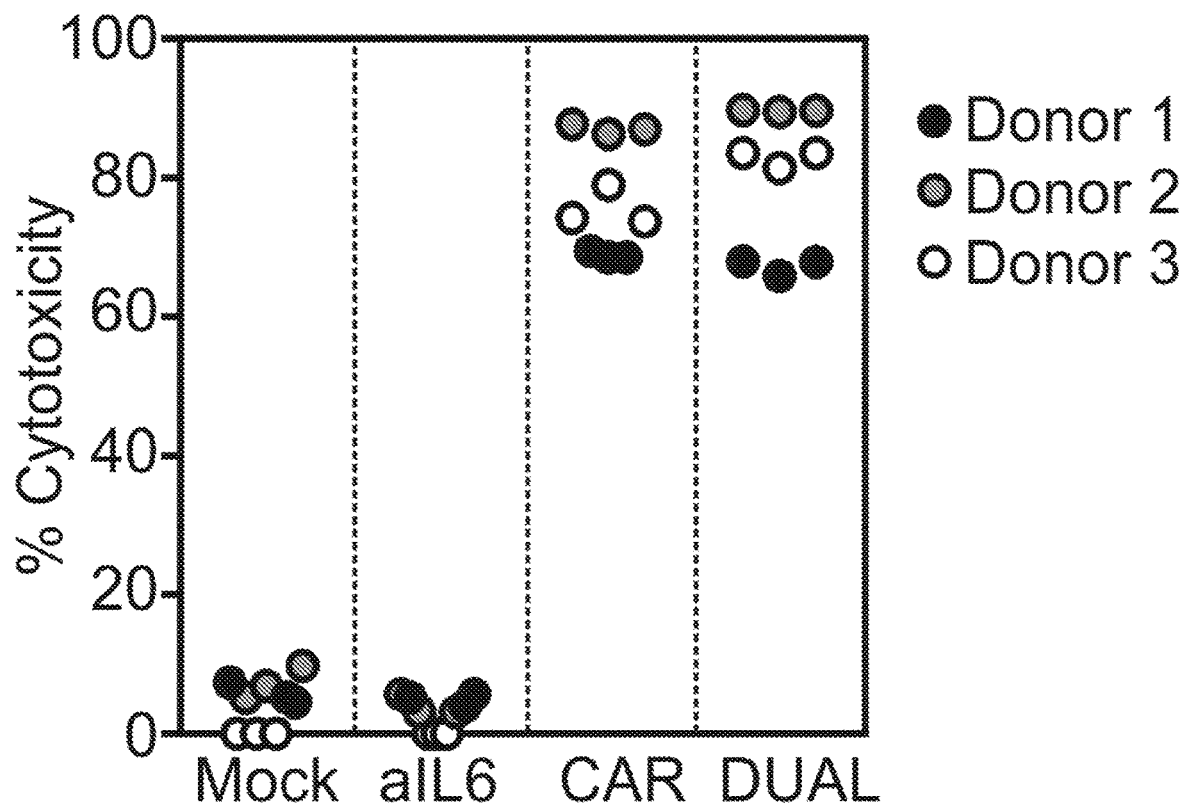

In the presence of CD19+ target cells, CAR-expressing cells released cytotoxic granules as evidenced by staining with the anti-CD107a antibody. Percentage of CD107a+ cells was similar, regardless of mb-aIL6 expression, while cells expressing mb-aIL6 alone remained CD107a-negative (FIG. 6B). In line with this result, percent cytotoxicity against CD19+ targets driven by the CAR remains unchanged by the presence of mb-aIL6 (FIG. 6C).

Figure 6D:
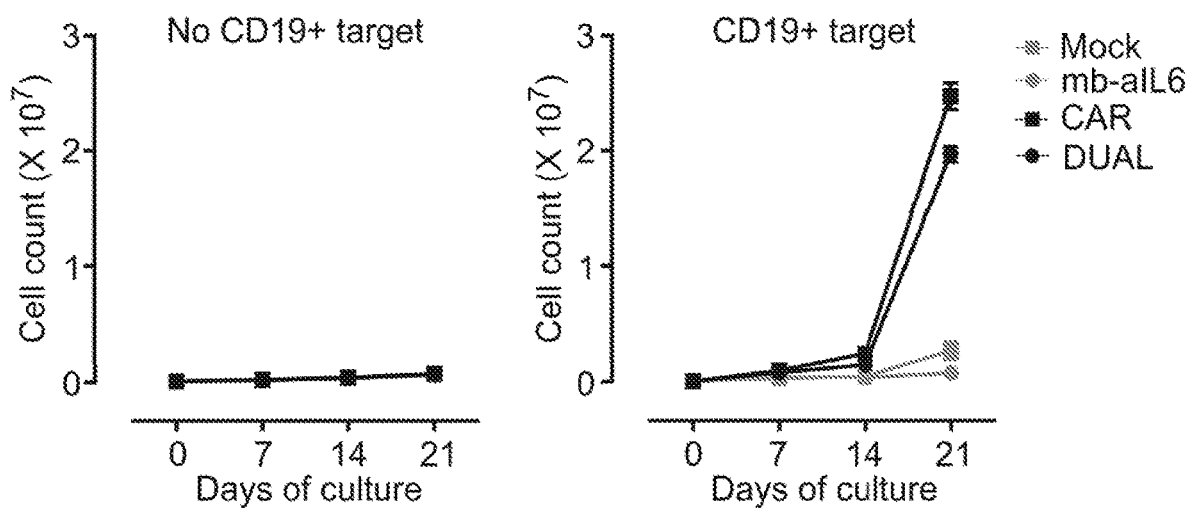

An important functional property of second- and later-generation CARs is the capacity to provide co-stimulation and sustain prolonged T cell proliferation.[19] As shown in FIG. 6D, anti-CD19 CAR-T cells proliferated for 4 weeks in the presence of CD19+ target cells, and the rate of proliferation was similar in cells with and without mb-aIL6. By contrast, cells transduced with mb-aIL6 only and mock-transduced cells did not expand, and expansion did not occur in the absence of target cells regardless of CAR expression. Together, these results indicate that expression of mb-aIL6 does not affect CAR-driven T cell secretion of IFNγ, specific cytotoxicity or cell proliferation.

T Cells Expressing Mb-aIL6 and CAR can Kill Target Cells while Neutralizing IL-6

During CRS triggered by CAR activation, IL-6 secreted by macrophages contributes to its severity.[10]

Figure 7A:
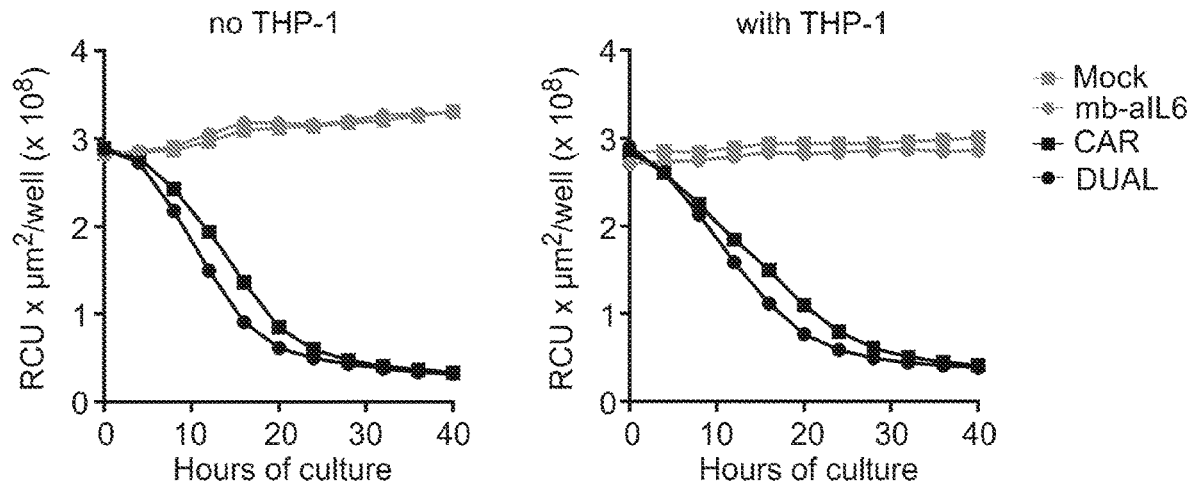
FIGS. 7A-B show the function of T cell expressing mb-aIL6 and anti-CD19 CAR in an in vitro model of CRS.
Figure 7B:
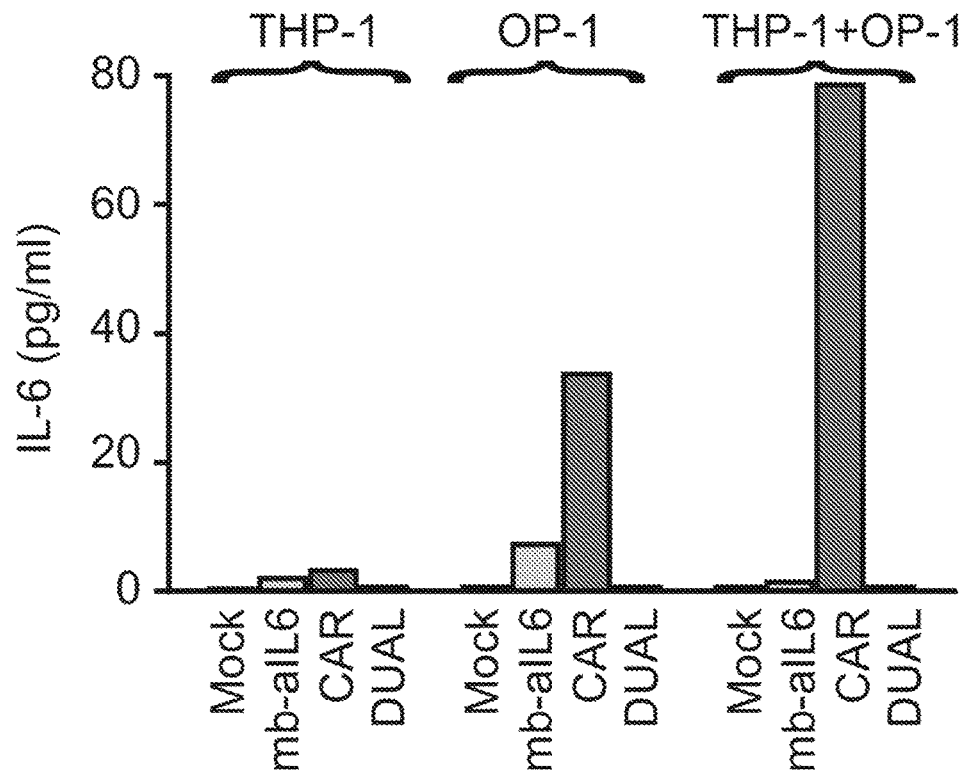

To mimic the interaction between CAR-T cells and macrophages, CAR-T cells were co-cultured with the monocyte cell line THP-1, which secretes IL-6 in the presence of TNF-α and IFNγ;[20] the latter cytokines, together with IL-6, are secreted by T-lymphocytes upon activation.[9,21] Thus, T-lymphocytes transduced with mb-aIL6 and/or anti-CD19 CAR, THP-1, and CD19+ leukemic cells OP-1 were co-cultured for 40 hours (FIG. 7A). Killing of OP-1 cells and levels of IL-6 in the supernatant were monitored. As shown in FIG. 7B, CAR T cells effectively kill OP-1 regardless of mb-aIL6 expression or presence of THP-1. Remarkably, levels of IL-6 were considerably elevated in cultures containing both CAR-T and THP-1 cells but these were essentially undetectable if the CAR-T cells also expressed mb-aIL6.

Xenograft Experiments

Figure 9A:
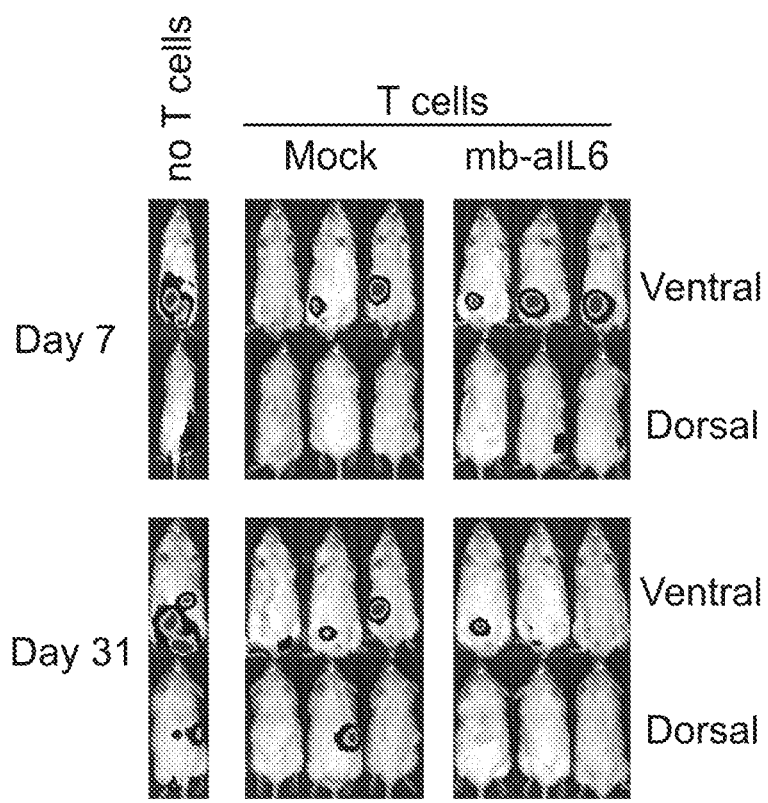
FIGS. 9A-B show expression of mb-aIL6 in T cells neutralizes IL-6 in vivo. NOD.Cg-Prkdc$^{scid}$ IL2rg$^{tm1Wjl}$/SzJ (NOD/scid IL2RGnull) mice (Jackson Laboratory, Bar Harbor, ME) were injected intraperitoneally with $1 \times 10^6$ DS-1 cells on day 0, and $1 \times 10^7$ peripheral blood T-cells transduced with either GFP alone (Mock) or GFP plus mb-aIL6 on day 2. Tumor engraftment and growth was measured using the Xenogen IVIS-200 system (Caliper Life Sciences). All mice received 1000 IU human IL-6 and 20000 IU human IL-2 every 2 days intraperitoneally starting from day 0.
Figure 9B:
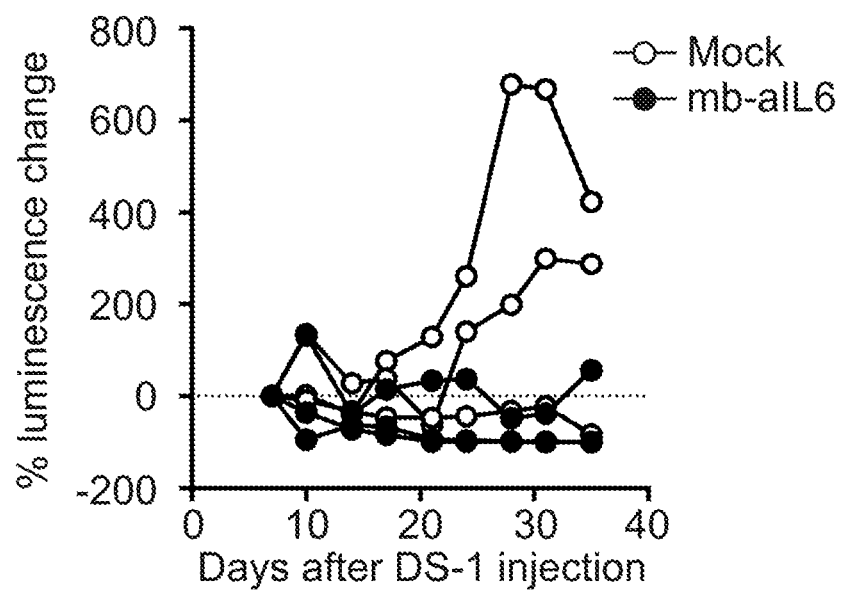

To determine the capacity of mb-aIL6 expressing T lymphocytes to neutralize IL-6 in vivo, experiments with NOD/scid IL2RGnull mice engrafted with luciferase-labeled DS-1 cells were performed. Tumor growth was measured by live imaging, and compared mice that received T cells transduced with GFP alone and mice that received T cells transduced with mb-aIL6. In two of three mice that received mb-aIL6 transduced T cells, there was a reduction in tumor burden, while tumor burden in mice that received mock-transduced T cells remained stable or increased (FIGS. 9A-B).

Whether expression of mb-aIL6 affected the antitumor capacity of anti-CD19 CAR T cells was tested. Experiments were performed with NOD/scid IL2RGnull mice engrafted with luciferase-labeled Nalm-6 cells. Tumor growth was measured by live imaging and compared mice that received T cells transduced with CAR alone and mice that received T cells transduced with the bicistronic construct containing CAR and mb-aIL6. CAR T cells exerted anti-leukemic activity regardless of whether mb-aIL6 was expressed (FIGS. 10A-F). Together, these results suggest that mb-aIL6 can neutralize IL-6 in vivo, and does not significantly affect CAR function.

Discussion

The results of this study indicate that mb-aIL6 carried by T lymphocytes is a powerful neutralizer of IL-6. Importantly, mb-aIL6 can be expressed on T lymphocytes in combination with CARs without affecting CAR potency. To this end, CAR-T cells expressing mb-aIL6 should have less risk of triggering severe CRS, while retaining their anti-tumor potential.

Figure 8A:
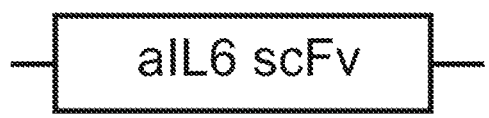
FIG. 8A-C are schematics of other IL-6 neutralizing receptors.
Figure 8A:
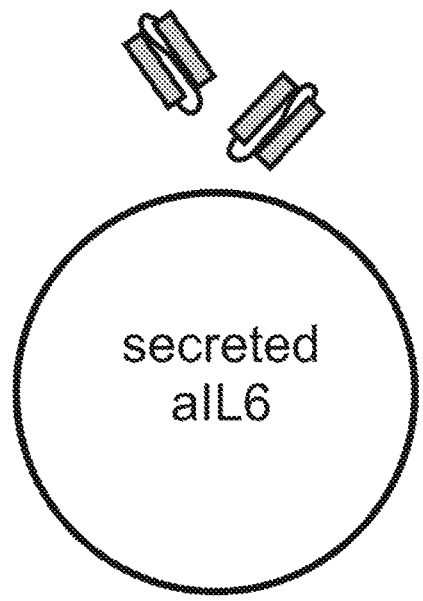
Figure 8B:
Figure 8B:
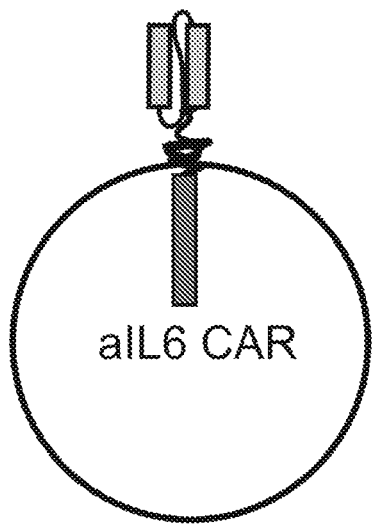
Figure 8C:
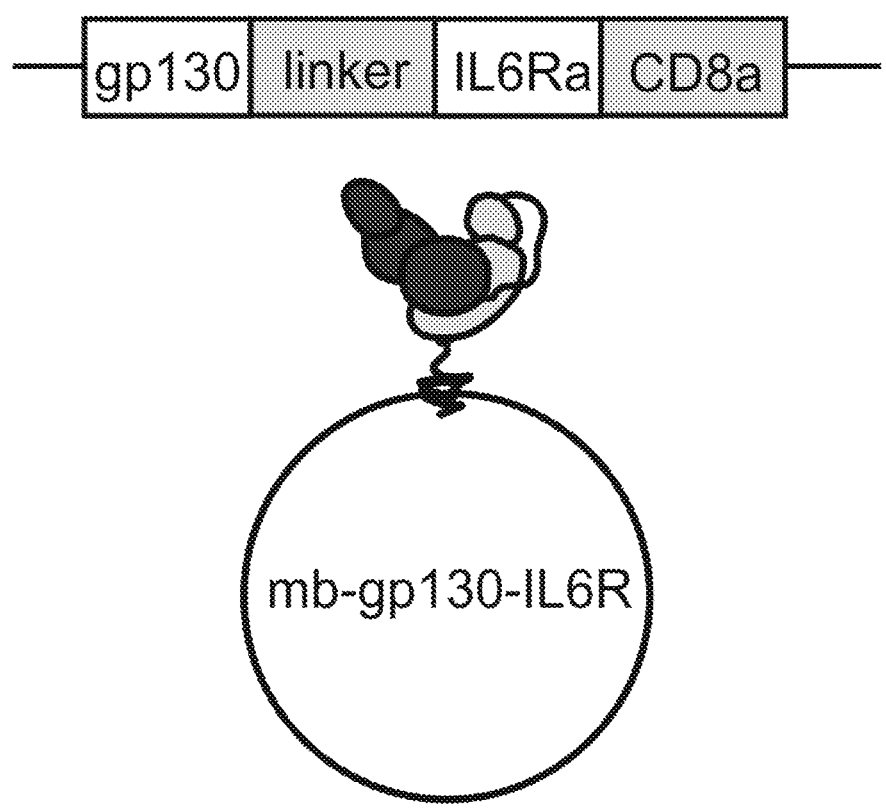

We have now designed other receptors which are functionally related to mb-aIL6 but have distinctive features (FIGS. 8A-C). FIG. 8A is a schematic of a nucleic acid construct for a soluble form of the receptor lacking the CD8α transmembrane domain of mb-aIL6 (sec-aIL6), which would be continuously secreted by transduced cells, and might diffuse to areas of the inflammatory microenvironment more effectively. FIG. 8B is a schematic of a nucleic acid construct where mb-aIL6 is linked to stimulatory and co-stimulatory domains typically incorporated in CARs (aIL6-CAR). Cells bearing such receptor should proliferate upon ligation of the aIL6-CAR, thus magnifying IL-6 neutralization. FIG. 8C is a schematic of a nucleic acid construct where the scFv anti-IL6 is replaced by the IL-6 receptor deprived of signaling capacity. This is constituted by the extracellular domain of gp130 fused to the IL-6 receptor α and the hinge plus transmembrane domain of CD8α. The potential advantage of this format is that it may be less immunogenic that the scFv-containing receptor.

While this study focused on IL-6, a similar approach can be applied to neutralize other pro-inflammatory cytokines, such as tumor necrosis factor (TNF)-α (FIGS. 11A-B), IL-1β, IL-12, IL-17, IL-18, IFNγ, etc., and/or block their receptors. For example, based on the schema in FIG. 11A, the anti-IL6 scFv portion can be replaced with a different scFv that specifically bind to a different cytokine, such as (TNF)-α (FIG. 11), IL-1β, IL-12, IL-17, IL-18, or IFNγ. Multiple neutralizing receptors can be expressed on the same cells or in different cell subsets to exert a comprehensive and long-lasting anti-inflammatory effect.

SEQUENCES

```
mb-aIL6 Sequence
CD8α signal peptide nucleotide sequence (SEQ ID NO: 1):
ATGGCCCTGCCCGTGACCGCTCTGCTGCTGCCCCTGGCTCTGCTGCTGCATGCTGC
TAGACCC CD8α signal peptide amino acid sequence (SEQ ID NO: 2):
MALPVTALLLPLALLLHAARP Variable light chain nucleotide sequence of anti-IL6 (SEQ ID NO: 3):
GAAATCGTCCTGACCCAGTCCCCTGCCACACTGTCCCTGTCTCCAGGAGAGAGGG
CCACCCTGAGCTGCTCCGCCTCTATCAGCGTGTCCTACATGTATTGGTACCAGCA
GAAGCCAGGACAGGCACCTAGGCTGCTGATCTACGACATGTCTAACCTGGCAAG
CGGCATCCCCGCACGCTTCTCTGGAAGCGGATCCGGCACAGACTTTACACTGACC
ATCAGCTCCCTGGAGCCTGAGGATTTCGCCGTGTACTATTGCATGCAGTGGTCCG
GCTATCCATACACATTTGGCGGCGGCACCAAGGTGGAGATCAAG Variable light chain amino acid sequence of anti IL-6 (SEQ ID NO: 4):
EIVLTQSPATLSLSPGERATLSCSASISVSYMYWYQQKPGQAPRLLIYDMSNLASGIPA
RFSGSGSGTDFTLTISSLEPEDFAVYYCMQWSGYPYTFGGGTKVEIK GSG linker nucleotide sequence (SEQ ID NO: 5):
GGCGGCGGCGGCTCTGGAGGAGGAGGAAGCGGAGGAGGAGGATCC GSG linker amino acid sequence (SEQ ID NO: 6):
GGGGSGGGGSGGGGS Variable heavy chain nucleotide sequence of anti IL-6 (SEQ ID NO: 7):
GAGGTGCAGCTGGTGGAGAGCGGCGGCGGCCTGGTGCAGCCCGGCGGCTCCCTG
CGGCTGTCTTGTGCCGCCAGCGGCTTCACCTTTTCTCCATTCGCCATGAGCTGGGT
GAGACAGGCACCAGGCAAGGGCCTGGAGTGGGTGGCCAAGATCTCCCCTGGCGG
CTCTTGGACATACTATTCCGACACAGTGACCGGCCGGTTTACCATCTCCAGAGAT
AACGCCAAGAACAGCCTGTATCTGCAGATGAATAGCCTGCGGGCCGAGGACACA
GCCGTGTACTATTGTGCCAGACAGCTGTGGGGCTACTATGCCCTGGATATCTGGG
GCCAGGGCACCACAGTGACCGTGTCTAGC Variable heavy chain amino acid sequence of anti IL-6 (SEQ ID NO: 8):
EVQLVESGGGLVQPGGSLRLSCAASGFTFSPFAMSWVRQAPGKGLEWVAKISPGGS
WTYYSDTVTGRFTISRDNAKNSLYLQMNSLRAEDTAVYYCARQLWGYYALDIWGQ
GTTVTVSS CD8α hinge and transmembrane domain nucleotide sequence (SEQ ID NO: 9):
AAGCCTACCACAACCCCAGCACCCAGGCCCCCTACACCTGCACCAACCATCGCC
AGCCAGCCACTGTCCCTGAGGCCCGAGGCATGCAGGCCTGCAGCAGGAGGCGCC
GTGCACACCCGCGGCCTGGACTTCGCCTGTGATATCTACATCTGGGCACCCCTGG
CTGGAACCTGCGGAGTCCTGCTGCTGTCACTGGTCATTACCCTGTATTGC CD8α hinge and transmembrane domain amino acid sequence (SEQ ID NO: 10):
KPTTTPAPRPPTPAPTIASQPLSLRPEACRPAAGGAVHTRGLDFACDIYIWAPLAGTCG
VLLLSLVITLYC sec-aIL6
sec-aIL6 nucleotide sequence (SEQ ID NO: 11):
ATGGCCCTGCCCGTGACCGCTCTGCTGCTGCCCCTGGCTCTGCTGCTGCATGCTGC
TAGACCCGAAATCGTCCTGACCCAGTCCCCTGCCACACTGTCCCTGTCTCCAGGA
GAGAGGGCCACCCTGAGCTGCTCCGCCTCTATCAGCGTGTCCTACATGTATTGGT
ACCAGCAGAAGCCAGGACAGGCACCTAGGCTGCTGATCTACGACATGTCTAACC
TGGCAAGCGGCATCCCCGCACGCTTCTCTGGAAGCGGATCCGGCACAGACTTTAC
ACTGACCATCAGCTCCCTGGAGCCTGAGGATTTCGCCGTGTACTATTGCATGCAG
TGGTCCGGCTATCCATACACATTTGGCGGCGGCACCAAGGTGGAGATCAAGGGC
GGCGGCGGCTCTGGAGGAGGAGGAAGCGGAGGAGGAGGATCCGAGGTGCAGCT
GGTGGAGAGCGGCGGCGGCCTGGTGCAGCCCGGCGGCTCCCTGCGGCTGTCTTG
TGCCGCCAGCGGCTTCACCTTTTCTCCATTCGCCATGAGCTGGGTGAGACAGGCA
CCAGGCAAGGGCCTGGAGTGGGTGGCCAAGATCTCCCCTGGCGGCTCTTGGACA
TACTATTCCGACACAGTGACCGGCCGGTTTACCATCTCCAGAGATAACGCCAAGA
ACAGCCTGTATCTGCAGATGAATAGCCTGCGGGCCGAGGACACAGCCGTGTACT
ATTGTGCCAGACAGCTGTGGGGCTACTATGCCCTGGATATCTGGGGCCAGGGCAC
CACAGTGACCGTGTCTAGC
```

| SEQUENCES |
| --- | sec-aIL6 amino acid sequence (SEQ ID NO: 12):
MALPVTALLLPLALLLHAARPEIVLTQSPATLSLSPGERATLSCSASISVSYMYWYQQ
KPGQAPRLLIYDMSNLASGIPARFSGSGSGTDFTLTISSLEPEDFAVYYCMQWSGYPY
TFGGGTKVEIKGGGGSGGGGSGGGGSEVQLVESGGGLVQPGGSLRLSCAASGFTFSP
FAMSWVRQAPGKGLEWVAKISPGGSWTYYSDTVTGRFTISRDNAKNSLYLQMNSLR
AEDTAVYYCARQLWGYYALDIWGQGTTVTVSS aIL6BBz Sequence
CD8α signal peptide nucleotide sequence (SEQ ID NO: 13):
ATGGCCCTGCCCGTGACCGCTCTGCTGCTGCCCCTGGCTCTGCTGCTGCATGCTGC
TAGACCC CD8α signal peptide amino acid sequence (SEQ ID NO: 14):
MALPVTALLLPLALLLHAARP aIL6 scFv nucleotide sequence (SEQ ID NO: 15):
GAAATCGTCCTGACCCAGTCCCCTGCCACACTGTCCCTGTCTCCAGGAGAGAGGG
CCACCCTGAGCTGCTCCGCCTCTATCAGCGTGTCCTACATGTATTGGTACCAGCA
GAAGCCAGGACAGGCACCTAGGCTGCTGATCTACGACATGTCTAACCTGGCAAG
CGGCATCCCCGCACGCTTCTCTGGAAGCGGATCCGGCACAGACTTTACACTGACC
ATCAGCTCCCTGGAGCCTGAGGATTTCGCCGTGTACTATTGCATGCAGTGGTCCG
GCTATCCATACACATTTGGCGGCGGCACCAAGGTGGAGATCAAGGGCGGCGGCG
GCTCTGGAGGAGGAGGAAGCGGAGGAGGAGGATCCGAGGTGCAGCTGGTGGAG
AGCGGCGGCGGCCTGGTGCAGCCCGGCGGCTCCCTGCGGCTGTCTTGTGCCGCCA
GCGGCTTCACCTTTTCTCCATTCGCCATGAGCTGGGTGAGACAGGCACCAGGCAA
GGGCCTGGAGTGGGTGGCCAAGATCTCCCCTGGCGGCTCTTGGACATACTATTCC
GACACAGTGACCGGCCGGTTTACCATCTCCAGAGATAACGCCAAGAACAGCCTG
TATCTGCAGATGAATAGCCTGCGGGCCGAGGACACAGCCGTGTACTATTGTGCCA
GACAGCTGTGGGGCTACTATGCCCTGGATATCTGGGGCCAGGGCACCACAGTGA
CCGTGTCTAGC aIL6 scFv amino acid sequence (SEQ ID NO: 16):
EIVLTQSPATLSLSPGERATLSCSASISVSYMYWYQQKPGQAPRLLIYDMSNLASGIPA
RFSGSGSGTDFTLTISSLEPEDFAVYYCMQWSGYPYTFGGGTKVEIKGGGGSGGGGS
GGGGSEVQLVESGGGLVQPGGSLRLSCAASGFTFSPFAMSWVRQAPGKGLEWVAKI
SPGGSWTYYSDTVTGRFTISRDNAKNSLYLQMNSLRAEDTAVYYCARQLWGYYAL
DIWGQGTTVTVSS CD8α hinge and transmembrane domain nucleotide sequence (SEQ ID NO: 17):
ACCACGACGCCAGCGCCGCGACCACCAACACCGGCGCCCACCATCGCGTCGCAG
CCCCTGTCCCTGCGCCCAGAGGCGTGCCGGCCAGCGGCGGGGGGCGCAGTGCAC
ACGAGGGGGCTGGACTTCGCCTGTGATATCTACATCTGGGCGCCCTTGGCCGGGA
CTTGTGGGGTCCTTCTCCTGTCACTGGTTATCACCCTTTACTGC CD8α hinge and transmembrane domain amino acid sequence (SEQ ID NO: 18):
TTTPAPRPPTPAPTIASQPLSLRPEACRPAAGGAVHTRGLDFACDIYIWAPLAGTCGV
LLLSLVITLYC 41BB domain nucleotide sequence (SEQ ID NO: 19):
AAACGGGGCAGAAAGAAACTCCTGTATATATTCAAACAACCATTTATGAGACCA
GTACAAACTACTCAAGAGGAAGATGGCTGTAGCTGCCGATTTCCAGAAGAAGAA
GAAGGAGGATGTGAACTG 41BB domain amino acid sequence (SEQ ID NO: 20):
KRGRKKLLYIFKQPFMRPVQTTQEEDGCSCRFPEEEEGGCEL CD3ζ domain nucleotide sequence (SEQ ID NO: 21):
AGAGTGAAGTTCAGCAGGAGCGCAGACGCCCCCGCGTACCAGCAGGGCCAGAAC
CAGCTCTATAACGAGCTCAATCTAGGACGAAGAGAGGAGTACGATGTTTTGGAC
AAGAGACGTGGCCGGGACCCTGAGATGGGGGGAAAGCCGAGAAGGAAGAACCC
TCAGGAAGGCCTGTACAATGAACTGCAGAAAGATAAGATGGCGGAGGCCTACAG
TGAGATTGGGATGAAAGGCGAGCGCCGGAGGGGCAAGGGGCACGATGGCCTTTA
CCAGGGTCTCAGTACAGCCACCAAGGACACCTACGACGCCCTTCACATGCAGGC
CCTGCCCCCTCGC CD3ζ domain amino acid sequence (SEQ ID NO: 22):
RVKFSRSADAPAYQQGQNQLYNELNLGRREEYDVLDKRRGRDPEMGGKPRRKNPQ
EGLYNELQKDKMAEAYSEIGMKGERRRGKGHDGLYQGLSTATKDTYDALHMQALP
PR mb-gp130-IL6R Sequence
gp130 domain nucleotide sequence (SEQ ID NO: 23):
ATGCTGACACTGCAGACATGGCTGGTCCAGGCACTGTTTATCTTTCTGACAACCG
AGTCCACAGGCGAACTGCTGGATCCTTGCGGGTACATCTCTCCAGAGAGCCCCGT
GGTGCAGCTGCACTCCAACTTCACCGCCGTGTGCGTGCTGAAGGAGAAGTGTATG
GACTACTTTCACGTGAACGCCAATTATATCGTGTGGAAGACAAACCACTTCACCA

| SEQUENCES |
|---|
| TCCCTAAGGAGCAGTACACAATCATCAATAGAACCGCCAGCTCCGTGACCTTCAC<br>CGATATCGCCAGCCTGAACATCCAGCTGACATGCAATATCCTGACCTTCGGCCAG<br>CTGGAGCAGAACGTGTATGGCATCACCATCATCTCCGGCCTGCCCCCTGAGAAGC<br>CAAAGAACCTGTCTTGCATCGTGAATGAGGGCAAGAAGATGAGGTGTGAGTGGG<br>ACCGGGGCAGAGAGACACACCTGGAGACAAATTTCACCCTGAAGTCCGAGTGGG<br>CCACCCACAAGTTTGCCGACTGCAAGGCCAAGAGGGATACACCCACCAGCTGTA<br>CAGTGGATTACTCCACCGTGTATTTTGTGAACATCGAAGTGTGGGTGGAGGCCGA<br>GAATGCCCTGGGCAAGGTGACCAGCGACCACATCAACTTCGATCCCGTGTACAA<br>GGTGAAGCCTAACCCACCCCACAATCTGTCTGTGATCAATAGCGAGGAGCTGTCT<br>AGCATCCTGAAGCTGACATGGACCAACCCCTCCATCAAGTCTGTGATCATCCTGA<br>AGTACAATATCCAGTATAGAACAAAGGACGCCAGCACCTGGTCCCAGATCCCTC<br>CAGAGGATACAGCCTCCACCAGGTCCTCTTTTACAGTGCAGGACCTGAAGCCTTT<br>CACCGAGTACGTGTTCCGGATCCGGTGTATGAAGGAGGACGGCAAGGGCTACTG<br>GTCTGATTGGAGCGAGGAGGCCTCCGGCATCACCTATGAGGACAGGCCA | gp130 domain amino acid sequence (SEQ ID NO: 24):
MLTLQTWLVQALFIFLTTESTGELLDPCGYISPESPVVQLHSNFTAVCVLKEKCMDYF
HVNANYIVWKTNHFTIPKEQYTIINRTASSVTFTDIASLNIQLTCNILTFGQLEQNVYGI
TIISGLPPEKPKNLSCIVNEGKKMRCEWDRGRETHLETNFTLKSEWATHKFADCKAK
RDTPTSCTVDYSTVYFVNIEVWVEAENALGKVTSDHINFDPVYKVKPNPPHNLSVIN
SEELSSILKLTWTNPSIKSVIILKYNIQYRTKDASTWSQIPPEDTASTRSSFTVQDLKPFT
EYVFRIRCMKEDGKGYWSDWSEEASGITYEDRP GSG linker nucleotide sequence (SEQ ID NO: 25):
GGAGGAGGAGGAAGCGGAGGAGGAGGCTCCGGCGGCGGCGGCTCT GSG linker amino acid sequence (SEQ ID NO: 26):
GGGGSGGGGSGGGGS IL-6R domain nucleotide sequence (SEQ ID NO: 27):
GTGGATGTGCCCCCTGAGGAGCCCCAGCTGTCTTGCTTCAGGAAGTCCCCTCTGT
CTAACGTGGTGTGCGAGTGGGGACCTCGCAGCACCCCATCCCTGACCACAAAGG
CCGTGCTGCTGGTGCGGAAGTTCCAGAATAGCCCTGCCGAGGACTTTCAGGAGCC
ATGCCAGTACTCTCAGGAGAGCCAGAAGTTCAGCTGTCAGCTGGCAGTGCCAGA
GGGCGATAGCTCCTTTTATATCGTGTCCATGTGCGTGGCCTCTAGCGTGGGCTCC
AAGTTCTCTAAGACACAGACCTTTCAGGGCTGTGGCATCCTGCAGCCTGACCCAC
CCGCCAACATCACAGTGACCGCCGTGGCCCGGAATCCAAGATGGCTGTCTGTGA
CATGGCAGGATCCCCACAGCTGGAACTCCTCTTTCTACCGGCTGAGATTTGAGCT
GAGGTATCGCGCCGAGCGGAGCAAGACCTTTACCACATGGATGGTGAAGGACCT
GCAGCACCACTGCGTGATCCACGATGCATGGAGCGGCCTGAGGCACGTGGTGCA
GCTGAGAGCACAGGAGGAGTTCGGACAGGGAGAGTGGAGCGAGTGGTCCCCAG
AGGCAATGGGAACACCATGGACCGAGAGCCGCTCCCCTCCAGCAGAGAATGAGG
TGAGCACACCA IL-6R domain amino acid sequence (SEQ ID NO: 28):
VDVPPEEPQLSCFRKSPLSNVVCEWGPRSTPSLTTKAVLLVRKFQNSPAEDFQEPCQY
SQESQKFSCQLAVPEGDSSFYIVSMCVASSVGSKFSKTQTFQGCILQPDPPANITVTA
VARNPRWLSVTWQDPHSWNSSFYRLRFELRYRAERSKTFTTWMVKDLQHHCVIHD
AWSGLRHVVQLRAQEEFGQGEWSEWSPEAMGTPWTESRSPPAENEVSTP CD8 α hinge and transmembrane domain nucleotide sequence (SEQ ID NO: 29):
AAGCCAACCACAACCCCTGCACCACGGCCCCCTACACCAGCACCTACCATCGCAT
CCCAGCCACTGTCTCTGAGGCCTGAGGCATGCAGGCCAGCAGCAGGAGGAGCAG
TGCACACCCGGGGCCTGGACTTCGCCTGTGATATCTACATCTGGGCCCCACTGGC
TGGCACTTGCGGGGTCCTGCTGCTGTCCCTGGTCATCACTCTGTATTGC CD8α hinge and transmembrane domain amino acid sequence (SEQ ID NO: 30):
KPTTTPAPRPPTPAPTIASQPLSLRPEACRPAAGGAVHTRGLDFACDIYIWAPLAGTCG
VLLLSLVITLYC mb-aTNFα Sequence
CD8α signal peptide nucleotide sequence (SEQ ID NO: 31):
ATGGCCCTGCCTGTGACCGCCCTGCTGCTGCCTCTGGCCCTGCTGCTGCACGCCG
CCCGCCCC CD8α signal peptide amino acid sequence (SEQ ID NO: 32):
MALPVTALLLPLALLLHAARP Variable light chain nucleotide sequence of anti TNFα (SEQ ID NO: 33):
GAAATCGTCCTGACCCAGTCCCCCGCCACACTGTCTCTGAGCCCAGGAGAGAGG
GCCACCCTGAGCTGCAGAGCCTCCCAGTCTGTGAGCTCCTACCTGGCTGGTATC
AGCAGAAGCCAGGACAGGCACCAAGGCTGCTGATCTACGACGCATCCAACAGGG
CAACAGGCATCCCCGCACGCTTCAGCGGATCCGGATCTGGCAGCGGCACCGACT
TTACACTGACCATCTCTAGCCTGGAGCCTGAGGATTTCGCCGTGTACTATTGCCA
GCAGCGCAGCAATTGGCCCCCTTTCACATTTGGCCCAGGCACCAAGGTGGATATC
AAG

```
                              SEQUENCES

Variable light chain amino acid sequence of anti TNFα (SEQ ID NO: 34):
EIVLTQSPATLSLSPGERATLSCRASQSVSSYLAWYQQKPGQAPRLLIYDASNRATGIP
ARFSGSGSGSGTDFTLTISSLEPEDFAVYYCQQRSNWPPFTFGPGTKVDIK GSG linker nucleotide sequence (SEQ ID NO: 35):
GGAGGAGGAGGATCCGGAGGAGGAGGATCTGGCGGCGGCGGCAGC GSG linker amino acid sequence (SEQ ID NO: 36):
GGGGSGGGGSGGGGS Variable heavy chain nucleotide sequence of anti TNFα (SEQ ID NO: 37):
CAGGTGCAGCTGGTGGAGTCCGGCGGCGGCGTGGTGCAGCCAGGCAGGTCCCTG
AGGCTGTCTTGTGCAGCAAGCGGCTTCATCTTTTCCTCTTACGCAATGCACTGGGT
GCGGCAGGCACCTGGAAACGGCCTGGAGTGGGTGGCCTTCATGTCCTACGACGG
CTCTAATAAGAAGTATGCCGATTCCGTGAAGGGCCGGTTTACAATCAGCAGAGA
CAACTCCAAGAATACCCTGTATCTGCAGATGAACTCTCTGAGGGCCGAGGACAC
AGCCGTGTACTATTGTGCCCGGGATAGAGGAATCGCAGCAGGAGGAAATTACTA
TTACTATGGCATGGACGTGTGGGGCCAGGGCACCACAGTGACCGTGAGCTCC Variable heavy chain amino acid sequence of anti TNFα (SEQ ID NO: 38):
QVQLVESGGGVVQPGRSLRLSCAASGFIFSSYAMHWVRQAPGNGLEWVAFMSYDG
SNKKYADSVKGRFTISRDNSKNTLYLQMNSLRAEDTAVYYCARDRGIAAGGNYYY
YGMDVWGQGTTVTSS CD8α hinge and transmembrane domain nucleotide sequence (SEQ ID NO: 39):
AAGCCTACCACAACCCTGCACCACGGCCACCAACACCAGCACCTACCATCGCCT
CTCAGCCTCTGAGCCTGAGGCCAGAGGCATGCAGGCCAGCAGCAGGAGGAGCAG
TGCACACCAGAGGCCTGGACTTTGCCTGTGATATCTACATCTGGGCCCCTCTGGC
TGGGACTTGCGGGGTGCTGCTGCTGTCACTGGTCATCACACTGTATTGTTGA CD8α hinge and transmembrane domain amino acid sequence (SEQ ID NO: 40):
KPTTTPAPRPPTPAPTIASQPLSLRPEACRPAAGGAVHTRGLDFACDIYIWAPLAGTCG
VLLLSLVITLYC
```

REFERENCES

1. Tanaka T, Kishimoto T. The biology and medical implications of interleukin-6. *Cancer Immunol Res.* 2014; 2(4):288-294.
2. Hunter C A, Jones S A. IL-6 as a keystone cytokine in health and disease. *Nat Immunol.* 2015; 16(5):448-457.
3. McInnes I B, Schett G. Pathogenetic insights from the treatment of rheumatoid arthritis. *Lancet.* 2017; 389 (10086):2328-2337.
4. Chen X, Das R, Komorowski R, et al. Blockade of interleukin-6 signaling augments regulatory T-cell reconstitution and attenuates the severity of graft-versus-host disease. *Blood.* 2009; 114(4):891-900.
5. Tawara I, Koyama M, Liu C, et al. Interleukin-6 modulates graft-versus-host responses after experimental allogeneic bone marrow transplantation. *Clin Cancer Res.* 2011; 17(1):77-88.
6. Roddy J V, Haverkos B M, McBride A, et al. Tocilizumab for steroid refractory acute graft-versus-host disease. *Leuk Lymphoma.* 2016; 57(1):81-85.
7. Lee D W, Gardner R, Porter D L, et al. Current concepts in the diagnosis and management of cytokine release syndrome. *Blood.* 2014; 124(2):188-195.
8. Davila M L, Riviere I, Wang X, et al. Efficacy and Toxicity Management of 19-28z CAR T Cell Therapy in B Cell Acute Lymphoblastic Leukemia. *Sci Transl Med.* 2014; 6(224):224ra225.
9. Maude S L, Barrett D, Teachey D T, Grupp S A. Managing cytokine release syndrome associated with novel T cell-engaging therapies. *Cancer J.* 2014; 20(2):119-122.
10. Park J H, Geyer M B, Brentjens R J. CD19-targeted CAR T-cell therapeutics for hematologic malignancies: interpreting clinical outcomes to date. *Blood.* 2016; 127 (26):3312-3320.
11. Manabe A, Coustan-Smith E, Kumagai M, et al. Interleukin-4 induces programmed cell death (apoptosis) in cases of high-risk acute lymphoblastic leukemia. *Blood.* 1994; 83(7):1731-1737.
12. Imai C, Mihara K, Andreansky M, Nicholson I C, Pui C H, Campana D. Chimeric receptors with 4-1BB signaling capacity provoke potent cytotoxicity against acute lymphoblastic leukemia. *Leukemia.* 2004; 18:676-684.
13. Szymczak-Workman A L, Vignali K M, Vignali D A. Design and construction of 2A peptide-linked multicistronic vectors. *Cold Spring Harb Protoc.* 2012; 2012(2): 199-204.
14. Kudo K, Imai C, Lorenzini P, et al. T lymphocytes expressing a CD16 signaling receptor exert antibody-dependent cancer cell killing. *Cancer Res.* 2014; 74(1): 93-103.
15. Taga T, Kawanishi Y, Hardy R R, Hirano T, Kishimoto T. Receptors for B cell stimulatory factor 2. Quantitation, specificity, distribution, and regulation of their expression. *J Exp Med.* 1987; 166(4):967-981.
16. Onozaki K, Akiyama Y, Okano A, et al. Synergistic regulatory effects of interleukin 6 and interleukin 1 on the growth and differentiation of human and mouse myeloid leukemic cell lines. *Cancer Res.* 1989; 49(13):3602-3607.
17. Zhong Z, Wen Z, Darnell J E, Jr. Stat3: a STAT family member activated by tyrosine phosphorylation in response to epidermal growth factor and interleukin-6. *Science.* 1994; 264(5155):95-98.
18. Bock G H, Long C A, Riley M L, et al. Characterization of a new IL-6-dependent human B-lymphoma cell line in long term culture. *Cytokine.* 1993; 5(5):480-489.
19. Campana D, Schwarz H, Imai C. 4-1BB chimeric antigen receptors. *Cancer J.* 2014; 20(2):134-140.

20. Sanceau J, Wijdenes J, Revel M, Wietzerbin J. IL-6 and IL-6 receptor modulation by IFN-gamma and tumor necrosis factor-alpha in human monocytic cell line (THP-1). Priming effect of IFN-gamma. *J Immunol.* 1991; 147(8):2630-2637.

21. Slifka M K, Whitton J L. Activated and memory CD8+ T cells can be distinguished by their cytokine profiles and phenotypic markers. *J Immunol.* 2000; 164(1):208-216.

INCORPORATION BY REFERENCE; EQUIVALENTS

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A method of reducing IL-6 concentration in a mammal being treated for cancer, the method comprising expressing a nucleic acid contained in a vector in a T cell, wherein the expressed nucleic acid contained within the vector encodes:
 a) a chimeric antigen receptor (CAR); and
 b) a membrane-bound anti-IL6 (mb-aIL6) comprising:
  i) a CD8α signal peptide domain;
  ii) an anti-IL-6 variable light chain domain comprising SEQ ID NO:4;
  iii) an anti-IL-6 variable heavy chain domain comprising SEQ ID NO: 8;
  iv) a linker domain joining the variable light chain domain and the variable heavy chain domain; and
  v) a hinge and transmembrane domain.

2. The method of claim 1, wherein the mammal is a human.

3. The method of claim 1, further comprising culturing the T cell to generate new T cells that express the mb-aIL6.

4. The method of claim 1, wherein the method reduces risk of cytokine release syndrome (CRS) in the mammal.

* * * * *

SEQUENCE LISTING

```
<160> NUMBER OF SEQ ID NOS: 40

<210> SEQ ID NO 1
<211> LENGTH: 63
<212> TYPE: DNA
<213> ORGANISM: Artificial Sequence
<220> FEATURE:
<223> OTHER INFORMATION: mb-aIL6 CD8alpha signal peptide nucleotide
      sequence

<400> SEQUENCE: 1
atggccctgc ccgtgaccgc tctgctgctg cccctggctc tgctgctgca tgctgctaga    60
ccc                                                                  63

<210> SEQ ID NO 2
<211> LENGTH: 21
<212> TYPE: PRT
<213> ORGANISM: Artificial Sequence
<220> FEATURE:
<223> OTHER INFORMATION: mb-aIL6 CD8alpha signal peptide amino acid
      sequence

<400> SEQUENCE: 2

Met Ala Leu Pro Val Thr Ala Leu Leu Leu Pro Leu Ala Leu Leu Leu
1               5                   10                  15

His Ala Ala Arg Pro
            20

<210> SEQ ID NO 3
<211> LENGTH: 318
<212> TYPE: DNA
<213> ORGANISM: Artificial Sequence
<220> FEATURE:
<223> OTHER INFORMATION: mb-aIL6 Variable light chain nucleotide
      sequence of anti-IL6

<400> SEQUENCE: 3
gaaatcgtcc tgacccagtc ccctgccaca ctgtccctgt ctccaggaga gagggccacc    60
ctgagctgct ccgcctctat cagcgtgtcc tacatgtatt ggtaccagca gaagccagga   120
caggcaccta ggctgctgat ctacgacatg tctaacctgg caagcggcat ccccgcacgc   180
ttctctggaa gcggatccgg cacagacttt acactgacca tcagctccct ggagcctgag   240
gatttcgccg tgtactattg catgcagtgg tccggctatc catacacatt tggcggcggc   300
accaaggtgg agatcaag                                                  318

<210> SEQ ID NO 4
<211> LENGTH: 106
<212> TYPE: PRT
<213> ORGANISM: Artificial Sequence
<220> FEATURE:
<223> OTHER INFORMATION: mb-aIL6 variable light chain amino acid
      sequence of anti IL-6
```

<400> SEQUENCE: 4

Glu Ile Val Leu Thr Gln Ser Pro Ala Thr Leu Ser Leu Ser Pro Gly
1               5                   10                  15

Glu Arg Ala Thr Leu Ser Cys Ser Ala Ser Ile Ser Val Ser Tyr Met
            20                  25                  30

Tyr Trp Tyr Gln Gln Lys Pro Gly Gln Ala Pro Arg Leu Leu Ile Tyr
        35                  40                  45

Asp Met Ser Asn Leu Ala Ser Gly Ile Pro Ala Arg Phe Ser Gly Ser
    50                  55                  60

Gly Ser Gly Thr Asp Phe Thr Leu Thr Ile Ser Ser Leu Glu Pro Glu
65                  70                  75                  80

Asp Phe Ala Val Tyr Tyr Cys Met Gln Trp Ser Gly Tyr Pro Tyr Thr
                85                  90                  95

Phe Gly Gly Gly Thr Lys Val Glu Ile Lys
            100                 105

<210> SEQ ID NO 5
<211> LENGTH: 45
<212> TYPE: DNA
<213> ORGANISM: Artificial Sequence
<220> FEATURE:
<223> OTHER INFORMATION: mb-aIL6 GSG linker nucleotide sequence

<400> SEQUENCE: 5
ggcggcggcg gctctggagg aggaggaagc ggaggaggag gatcc            45

<210> SEQ ID NO 6
<211> LENGTH: 15
<212> TYPE: PRT
<213> ORGANISM: Artificial Sequence
<220> FEATURE:
<223> OTHER INFORMATION: mb-aIL6 GSG linker amino acid sequence

<400> SEQUENCE: 6

Gly Gly Gly Gly Ser Gly Gly Gly Gly Ser Gly Gly Gly Gly Ser
1               5                   10                  15

<210> SEQ ID NO 7
<211> LENGTH: 357
<212> TYPE: DNA
<213> ORGANISM: Artificial Sequence
<220> FEATURE:
<223> OTHER INFORMATION: mb-aIL6 Variable heavy chain nucleotide
      sequence of anti IL-6

<400> SEQUENCE: 7
gaggtgcagc tggtggagag cggcggcggc ctggtgcagc ccggcggctc cctgcggctg    60
tcttgtgccg ccagcggctt caccttttct ccattcgcca tgagctgggt gagacaggca   120
ccaggcaagg gcctggagtg ggtggccaag atctcccctg gcggctcttg gacatactat   180
tccgacacag tgaccggccg gtttaccatc tccagaataa cgccaagaa cagcctgtat   240 ctgcagatga atagcctgcg ggccgaggac acagccgtgt actattgtgc cagacagctg   300
tggggctact atgccctgga tatctggggc cagggcacca cagtgaccgt gtctagc     357

<210> SEQ ID NO 8
<211> LENGTH: 119
<212> TYPE: PRT
<213> ORGANISM: Artificial Sequence
<220> FEATURE:
<223> OTHER INFORMATION: mb-aIL6 Variable heavy chain amino acid sequence of anti IL-6

<400> SEQUENCE: 8

Glu Val Gln Leu Val Glu Ser Gly Gly Gly Leu Val Gln Pro Gly Gly
1               5                   10                  15

Ser Leu Arg Leu Ser Cys Ala Ala Ser Gly Phe Thr Phe Ser Pro Phe
            20                  25                  30

Ala Met Ser Trp Val Arg Gln Ala Pro Gly Lys Gly Leu Glu Trp Val
        35                  40                  45

Ala Lys Ile Ser Pro Gly Gly Ser Trp Thr Tyr Tyr Ser Asp Thr Val
    50                  55                  60

Thr Gly Arg Phe Thr Ile Ser Arg Asp Asn Ala Lys Asn Ser Leu Tyr
65                  70                  75                  80

Leu Gln Met Asn Ser Leu Arg Ala Glu Asp Thr Ala Val Tyr Tyr Cys
                85                  90                  95

Ala Arg Gln Leu Trp Gly Tyr Tyr Ala Leu Asp Ile Trp Gly Gln Gly
            100                 105                 110

Thr Thr Val Thr Val Ser Ser
        115

<210> SEQ ID NO 9
<211> LENGTH: 213
<212> TYPE: DNA
<213> ORGANISM: Artificial Sequence
<220> FEATURE:
<223> OTHER INFORMATION: mb-aIL6 CD8alpha hinge and transmembrane domain
      nucleotide sequence

<400> SEQUENCE: 9
aagcctacca aaccccagc acccaggccc cctacacctg caccaaccat cgccagccag       60
ccactgtccc tgaggcccga ggcatgcagg cctgcagcag gaggcgccgt gcacacccgc      120
ggcctggact cgcctgtga tatctacatc tgggcacccc tggctggaac ctgcggagtc      180
ctgctgctgt cactggtcat taccctgtat tgc                                  213

<210> SEQ ID NO 10
<211> LENGTH: 71
<212> TYPE: PRT
<213> ORGANISM: Artificial Sequence
<220> FEATURE:
<223> OTHER INFORMATION: mb-aIL6 CD8alpha hinge and transmembrane domain
      amino acid sequence

<400> SEQUENCE: 10

Lys Pro Thr Thr Thr Pro Ala Pro Arg Pro Pro Thr Pro Ala Pro Thr
1               5                   10                  15

Ile Ala Ser Gln Pro Leu Ser Leu Arg Pro Glu Ala Cys Arg Pro Ala
            20                  25                  30

Ala Gly Gly Ala Val His Thr Arg Gly Leu Asp Phe Ala Cys Asp Ile
        35                  40                  45

Tyr Ile Trp Ala Pro Leu Ala Gly Thr Cys Gly Val Leu Leu Leu Ser
    50                  55                  60

Leu Val Ile Thr Leu Tyr Cys
65                  70

<210> SEQ ID NO 11
<211> LENGTH: 783
<212> TYPE: DNA
<213> ORGANISM: Artificial Sequence
<220> FEATURE:

<223> OTHER INFORMATION: sec-aIL6 nucleotide sequence

<400> SEQUENCE: 11

```
atggccctgc ccgtgaccgc tctgctgctg cccctggctc tgctgctgca tgctgctaga      60
cccgaaatcg tcctgaccca gtcccctgcc acactgtccc tgtctccagg agagagggcc     120
accctgagct gctccgcctc tatcagcgtg tcctacatgt attggtacca gcagaagcca     180
ggacaggcac ctaggctgct gatctacgac atgtctaacc tggcaagcgg catccccgca     240
cgcttctctg gaagcggatc cggcacagac tttacactga ccatcagctc cctggagcct     300
gaggatttcg ccgtgtacta ttgcatgcag tggtccggct atccatacac atttggcggc     360
ggcaccaagg tggagatcaa gggcggcggc ggctctggag aggaggaag cggaggagga     420
ggatccgagg tgcagctggt ggagagcggc ggcggcctgg tgcagcccgg cggctcccctg     480
cggctgtctt gtgccgccag cggcttcacc tttctccat cgccatgag ctgggtgaga     540
caggcaccag gcaagggcct ggagtgggtg ccaagatct cccctggcgg ctcttggaca     600
tactattccg acacagtgac cggccggttt accatctcca gagataacgc caagaacagc     660
ctgtatctgc agatgaatag cctgcgggcc gaggacacag ccgtgtacta ttgtgccaga     720
cagctgtggg gctactatgc cctggatatc tggggccagg gcaccacagt gaccgtgtct     780
agc                                                                   783
```

<210> SEQ ID NO 12
<211> LENGTH: 261
<212> TYPE: PRT
<213> ORGANISM: Artificial Sequence
<220> FEATURE:
<223> OTHER INFORMATION: sec-aIL6 amino acid sequence

<400> SEQUENCE: 12

```
Met Ala Leu Pro Val Thr Ala Leu Leu Leu Pro Leu Ala Leu Leu Leu
 1               5                  10                  15

His Ala Ala Arg Pro Glu Ile Val Leu Thr Gln Ser Pro Ala Thr Leu
             20                  25                  30

Ser Leu Ser Pro Gly Glu Arg Ala Thr Leu Ser Cys Ser Ala Ser Ile
         35                  40                  45

Ser Val Ser Tyr Met Tyr Trp Tyr Gln Gln Lys Pro Gly Gln Ala Pro
     50                  55                  60

Arg Leu Leu Ile Tyr Asp Met Ser Asn Leu Ala Ser Gly Ile Pro Ala
 65                  70                  75                  80

Arg Phe Ser Gly Ser Gly Ser Gly Thr Asp Phe Thr Leu Thr Ile Ser
                 85                  90                  95

Ser Leu Glu Pro Glu Asp Phe Ala Val Tyr Tyr Cys Met Gln Trp Ser
            100                 105                 110

Gly Tyr Pro Tyr Thr Phe Gly Gly Gly Thr Lys Val Glu Ile Lys Gly
        115                 120                 125

Gly Gly Gly Ser Gly Gly Gly Gly Ser Gly Gly Gly Gly Ser Glu Val
    130                 135                 140

Gln Leu Val Glu Ser Gly Gly Gly Leu Val Gln Pro Gly Gly Ser Leu
145                 150                 155                 160

Arg Leu Ser Cys Ala Ala Ser Gly Phe Thr Phe Ser Pro Phe Ala Met
                165                 170                 175

Ser Trp Val Arg Gln Ala Pro Gly Lys Gly Leu Glu Trp Val Ala Lys
            180                 185                 190

Ile Ser Pro Gly Gly Ser Trp Thr Tyr Tyr Ser Asp Thr Val Thr Gly
```

```
                195                 200                 205
Arg Phe Thr Ile Ser Arg Asp Asn Ala Lys Asn Ser Leu Tyr Leu Gln
    210                 215                 220

Met Asn Ser Leu Arg Ala Glu Asp Thr Ala Val Tyr Tyr Cys Ala Arg
225                 230                 235                 240

Gln Leu Trp Gly Tyr Tyr Ala Leu Asp Ile Trp Gly Gln Gly Thr Thr
                245                 250                 255

Val Thr Val Ser Ser
            260

<210> SEQ ID NO 13
<211> LENGTH: 63
<212> TYPE: DNA
<213> ORGANISM: Artificial Sequence
<220> FEATURE:
<223> OTHER INFORMATION: aIL6BBz CD8alpha signal peptide nucleotide
      sequence

<400> SEQUENCE: 13
atggccctgc ccgtgaccgc tctgctgctg cccctggctc tgctgctgca tgctgctaga      60
ccc                                                                   63

<210> SEQ ID NO 14
<211> LENGTH: 21
<212> TYPE: PRT
<213> ORGANISM: Artificial Sequence
<220> FEATURE:
<223> OTHER INFORMATION: aIL6BBz CD8alpha signal peptide amino acid
      sequence

<400> SEQUENCE: 14

Met Ala Leu Pro Val Thr Ala Leu Leu Leu Pro Leu Ala Leu Leu Leu
1               5                   10                  15

His Ala Ala Arg Pro
            20

<210> SEQ ID NO 15
<211> LENGTH: 720
<212> TYPE: DNA
<213> ORGANISM: Artificial Sequence
<220> FEATURE:
<223> OTHER INFORMATION: aIL6BBz aIL6 scFv nucleotide sequence

<400> SEQUENCE: 15
gaaatcgtcc tgacccagtc ccctgccaca ctgtccctgt ctccaggaga gagggccacc      60
ctgagctgct ccgcctctat cagcgtgtcc tacatgtatt ggtaccagca gaagccagga     120
caggcaccta ggctgctgat ctacgacatg tctaacctgg caagcggcat ccccgcacgc     180
ttctctggaa gcggatccgg cacagacttt acactgacca tcagctccct ggagcctgag     240
gatttcgccg tgtactattg catgcagtgg tccggctatc catacacatt tggcggcggc     300
accaaggtgg agatcaaggg cggcggcggc tctgaggag gaggaagcgg aggaggagga     360
tccgaggtgc agctggtgga gagcggcggc ggcctggtgc agcccggcgg ctccctgcgg     420
ctgtcttgtg ccgccagcgg cttcaccttt tctccattcg ccatgagctg ggtgagacag     480
gcaccaggca agggcctgga gtgggtggcc aagatctccc ctggcggctc ttggacatac     540
tattccgaca cagtgaccgg ccggtttacc atctccagag ataacgccaa gaacagcctg     600
tatctgcaga tgaatagcct gcgggccgag acacagccg tgtactattg tgccagacag     660
ctgtggggct actatgccct ggatatctgg ggccagggca ccacagtgac cgtgtctagc     720
```

<210> SEQ ID NO 16
<211> LENGTH: 240
<212> TYPE: PRT
<213> ORGANISM: Artificial Sequence
<220> FEATURE:
<223> OTHER INFORMATION: aIL6BBz aIL6 scFv amino acid sequence

<400> SEQUENCE: 16

Glu Ile Val Leu Thr Gln Ser Pro Ala Thr Leu Ser Leu Ser Pro Gly
1               5                   10                  15

Glu Arg Ala Thr Leu Ser Cys Ser Ala Ser Ile Ser Val Ser Tyr Met
            20                  25                  30

Tyr Trp Tyr Gln Gln Lys Pro Gly Gln Ala Pro Arg Leu Leu Ile Tyr
        35                  40                  45

Asp Met Ser Asn Leu Ala Ser Gly Ile Pro Ala Arg Phe Ser Gly Ser
    50                  55                  60

Gly Ser Gly Thr Asp Phe Thr Leu Thr Ile Ser Ser Leu Glu Pro Glu
65                  70                  75                  80

Asp Phe Ala Val Tyr Tyr Cys Met Gln Trp Ser Gly Tyr Pro Tyr Thr
                85                  90                  95

Phe Gly Gly Gly Thr Lys Val Glu Ile Lys Gly Gly Gly Gly Ser Gly
            100                 105                 110

Gly Gly Gly Ser Gly Gly Gly Ser Glu Val Gln Leu Val Glu Ser
        115                 120                 125

Gly Gly Gly Leu Val Gln Pro Gly Gly Ser Leu Arg Leu Ser Cys Ala
    130                 135                 140

Ala Ser Gly Phe Thr Phe Ser Pro Phe Ala Met Ser Trp Val Arg Gln
145                 150                 155                 160

Ala Pro Gly Lys Gly Leu Glu Trp Val Ala Lys Ile Ser Pro Gly Gly
                165                 170                 175

Ser Trp Thr Tyr Tyr Ser Asp Thr Val Thr Gly Arg Phe Thr Ile Ser
            180                 185                 190

Arg Asp Asn Ala Lys Asn Ser Leu Tyr Leu Gln Met Asn Ser Leu Arg
        195                 200                 205

Ala Glu Asp Thr Ala Val Tyr Tyr Cys Ala Arg Gln Leu Trp Gly Tyr
    210                 215                 220

Tyr Ala Leu Asp Ile Trp Gly Gln Gly Thr Thr Val Thr Val Ser Ser
225                 230                 235                 240

<210> SEQ ID NO 17
<211> LENGTH: 207
<212> TYPE: DNA
<213> ORGANISM: Artificial Sequence
<220> FEATURE:
<223> OTHER INFORMATION: aIL6BBz CD8alpha hinge and transmembrane domain
      nucleotide sequence

<400> SEQUENCE: 17
accacgacgc cagcgccgcg accaccaaca ccggcgccca ccatcgcgtc gcagcccctg      60
tccctgcgcc cagaggcgtg ccggccagcg gcggggggcg cagtgcacac gagggggctg     120
gacttcgcct gtgatatcta catctgggcg cccttggccg ggacttgtgg ggtccttctc     180
ctgtcactgg ttatcaccct ttactgc                                         207

<210> SEQ ID NO 18
<211> LENGTH: 69
<212> TYPE: PRT

```
<213> ORGANISM: Artificial Sequence
<220> FEATURE:
<223> OTHER INFORMATION: aIL6BBz CD8alpha hinge and transmembrane domain
      amino acid sequence

<400> SEQUENCE: 18

Thr Thr Thr Pro Ala Pro Arg Pro Pro Thr Pro Ala Pro Thr Ile Ala
1               5                   10                  15

Ser Gln Pro Leu Ser Leu Arg Pro Glu Ala Cys Arg Pro Ala Ala Gly
            20                  25                  30

Gly Ala Val His Thr Arg Gly Leu Asp Phe Ala Cys Asp Ile Tyr Ile
        35                  40                  45

Trp Ala Pro Leu Ala Gly Thr Cys Gly Val Leu Leu Leu Ser Leu Val
    50                  55                  60

Ile Thr Leu Tyr Cys
65

<210> SEQ ID NO 19
<211> LENGTH: 126
<212> TYPE: DNA
<213> ORGANISM: Artificial Sequence
<220> FEATURE:
<223> OTHER INFORMATION: aIL6BBz 41BB domain nucleotide sequence

<400> SEQUENCE: 19
aaacggggca gaaagaaact cctgtatata ttcaaacaac catttatgag accagtacaa      60
actactcaag aggaagatgg ctgtagctgc cgatttccag aagaagaaga aggaggatgt     120
gaactg                                                                126

<210> SEQ ID NO 20
<211> LENGTH: 42
<212> TYPE: PRT
<213> ORGANISM: Artificial Sequence
<220> FEATURE:
<223> OTHER INFORMATION: aIL6BBz 41BB domain amino acid sequence

<400> SEQUENCE: 20

Lys Arg Gly Arg Lys Lys Leu Leu Tyr Ile Phe Lys Gln Pro Phe Met
1               5                   10                  15

Arg Pro Val Gln Thr Thr Gln Glu Glu Asp Gly Cys Ser Cys Arg Phe
            20                  25                  30

Pro Glu Glu Glu Glu Gly Gly Cys Glu Leu
        35                  40

<210> SEQ ID NO 21
<211> LENGTH: 336
<212> TYPE: DNA
<213> ORGANISM: Artificial Sequence
<220> FEATURE:
<223> OTHER INFORMATION: aIL6BBz CD3zeta domain nucleotide sequence

<400> SEQUENCE: 21
agagtgaagt tcagcaggag cgcagacgcc cccgcgtacc agcagggcca gaaccagctc      60
tataacgagc tcaatctagg acgaagagag gagtacgatg ttttggacaa gagacgtggc     120
cgggaccctg agatgggggg aaagccgaga aggaagaacc ctcaggaagg cctgtacaat     180
gaactgcaga agataagat ggcggaggcc tacagtgaga ttgggatgaa aggcgagcgc     240
cggaggggca aggggcacga tggcctttac cagggtctca gtacagccac caaggacacc     300
tacgacgccc ttcacatgca ggccctgccc cctcgc                               336
```

<210> SEQ ID NO 22
<211> LENGTH: 112
<212> TYPE: PRT
<213> ORGANISM: Artificial Sequence
<220> FEATURE:
<223> OTHER INFORMATION: aIL6BBz CD3zeta domain amino acid sequence

<400> SEQUENCE: 22

Arg Val Lys Phe Ser Arg Ser Ala Asp Ala Pro Ala Tyr Gln Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
    50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110

<210> SEQ ID NO 23
<211> LENGTH: 978
<212> TYPE: DNA
<213> ORGANISM: Artificial Sequence
<220> FEATURE:
<223> OTHER INFORMATION: mb-gp130-IL6R gp130 domain nucleotide sequence

<400> SEQUENCE: 23
atgctgacac tgcagacatg gctggtccag gcactgttta tctttctgac aaccgagtcc    60
acaggcgaac tgctggatcc ttgcgggtac atctctccag agagcccgt ggtgcagctg    120 cactccaact tcaccgccgt gtgcgtgctg aaggagaagt gtatggacta ctttcacgtg    180
aacgccaatt atatcgtgtg aagacaaac cacttcacca tccctaagga gcagtacaca    240
atcatcaata gaaccgccag ctccgtgacc ttcaccgata tcgccagcct gaacatccag    300
ctgacatgca atatcctgac cttcggccag ctggagcaga acgtgtatgg catcaccatc    360
atctccggcc tgccccctga aagccaaag aacctgtctt gcatcgtgaa tgagggcaag    420
aagatgaggt gtgagtggga ccggggcaga gagacacacc tggagacaaa tttcacctg    480 aagtccgagt gggccaccca aagtttgcc gactgcaagg ccaagaggga tacacccacc    540
agctgtacag tggattactc caccgtgtat tttgtgaaca tcgaagtgtg ggtggaggcc    600
gagaatgccc tggcaaggt gaccagcgac cacatcaact cgatcccgt gtacaaggtg    660 aagcctaacc accccacaa tctgtctgtg atcaatagcg aggagctgtc tagcatcctg    720
aagctgacat ggaccaaccc ctccatcaag tctgtgatca tcctgaagta caatatccag    780
tatagaacaa aggacgccag cacctggtcc cagatccctc agaggatac agcctccacc    840 aggtcctctt ttacagtgca ggacctgaag cctttcaccg agtacgtgtt ccggatccgg    900
tgtatgaagg aggacggcaa gggctactgg tctgattgga gcgaggaggc ctccggcatc    960
acctatgagg acaggcca                                                 978

<210> SEQ ID NO 24
<211> LENGTH: 326
<212> TYPE: PRT

<213> ORGANISM: Artificial Sequence
<220> FEATURE:
<223> OTHER INFORMATION: mb-gp130-IL6R gp130 domain amino acid sequence

<400> SEQUENCE: 24

```
Met Leu Thr Leu Gln Thr Trp Leu Val Gln Ala Leu Phe Ile Phe Leu
1               5                   10                  15

Thr Thr Glu Ser Thr Gly Glu Leu Leu Asp Pro Cys Gly Tyr Ile Ser
            20                  25                  30

Pro Glu Ser Pro Val Val Gln Leu His Ser Asn Phe Thr Ala Val Cys
        35                  40                  45

Val Leu Lys Glu Lys Cys Met Asp Tyr Phe His Val Asn Ala Asn Tyr
    50                  55                  60

Ile Val Trp Lys Thr Asn His Phe Thr Ile Pro Lys Glu Gln Tyr Thr
65                  70                  75                  80

Ile Ile Asn Arg Thr Ala Ser Ser Val Thr Phe Thr Asp Ile Ala Ser
                85                  90                  95

Leu Asn Ile Gln Leu Thr Cys Asn Ile Leu Thr Phe Gly Gln Leu Glu
            100                 105                 110

Gln Asn Val Tyr Gly Ile Thr Ile Ile Ser Gly Leu Pro Pro Glu Lys
        115                 120                 125

Pro Lys Asn Leu Ser Cys Ile Val Asn Glu Gly Lys Lys Met Arg Cys
    130                 135                 140

Glu Trp Asp Arg Gly Arg Glu Thr His Leu Glu Thr Asn Phe Thr Leu
145                 150                 155                 160

Lys Ser Glu Trp Ala Thr His Lys Phe Ala Asp Cys Lys Ala Lys Arg
                165                 170                 175

Asp Thr Pro Thr Ser Cys Thr Val Asp Tyr Ser Thr Val Tyr Phe Val
            180                 185                 190

Asn Ile Glu Val Trp Val Glu Ala Glu Asn Ala Leu Gly Lys Val Thr
        195                 200                 205

Ser Asp His Ile Asn Phe Asp Pro Val Tyr Lys Val Lys Pro Asn Pro
    210                 215                 220

Pro His Asn Leu Ser Val Ile Asn Ser Glu Glu Leu Ser Ser Ile Leu
225                 230                 235                 240

Lys Leu Thr Trp Thr Asn Pro Ser Ile Lys Ser Val Ile Ile Leu Lys
                245                 250                 255

Tyr Asn Ile Gln Tyr Arg Thr Lys Asp Ala Ser Thr Trp Ser Gln Ile
            260                 265                 270

Pro Pro Glu Asp Thr Ala Ser Thr Arg Ser Ser Phe Thr Val Gln Asp
        275                 280                 285

Leu Lys Pro Phe Thr Glu Tyr Val Phe Arg Ile Arg Cys Met Lys Glu
    290                 295                 300

Asp Gly Lys Gly Tyr Trp Ser Asp Trp Ser Glu Ala Ser Gly Ile
305                 310                 315                 320

Thr Tyr Glu Asp Arg Pro
                325
```

<210> SEQ ID NO 25
<211> LENGTH: 45
<212> TYPE: DNA
<213> ORGANISM: Artificial Sequence
<220> FEATURE:
<223> OTHER INFORMATION: mb-gp130-IL6R GSG linker nucleotide sequence

<400> SEQUENCE: 25
ggaggaggag gaagcggagg aggaggctcc ggcggcggcg gctct         45

<210> SEQ ID NO 26
<211> LENGTH: 15
<212> TYPE: PRT
<213> ORGANISM: Artificial Sequence
<220> FEATURE:
<223> OTHER INFORMATION: mb-gp130-IL6R GSG linker amino acid sequence

<400> SEQUENCE: 26

Gly Gly Gly Gly Ser Gly Gly Gly Gly Ser Gly Gly Gly Gly Ser
1               5                   10                  15

<210> SEQ ID NO 27
<211> LENGTH: 663
<212> TYPE: DNA
<213> ORGANISM: Artificial Sequence
<220> FEATURE:
<223> OTHER INFORMATION: mb-gp130-IL6R IL-6R domain nucleotide sequence

<400> SEQUENCE: 27
gtggatgtgc cccctgagga gccccagctg tcttgcttca ggaagtcccc tctgtctaac      60
gtggtgtgcg agtggggacc tcgcagcacc ccatccctga ccacaaaggc cgtgctgctg     120
gtgcggaagt tccagaatag ccctgccgag gactttcagg agccatgcca gtactctcag     180
gagagccaga gttcagctg tcagctggca gtgccagagg cgatagctc cttttatatc      240 gtgtccatgt gcgtggcctc tagcgtgggc tccaagttct ctaagacaca gacctttcag     300
ggctgtggca tcctgcagcc tgacccaccc gccaacatca cagtgaccgc cgtggcccgg     360
aatccaagat ggctgtctgt gacatggcag gatccccaca gctggaactc ctctttctac     420
cggctgagat ttgagctgag gtatcgcgcc gagcggagca agacctttac cacatggatg     480
gtgaaggacc tgcagcacca ctgcgtgatc cacgatgcat ggagcggcct gaggcacgtg     540
gtgcagctga gcacaggga ggagttcgga caggagagt ggagcgagtg gtccccagag      600
gcaatgggaa caccatggac cgagagccgc tcccctccag cagagaatga ggtgagcaca     660
cca                                                                  663

<210> SEQ ID NO 28
<211> LENGTH: 221
<212> TYPE: PRT
<213> ORGANISM: Artificial Sequence
<220> FEATURE:
<223> OTHER INFORMATION: mb-gp130-IL6R IL-6R domain amino acid sequence

<400> SEQUENCE: 28

Val Asp Val Pro Pro Glu Glu Pro Gln Leu Ser Cys Phe Arg Lys Ser
1               5                   10                  15

Pro Leu Ser Asn Val Val Cys Glu Trp Gly Pro Arg Ser Thr Pro Ser
            20                  25                  30

Leu Thr Thr Lys Ala Val Leu Leu Val Arg Lys Phe Gln Asn Ser Pro
        35                  40                  45

Ala Glu Asp Phe Gln Glu Pro Cys Gln Tyr Ser Gln Glu Ser Gln Lys
    50                  55                  60

Phe Ser Cys Gln Leu Ala Val Pro Glu Gly Asp Ser Ser Phe Tyr Ile
65                  70                  75                  80

Val Ser Met Cys Val Ala Ser Ser Val Gly Ser Lys Phe Ser Lys Thr
                85                  90                  95

Gln Thr Phe Gln Gly Cys Gly Ile Leu Gln Pro Asp Pro Pro Ala Asn
            100                 105                 110

```
Ile Thr Val Thr Ala Val Ala Arg Asn Pro Arg Trp Leu Ser Val Thr
        115                 120                 125

Trp Gln Asp Pro His Ser Trp Asn Ser Ser Phe Tyr Arg Leu Arg Phe
        130                 135                 140

Glu Leu Arg Tyr Arg Ala Glu Arg Ser Lys Thr Phe Thr Thr Trp Met
145                 150                 155                 160

Val Lys Asp Leu Gln His His Cys Val Ile His Asp Ala Trp Ser Gly
                165                 170                 175

Leu Arg His Val Val Gln Leu Arg Ala Gln Glu Phe Gly Gln Gly
                180                 185                 190

Glu Trp Ser Glu Trp Ser Pro Glu Ala Met Gly Thr Pro Trp Thr Glu
        195                 200                 205

Ser Arg Ser Pro Pro Ala Glu Asn Glu Val Ser Thr Pro
        210                 215                 220

<210> SEQ ID NO 29
<211> LENGTH: 213
<212> TYPE: DNA
<213> ORGANISM: Artificial Sequence
<220> FEATURE:
<223> OTHER INFORMATION: mb-gp130-IL6R CD8alpha hinge and transmembrane
      domain nucleotide sequence

<400> SEQUENCE: 29
aagccaacca caaccctgc accacggccc cctacaccag cacctaccat cgcatcccag      60
ccactgtctc tgaggcctga ggcatgcagg ccagcagcag gaggagcagt gcacacccgg    120
ggcctggact cgcctgtga tatctacatc tgggccccac tggctggcac ttgcggggtc     180
ctgctgctgt ccctggtcat cactctgtat tgc                                 213

<210> SEQ ID NO 30
<211> LENGTH: 71
<212> TYPE: PRT
<213> ORGANISM: Artificial Sequence
<220> FEATURE:
<223> OTHER INFORMATION: mb-gp130-IL6R CD8alpha hinge and transmembrane
      domain amino acid sequence

<400> SEQUENCE: 30

Lys Pro Thr Thr Thr Pro Ala Pro Arg Pro Pro Thr Pro Ala Pro Thr
1               5                   10                  15

Ile Ala Ser Gln Pro Leu Ser Leu Arg Pro Glu Ala Cys Arg Pro Ala
                20                  25                  30

Ala Gly Gly Ala Val His Thr Arg Gly Leu Asp Phe Ala Cys Asp Ile
            35                  40                  45

Tyr Ile Trp Ala Pro Leu Ala Gly Thr Cys Gly Val Leu Leu Leu Ser
        50                  55                  60

Leu Val Ile Thr Leu Tyr Cys
65                  70

<210> SEQ ID NO 31
<211> LENGTH: 63
<212> TYPE: DNA
<213> ORGANISM: Artificial Sequence
<220> FEATURE:
<223> OTHER INFORMATION: mb-aTNFalpha CD8alpha signal peptide nucleotide
      sequence

<400> SEQUENCE: 31
atggccctgc ctgtgaccgc cctgctgctg cctctggccc tgctgctgca cgccgcccgc      60
``` ccc                                                                63

<210> SEQ ID NO 32
<211> LENGTH: 21
<212> TYPE: PRT
<213> ORGANISM: Artificial Sequence
<220> FEATURE:
<223> OTHER INFORMATION: mb-aTNFalpha CD8alpha signal peptide amino acid
      sequence

<400> SEQUENCE: 32

Met Ala Leu Pro Val Thr Ala Leu Leu Leu Pro Leu Ala Leu Leu Leu
1               5                   10                  15

His Ala Ala Arg Pro
            20

<210> SEQ ID NO 33
<211> LENGTH: 330
<212> TYPE: DNA
<213> ORGANISM: Artificial Sequence
<220> FEATURE:
<223> OTHER INFORMATION: mb-aTNFalpha Variable light chain nucleotide
      sequence of anti TNFalpha

<400> SEQUENCE: 33
gaaatcgtcc tgacccagtc ccccgccaca ctgtctctga gcccaggaga gagggccacc    60
ctgagctgca gagcctccca gtctgtgagc tcctacctgg cctggtatca gcagaagcca   120
ggacaggcac caaggctgct gatctacgac gcatccaaca gggcaacagg catccccgca   180
cgcttcagcg gatccggatc tggcagcggc accgacttta cactgaccat ctctagcctg   240
gagcctgagg atttcgccgt gtactattgc cagcagcgca gcaattggcc ccctttcaca   300
tttggcccag gcaccaaggt ggatatcaag                                    330

<210> SEQ ID NO 34
<211> LENGTH: 110
<212> TYPE: PRT
<213> ORGANISM: Artificial Sequence
<220> FEATURE:
<223> OTHER INFORMATION: mb-aTNFalpha variable light chain amino acid
      sequence of antii TNFalpha

<400> SEQUENCE: 34

Glu Ile Val Leu Thr Gln Ser Pro Ala Thr Leu Ser Leu Ser Pro Gly
1               5                   10                  15

Glu Arg Ala Thr Leu Ser Cys Arg Ala Ser Gln Ser Val Ser Ser Tyr
            20                  25                  30

Leu Ala Trp Tyr Gln Gln Lys Pro Gly Gln Ala Pro Arg Leu Leu Ile
        35                  40                  45

Tyr Asp Ala Ser Asn Arg Ala Thr Gly Ile Pro Ala Arg Phe Ser Gly
    50                  55                  60

Ser Gly Ser Gly Ser Gly Thr Asp Phe Thr Leu Thr Ile Ser Ser Leu
65                  70                  75                  80

Glu Pro Glu Asp Phe Ala Val Tyr Tyr Cys Gln Gln Arg Ser Asn Trp
                85                  90                  95

Pro Pro Phe Thr Phe Gly Pro Gly Thr Lys Val Asp Ile Lys
            100                 105                 110

<210> SEQ ID NO 35
<211> LENGTH: 45
<212> TYPE: DNA

```
<213> ORGANISM: Artificial Sequence
<220> FEATURE:
<223> OTHER INFORMATION: mb-aTNFalpha GSG linker nucleotide sequence

<400> SEQUENCE: 35
ggaggaggag gatccggagg aggaggatct ggcggcggcg gcagc                45

<210> SEQ ID NO 36
<211> LENGTH: 15
<212> TYPE: PRT
<213> ORGANISM: Artificial Sequence
<220> FEATURE:
<223> OTHER INFORMATION: mb-aTNFalpha GSG linker amino acid sequence

<400> SEQUENCE: 36

Gly Gly Gly Gly Ser Gly Gly Gly Gly Ser Gly Gly Gly Gly Ser
1               5                   10                  15

<210> SEQ ID NO 37
<211> LENGTH: 378
<212> TYPE: DNA
<213> ORGANISM: Artificial Sequence
<220> FEATURE:
<223> OTHER INFORMATION: mb-aTNFalpha Variable heavy chain nucleotide
      sequence of anti TNFalpha

<400> SEQUENCE: 37
caggtgcagc tggtggagtc cggcggcggc gtggtgcagc caggcaggtc cctgaggctg        60
tcttgtgcag caagcggctt catcttttcc tcttacgcaa tgcactgggt gcggcaggca       120
cctggaaacg gcctggagtg gtggccttc atgtcctacg acggctctaa taagaagtat        180
gccgattccg tgaagggccg gtttacaatc agcagagaca actccaagaa taccctgtat       240
ctgcagatga actctctgag ggccgaggac acagccgtgt actattgtgc ccgggataga       300
ggaatcgcag caggaggaaa ttactattac tatggcatgg acgtgtgggg ccagggcacc       360
acagtgaccg tgagctcc                                                    378

<210> SEQ ID NO 38
<211> LENGTH: 126
<212> TYPE: PRT
<213> ORGANISM: Artificial Sequence
<220> FEATURE:
<223> OTHER INFORMATION: mb-aTNFalpha Variable heavy chain amino acid
      sequence of anti TNFalpha

<400> SEQUENCE: 38

Gln Val Gln Leu Val Glu Ser Gly Gly Gly Val Val Gln Pro Gly Arg
1               5                   10                  15

Ser Leu Arg Leu Ser Cys Ala Ala Ser Gly Phe Ile Phe Ser Ser Tyr
            20                  25                  30

Ala Met His Trp Val Arg Gln Ala Pro Gly Asn Gly Leu Glu Trp Val
        35                  40                  45

Ala Phe Met Ser Tyr Asp Gly Ser Asn Lys Lys Tyr Ala Asp Ser Val
    50                  55                  60

Lys Gly Arg Phe Thr Ile Ser Arg Asp Asn Ser Lys Asn Thr Leu Tyr
65                  70                  75                  80

Leu Gln Met Asn Ser Leu Arg Ala Glu Asp Thr Ala Val Tyr Tyr Cys
                85                  90                  95

Ala Arg Asp Arg Gly Ile Ala Ala Gly Gly Asn Tyr Tyr Tyr Tyr Gly
            100                 105                 110

Met Asp Val Trp Gly Gln Gly Thr Thr Val Thr Val Ser Ser
```

<210> SEQ ID NO 39
<211> LENGTH: 216
<212> TYPE: DNA
<213> ORGANISM: Artificial Sequence
<220> FEATURE:
<223> OTHER INFORMATION: mb-aTNFalpha CD8alpha hinge and transmembrane
      domain nucleotide sequence

<400> SEQUENCE: 39
aagcctacca caaccctgc accacggcca ccaacaccag cacctaccat cgcctctcag      60
cctctgagcc tgaggccaga ggcatgcagg ccagcagcag gaggagcagt gcacaccaga     120
ggcctggact tgcctgtga tatctacatc tgggcccctc tggctgggac ttgcggggtg     180
ctgctgctgt cactggtcat cacactgtat tgttga                              216

<210> SEQ ID NO 40
<211> LENGTH: 71
<212> TYPE: PRT
<213> ORGANISM: Artificial Sequence
<220> FEATURE:
<223> OTHER INFORMATION: mb-aTNFalpha CD8alpha hinge and transmembrane
      domain amino acid sequence

<400> SEQUENCE: 40

Lys Pro Thr Thr Thr Pro Ala Pro Arg Pro Pro Thr Pro Ala Pro Thr
1               5                   10                  15

Ile Ala Ser Gln Pro Leu Ser Leu Arg Pro Glu Ala Cys Arg Pro Ala
            20                  25                  30

Ala Gly Gly Ala Val His Thr Arg Gly Leu Asp Phe Ala Cys Asp Ile
        35                  40                  45

Tyr Ile Trp Ala Pro Leu Ala Gly Thr Cys Gly Val Leu Leu Leu Ser
    50                  55                  60

Leu Val Ile Thr Leu Tyr Cys
65                  70